(12) United States Patent
Kato et al.

(10) Patent No.: US 9,373,481 B2
(45) Date of Patent: Jun. 21, 2016

(54) HIGH-ENERGY ION IMPLANTER, BEAM COLLIMATOR, AND BEAM COLLIMATION METHOD

(71) Applicant: Sumitomo Heavy Industries Ion Technology Co., Ltd., Tokyo (JP)

(72) Inventors: Kouji Kato, Ehime (JP); Yoshitaka Amamo, Ehime (JP)

(73) Assignee: Sumitomo Heavy Industries Ion Technology Co., Ltd., Tokyo (JP)

( * ) Notice: Subject to any disclaimer, the term of this patent is extended or adjusted under 35 U.S.C. 154(b) by 0 days.

(21) Appl. No.: 14/618,630

(22) Filed: Feb. 10, 2015

(65) Prior Publication Data

US 2015/0228454 A1 Aug. 13, 2015

(30) Foreign Application Priority Data

Feb. 10, 2014 (JP) ................................. 2014-023531

(51) Int. Cl.
*H01J 37/05* (2006.01)
*H01J 37/09* (2006.01)
*H01J 37/317* (2006.01)
*H01J 37/12* (2006.01)

(52) U.S. Cl.
CPC ............. *H01J 37/3171* (2013.01); *H01J 37/12* (2013.01); *H01J 2237/024* (2013.01); *H01J 2237/032* (2013.01); *H01J 2237/121* (2013.01); *H01J 2237/16* (2013.01)

(58) Field of Classification Search
CPC ....... H01J 37/3171; H01J 37/05; H01J 37/09; H01J 37/147

USPC ......... 250/492.21, 396 ML, 396 R, 290, 293, 250/295, 298, 492.1, 492.23, 492.3
See application file for complete search history.

(56) References Cited

U.S. PATENT DOCUMENTS

| | | | |
|---|---|---|---|
| 3,663,360 A * | 5/1972 | Post .................... | H02N 3/00 310/10 |
| 5,177,366 A | 1/1993 | King et al. | |
| 5,300,891 A | 4/1994 | Tokoro | |
| 6,242,747 B1 | 6/2001 | Sugitani et al. | |
| 6,774,377 B1 | 8/2004 | Rathmell et al. | |
| 7,019,314 B1 * | 3/2006 | Benveniste .......... | H01J 37/3171 250/290 |
| 8,035,080 B2 | 10/2011 | Satoh | |

(Continued)

FOREIGN PATENT DOCUMENTS

| | | |
|---|---|---|
| JP | 2000-011944 A | 1/2000 |
| JP | 3302436 B2 | 7/2002 |

(Continued)

*Primary Examiner* — David A Vanore
(74) *Attorney, Agent, or Firm* — Michael Best and Friedrich

(57) ABSTRACT

A beam collimator includes a plurality of lens units that are arranged along a reference trajectory so that a beam collimated to the reference trajectory comes out from an exit of the beam collimator. Each of the plurality of lens units forms a bow-shaped curved gap and is formed such that an angle of a beam traveling direction with respect to the reference trajectory is changed by an electric field generated in the bow-shaped curved gap. A vacant space is provided between one lens unit of the plurality of lens units and a lens unit that is adjacent to the lens unit. The vacant space is directed in a transverse direction of the collimated beam in a cross section that is perpendicular to the reference trajectory. An inner field containing the reference trajectory is connected to an outer field of the plurality of lens units through the vacant space.

25 Claims, 23 Drawing Sheets

(56) References Cited

U.S. PATENT DOCUMENTS

| | | | |
|---|---|---|---|
| 8,987,690 B2* | 3/2015 | Kabasawa | H01J 37/3007 250/396 ML |
| 2003/0183780 A1 | 10/2003 | Sano et al. | |
| 2004/0262542 A1 | 12/2004 | Rathmell et al. | |
| 2008/0121822 A1* | 5/2008 | Fujita | H01J 37/1475 250/492.21 |
| 2009/0256082 A1* | 10/2009 | Nakashima | H01J 37/3171 250/396 R |
| 2014/0150723 A1* | 6/2014 | Kabasawa | H01J 37/32412 118/723 R |
| 2014/0345522 A1* | 11/2014 | Kabasawa | H01L 21/26506 118/688 |
| 2014/0352615 A1* | 12/2014 | Kabasawa | H05H 7/04 118/712 |
| 2015/0136996 A1* | 5/2015 | Inada | H01J 37/3171 250/396 R |
| 2015/0228454 A1* | 8/2015 | Kato | H01J 37/3007 250/396 ML |

FOREIGN PATENT DOCUMENTS

| | | |
|---|---|---|
| JP | 3374335 B2 | 2/2003 |
| JP | 2003-288857 A | 10/2003 |
| JP | 2008-507112 A | 3/2008 |
| JP | 4747876 B2 | 8/2011 |

* cited by examiner

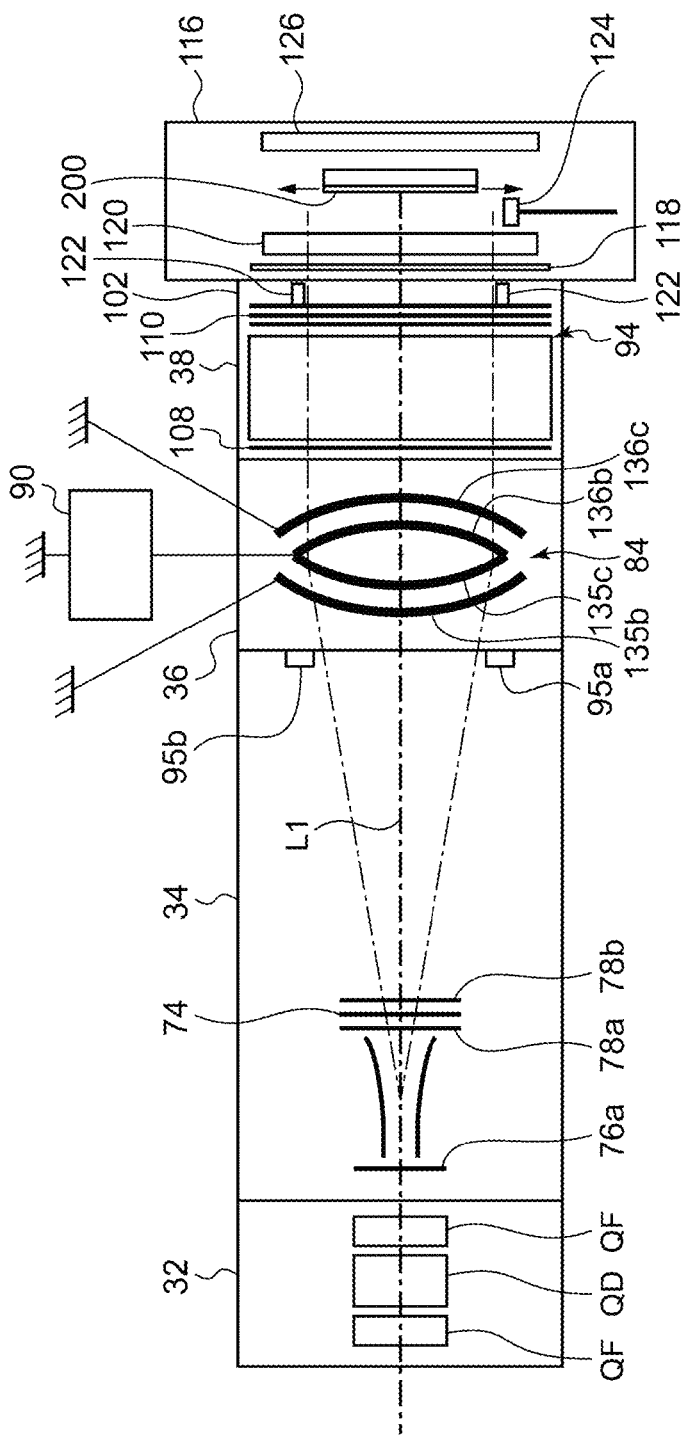
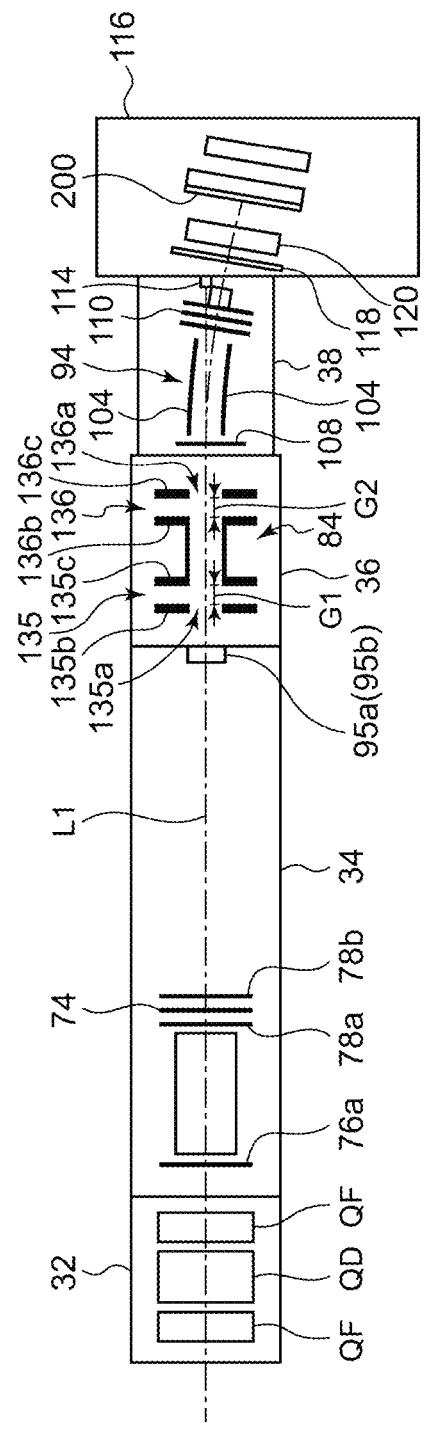
FIG.6A
FIG.6B 24,30

24,30

24,30

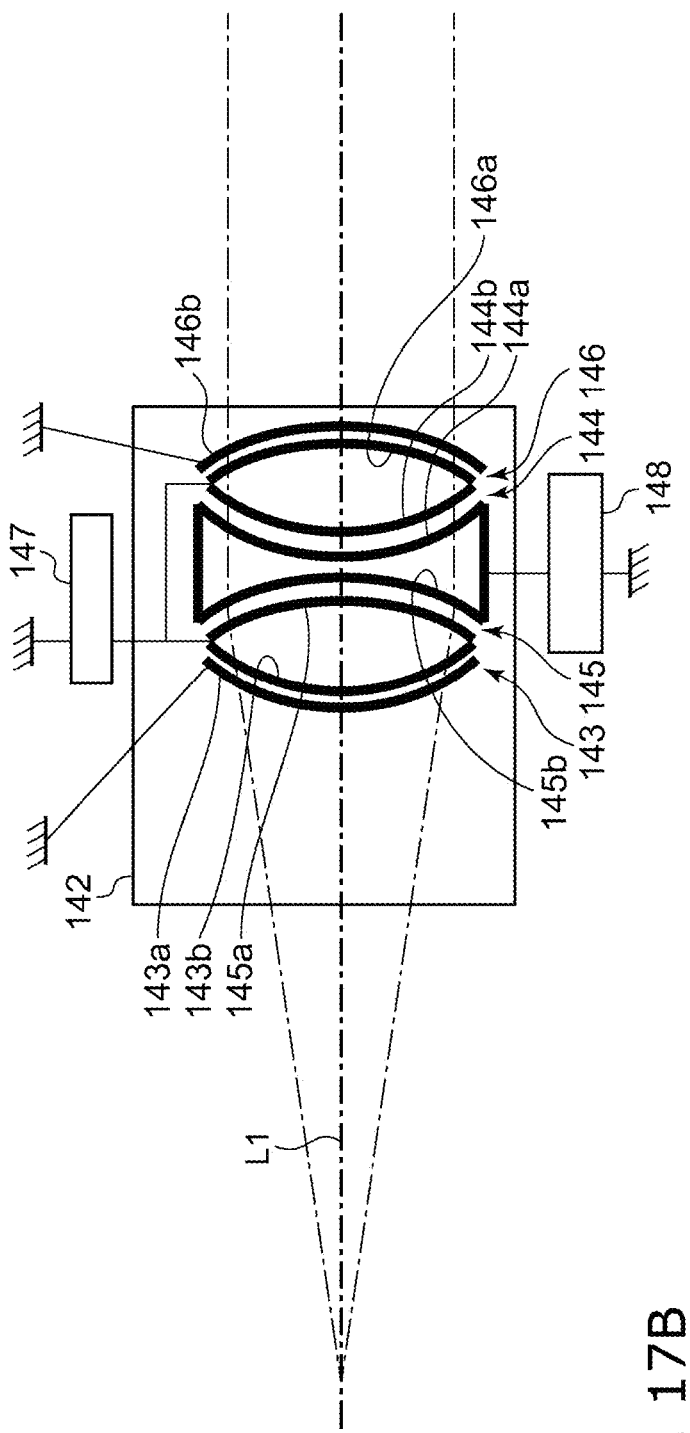
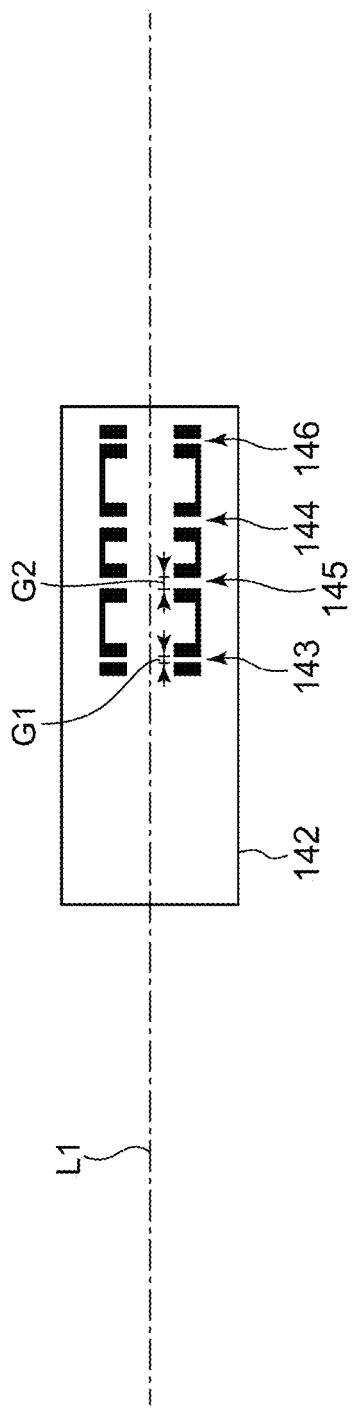
FIG. 17A (a)
FIG. 17B (b)

HIGH-ENERGY ION IMPLANTER, BEAM COLLIMATOR, AND BEAM COLLIMATION METHOD

RELATED APPLICATION

Priority is claimed to Japanese Patent Application No. 2014-23531, filed on Feb. 10, 2014, the entire content of which is incorporated herein by reference.

BACKGROUND OF THE INVENTION

1. Field of the Invention

The present invention relates to a high-energy ion implanter.

2. Description of the Related Art

In a semiconductor device production process, an important process is generally performed in which ions are implanted into a semiconductor wafer in a vacuum state so as to add impurities to crystals of the semiconductor wafer. Accordingly, a conductive property is changed so that the semiconductor wafer becomes a semiconductor device. An apparatus used in this process is generally called an ion implanter that accelerates impurity atoms as ions for the semiconductor device and implants impurity atoms into the semiconductor wafer.

Hitherto, an apparatus for performing a high-energy ion implantation by further deeply implanting an ion beam into the semiconductor wafer has been used with the high integration and the high performance of the semiconductor device. Such an apparatus is particularly called a high-energy ion implanter. As an example, there is known a method of configuring an ion beam acceleration system by a tandem type electrostatic accelerator.

(Batch Type)

Further, a batch treatment type high-energy ion implanter with a radio frequency linear accelerator for performing a radio frequency acceleration has been used for many years.

The batch treatment type ion implantation is a method of uniformly implanting ions into wafers while several tens of silicon wafers are loaded on the outer periphery of an aluminum disk having a diameter of about 1 m and the disk is rapidly rotated by 1000 revolutions per minute. In order to prevent the pop-out state of the wafer by a centrifugal force, the wafer loading portion of the disk has an angle of about 5° with respect to a rotation surface (a surface perpendicular to a rotation shaft). The batch treatment type ion implantation method has a problem in which an implantation angle (an angle at which the ions are incident to the wafer) is different by about 1° between the center and the end of the wafer (the implantation angle deviation) due to the above-described angle and the rotation of the wafer.

In general, a die on the wafer has an ion implantation performing region and a non-ion implantation performing region, and the non-ion implantation performing region is covered by an organic substance called a photoresist. Since the ions do not need to penetrate the photoresist during the implantation, the photoresist to be coated during the high-energy ion implantation is much thickened. In the ion implantation performing region, the photoresist is excluded by lithography. However, when the integration degree is high and the implantation region is minute, the ions are perpendicularly implanted to a bottom of a deep hole surrounded by an upright photoresist wall. In the ion implantation in the structure having a high aspect ratio, the high precision of implantation angle is demanded.

In particular, in a case where a high-quality imaging device such as a CCD is produced, the resolution increases with the deep ion implantation, and hence the sensitivity is improved. For this reason, a super-high-energy ion implantation (3 to 8 MeV) is also performed. In this case, the allowed implantation angle error is about 0.1°, and a batch type apparatus with a large implantation angle deviation may not be used.

(Single Wafer Type High-Energy Ion Implanter)

Therefore, a single wafer type high-energy ion implanter has been practically realized in recent years. In the batch type, the ion beam is uniformly implanted in the horizontal direction in a manner such that the beam is fixed and the wafer moves (the rotation on the disk). On the contrary, in the single wafer type, the beam moves (so that the beam scans in the horizontal direction) and the wafer is fixed. In this type, when the scan beam is collimated, the implantation dose may be uniform within the wafer surface, and the implantation angle may be also uniform. Accordingly, the problem of the implantation angle deviation may be solved. Furthermore, the dose uniformity in the vertical direction is realized by moving the wafer at a constant velocity in both types, but the angle error does not occur in accordance with the movement.

In addition, since the single wafer type ion implanter does not uselessly consume the silicon wafer when a small number of wafers are treated, the single wafer type ion implanter is suitable for a small lot multi-product production, and hence a demand therefor has been increased in recent years.

Here, in the production of the high-quality imaging device, there is a need to meet various difficult demands in which the angle precision is needed, the metal contamination needs to be removed, the implantation damage (the residual crystal defect after the annealing) needs to be small, and the implantation depth precision (the energy precision) needs to be good. Accordingly, even the single wafer type ion implanter has many points to be improved.

In the single wafer type high-energy ion implanter of the related art, the tandem type electrostatic accelerator or the radio frequency acceleration type heavy ion linac (the linear accelerator) has been used as the high energy acceleration type.

The downstream side of the acceleration system (the downstream side of the beamline) is provided with an energy filtering magnet, a beam scanner, and a parallel (parallelization) magnet that collimates a scan orbit by a magnetic field. Then, the beam has the same incident angle (implantation angle) with respect to the wafer at any scan position due to the parallel magnet. The ion energy is up to about 3 to 4 MeV.

Further, in a part of the (single wafer type) medium current ion implanter used in the energy region (10 to 600 keV) lower than that of the high-energy ion implanter, an electric field parallel lens is used which collimates the scan orbit by the electric field (the electrode). Since the electric field parallel lens may collimate the scan orbit while keeping the symmetry of the orbit, the angle precision is more critically treated compared to the parallel magnet. Further, in this apparatus, an electric field type deflection electrode called an AEF (Angular Energy Filter) is attached to the vicinity of the wafer. Since the ions subjected to a change in charge state during the transportation of the beam or the particles generated in the beamline are removed by the AEF, a highly pure beam may be supplied.

SUMMARY OF THE INVENTION

An exemplary purpose of an embodiment of the present invention is to provide a beam collimator suitable for a high-energy ion implanter.

According to one embodiment of the present invention, a beam collimator of an ion implanter is provided that includes: a plurality of acceleration and/or deceleration lens units that are arranged along a reference trajectory so that a beam collimated to the reference trajectory comes out from an exit of the beam collimator; and a vacuum container that surrounds the plurality of lens units. Each of the plurality of lens units forms a bow-shaped curved gap defined by at least two electrode sections and is formed such that an angle of a beam traveling direction with respect to the reference trajectory is changed by an electric field generated in the bow-shaped curved gap. An electrode section on one side of one lens unit of the plurality of lens units and an electrode section on the other side of a lens unit adjacent to the lens unit are formed to have the same potential, and a vacant space is provided between one lens unit of the plurality of lens units and a lens unit adjacent to the lens unit. The vacant space being directed in a direction that perpendicularly intersects a beam collimation plane on the reference trajectory. An inner field containing the reference trajectory communicates, through the vacant space, with an outer field formed between the vacuum container and the plurality of lens units.

According to one embodiment of the present invention, a beam collimator of an ion implanter is provided that includes: at least one lens unit that generates a beam collimated to a reference trajectory at an exit of the beam collimator. Each of the at least one lens unit includes a pair of electrode sections that define a bow-shaped curved gap and is formed such that an angle of a beam traveling direction with respect to the reference trajectory is changed by an electric field generated in the bow-shaped curved gap. Each of the pair of electrode sections has a plurality of electrodes that are curved in a bow shape.

According to one embodiment of the present invention, a beam collimator of an ion implanter is provided that includes: at least one lens unit that generates a beam collimated to a reference trajectory at an exit of the beam collimator; and a vacuum container that surrounds the at least one lens unit and includes container inner walls on one side and the other side of the reference trajectory, respectively. Each of the at least one lens unit includes a pair of electrode sections that define a bow-shaped curved gap and is formed such that an angle of a beam traveling direction with respect to the reference trajectory is changed by an electric field generated in the bow-shaped curved gap. Each of the pair of the electrode sections includes a set of electrodes arranged being spaced apart across the reference trajectory. Apart of the set of the electrodes is supported by the container inner wall on one side of the reference trajectory. Another part of the set of the electrodes is supported by the container inner wall on the other side of the reference trajectory.

According to one embodiment of the present invention, a high-energy ion implanter is provided that includes: a beam transportation line unit that includes any one of the above-stated beam collimators; an ion beam generation unit that generates an ion beam; a high-energy multi-stage linear acceleration unit that accelerates the ion beam; and a deflection unit that changes the direction of the ion beam accelerated to have high energy toward the beam transportation line unit.

According to one embodiment of the present invention, a beam collimation method is provided that includes: generating an electric field in each of a plurality of bow-shaped curved gaps so as to form a beam collimated to a reference trajectory; and performing vacuum evacuation of an inner field containing the reference trajectory through a space zone formed between one bow-shaped curved gap of the plurality of bow-shaped curved gaps and a bow-shaped curved gap that is adjacent to the bow-shaped curved gap. The space zone is directed in a transverse direction of the collimated beam in a cross section that is perpendicular to the reference trajectory.

Optional combinations of the aforementioned constituting elements, and implementations of the invention in the form of methods, apparatuses, and systems, may also be practiced as additional modes of the present invention.

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which:

FIG. 6A is a top view illustrating a schematic configuration from a beam scanner to a substrate processing/supplying unit along a beamline after a beam collimator, and FIG. 6B is a side view illustrating a schematic configuration from a beam scanner to a substrate processing/supplying unit along a beamline after a beam collimator;

FIG. 17A is a top view illustrating a schematic configuration of a beam collimator as an aspect of the embodiment, and FIG. 17B is a side view illustrating a schematic configuration of the beam collimator as the aspect of the embodiment;

FIG. 20-1 is a schematic view illustrating a configuration of a beam collimator according to an embodiment of the present invention;

FIG. 20-2 is a schematic view illustrating a configuration of a beam collimator according to an embodiment of the present invention;

FIG. 20-3 is a schematic view illustrating a configuration of a beam collimator according to an embodiment of the present invention;

DETAILED DESCRIPTION OF THE INVENTION

Figure 1:
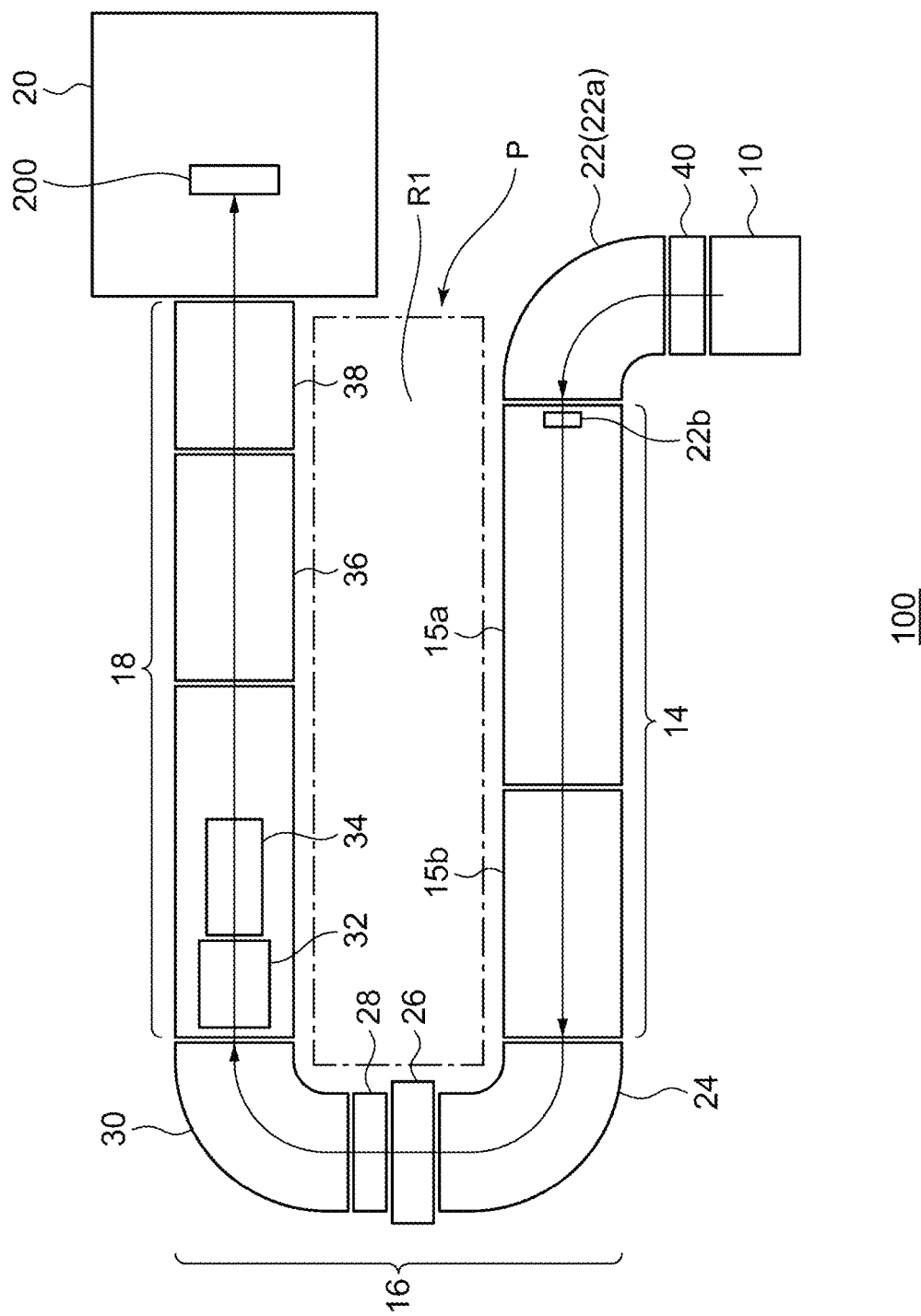
FIG. 1 is a schematic view illustrating a schematic layout and a beamline of a high-energy ion implanter according to an embodiment.

The invention will now be described by reference to the preferred embodiments. This does not intend to limit the scope of the present invention, but to exemplify the invention.

Hereinafter, an example of a high-energy ion implanter according to the embodiment will be described in detail. First, the reason why the invention is contrived by the present inventor and the like will be described.

(Parallel Magnet)

The following problems arise in a high-energy ion implanter of the related art that employs a parallel (collimate) magnet which parallelizes (collimates) an orbit by a deflection magnetic field.

When a high-energy ion is implanted into a photoresist-coated wafer, a large amount of an outgas is generated. Then, an interaction occurs between molecules of the outgas and beam ions, and hence the charge state of some ions change. When a change in valance occurs while the beam passes through the parallel magnet, a deflection angle changes and the parallelism of the beam is collapsed. Accordingly, an implantation angle with respect to the wafer is not uniform.

Further, the amount (the number or the dose) of the implanted ions may be obtained by measuring a beam current in a faraday cup disposed near the wafer. However, the measurement value is influenced due to a change in charge state, and hence the measurement value is deviated from a predetermined implantation dose. As a result, the expected characteristics of a semiconductor device may not be obtained according to the design.

Further, in the parallelism of one parallel magnet, the inner and outer orbits have different deflection angles and different orbit lengths. For this reason, the ratio of the ions subjected to a change in charge state increases as it goes toward the outer orbit, and hence the dose uniformity inside the wafer surface is also degraded.

Thus, a recent demand for highly precise implantation may not be sufficiently handled by the beam transportation type of the high-energy ion implanter of the related art.

Further, the parallel magnet needs a wide magnetic pole in the scan direction and a parallelizing section having a certain length. Since the length and the size of the magnetic pole increase when the energy increases, the weight of the parallel magnet considerably increases. In order to stably fix and hold the apparatus, the design for the strength of the semiconductor factory needs to be reinforced, and the power consumption considerably increases.

These problems may be solved when the electric field collimating lens and the electric field (the electrode type) energy filter (AEF: Angular Energy Filter) used in the above-described medium current ion implanter may be used in the high-energy region. The electric field collimating lens aligns and collimates the scan orbit to the center orbit while keeping the symmetry of the orbit, and the AEF removes the ions subjected to a change in charge state directly before the wafer. Accordingly, even when a large amount of the outgas exists, a beam without an energy contamination may be obtained, and hence the implantation angle in the scan direction does not become non-uniform as in the case of the parallel magnet. As a result, the ions may be implanted with an accurate implantation distribution in the depth direction and a uniform implantation dose, and the implantation angle also becomes uniform, thereby realizing a highly precise ion implantation. Further, since the light-weight electrode member is used, the power consumption may be decreased compared to the electromagnet.

The point of the invention is to obtain an apparatus capable of performing the same highly precise implantation as that of the medium current apparatus in the high-energy apparatus by introducing an excellent system of the medium current ion implanter into the high-energy ion implanter. The problems to be solved in this trial will be described below. The first problem is the length of the apparatus.

In a case where the ion beams are deflected at the same trajectory, the necessary magnetic field is proportional to the square root of the energy, and the necessary electric field is proportional to the energy. Thus, the length of the deflection magnetic pole is proportional to the square root of the energy, and the length of the deflection electrode is proportional to the energy. When the highly precise angle implantation is tried by mounting the electric field collimating lens and the electric field AEF onto the high-energy ion implanter, the beam transportation system (the distance from the scanner to the wafer) largely increases in length compared to the apparatus of the related art that uses the parallel magnet.

For example, as the high-energy ion implanter that includes a parallelization mechanism using such an electric field, a structure is considered which is obtained by substantially linearly fixing constituents such as an ion source, a mass analysis magnet, a tandem type electrostatic accelerator or a radio frequency linear accelerator, a beam scanner, a scan orbit parallelization device, an energy filter, an implantation process chamber, and a substrate transportation unit (an end station) as in the case of the high-energy ion implanter of the related art. In this case, the entire length of the apparatus increase by about 20 m compared to the apparatus of the related art having a length of about 8 m. Accordingly, it takes large effort when the installation place is set and prepared and the installation operation is performed, and then the installation area also increases. Further, a work space is also needed for the alignment adjustment of the devices and the maintenance, the repair, or the adjustment thereof after the operation of the apparatus. Such a large ion implanter may not satisfy a demand for adjusting the size of the apparatus in the semiconductor production line to the actual size of the apparatus arranged in the factory production line.

In view of such circumstances, an object of the beamline structure in the aspect of the invention is to provide a highly precise high-energy ion implanter with an electric field collimating lens and an electric field energy filter by simplifying and efficiently adjusting an installation place setting and preparing work, an installation work, or a maintenance work while ensuring a sufficient work area and realizing a technique of suppressing an increase in installation area.

(U-Shaped Folded Beam Line)

The object may be attained by a configuration in which the beamline of the high-energy ion implanter includes a long line portion that is formed by a plurality of units for accelerating an ion beam generated by an ion source and a long line portion that is formed by a plurality of units for adjusting and implanting a scan beam into a wafer and a horizontal U-shaped folded beamline having the long line portions facing each other is formed. Such a layout is realized by substantially matching the length of the beam transportation unit including a beam scanner, a beam collimator, an energy filter, and the like to the length of the unit accelerating the ions from the ion source. Then, a sufficiently wide space is provided between two long line portions for the maintenance work.

An aspect of the invention is obtained on the basis of the layout of the beamline, and an object of the invention is to provide a high-energy ion implanter which collimates a scanned high-energy ion beam in a bilaterally symmetric state by an electric field and performs a highly precise ion implantation in an environment with a large amount of an outgas.

A high-energy ion implanter according to an aspect of the invention is a high-energy ion implanter that accelerates ions generated from an ion source so as to generate an ion beam, transports the ion beam to a wafer along a beamline, and implants the ion beam into the wafer, and includes: a beam generation unit that includes the ion source and a mass analyzer; a high-energy multi-stage linear acceleration unit that accelerates an ion beam so as to generate a high-energy ion beam; a high-energy beam deflection unit that changes the direction of the high-energy ion beam toward the wafer; a high-energy beam transportation unit that transports the deflected high-energy ion beam to the wafer; and a substrate processing/supplying unit that uniformly implants the transported high-energy ion beam into the semiconductor wafer. The beam transportation unit includes a beam shaper, a high-energy beam scanner, a high-energy beam collimator, and a high-energy final energy filter. Then, the high-energy ion beam emitted from the deflection unit is scanned at both sides of the reference trajectory of the beamline by the beam scanner, and is collimated to the reference trajectory of the orbits of the scan beams while the bilateral symmetric is maintained by the beam collimator, mixed ions which are different in the mass, the ion charge state, the energy, and the like are removed by the final energy filter, and the resultant ions are implanted into the wafer. The high-energy beam collimator includes a pair of acceleration electrodes that accelerates the ion beam and deflects the ion beam toward the reference trajectory and a pair of deceleration electrodes that decelerates the ion beam and deflects the ion beam toward the reference trajectory. Here, the high-energy beam collimator is configured as an acceleration-deceleration electrode lens group that includes at least two sets or more of the pair of acceleration electrodes and the pair of deceleration electrodes.

According to the aspect of the invention, the scanned high-energy ion beam may be collimated in a bilaterally symmetric state. Accordingly, even in a state where a large amount of the outgas exists, the ion beam may be implanted with a uniform implantation dose and a uniform implantation angle, and hence the highly precise ion implantation is realized. Further, a light-weight electrode member is used. The power consumption may be decreased compared to the electromagnet.

Therefore, the high-energy ion implanter according to the aspect of the embodiment is an ion implanter that accelerates the ions generated by the ion source, transports the ions as the ion beam along the beamline to the wafer, and implants the ions into the wafer. This apparatus includes the high-energy multi-stage linear acceleration unit that accelerates the ion beam so as to generate the high-energy ion beam, the deflection unit that changes the direction of the orbit of the high-energy ion beam toward the wafer, and the beam transportation line unit that transports the deflected high-energy ion beam to the wafer, and the collimated ion beam is highly precisely irradiated to the wafer moving in a mechanical scan state so as to be implanted into the wafer.

The high-energy ion beam that is emitted from the radio frequency (AC-type) high-energy multi-stage linear acceleration unit for highly accelerating the ion beam includes a certain range of energy distribution. For this reason, in order to scan and collimate the high-energy ion beam of the rear stage and irradiate the high-energy ion beam to the wafer moving in a mechanical scan state, there is a need to perform the highly precise energy analysis, the center orbit correction, and the beam convergence and divergence adjustment in advance.

The beam deflection unit includes at least two highly precise deflection electromagnets, at least one energy width confining slit, an energy analysis slit, and at least one lateral convergence unit. The plurality of deflection electromagnets are formed so as to perform the energy analysis of the high-energy ion beam, the precise correction of the ion implantation angle, and the suppression of the energy dispersion. In the highly precise deflection electromagnets, a nuclear magnetic resonance probe and a hall probe are attached to the electromagnet for the energy analysis, and only the hall probe is attached to the other electromagnet. The nuclear magnetic resonance probe is used to calibrate the hall probe, and the hall probe is used for the uniform magnetic field feedback control.

The beam transportation line unit may implant ions by scanning and parallelizing the high-energy ion beam and highly precisely irradiating the high-energy ion beam to the wafer moving in a mechanical scan state.

Hereinafter, an example of the high-energy ion implanter according to the embodiment will be described in more detail with reference to the drawings. Furthermore, the same reference numerals will be given to the same components in the description of the drawings, and the repetitive description of the same components will be appropriately omitted. Further, the configuration mentioned below is merely an example, and does not limit the scope of the invention.

(High-Energy Ion Implanter)

First, a configuration of the high-energy ion implanter according to the embodiment will be simply described. Furthermore, the content of the specification may be applied to not only the ion beam as one of kinds of charged particles, but also the apparatus involved with the charged particle beam.

FIG. 1 is a schematic view illustrating a schematic layout and a beamline of a high-energy ion implanter 100 according to the embodiment.

The high-energy ion implanter 100 according to the embodiment is an ion implanter that includes a radio frequency linear acceleration type ion accelerator and a high-energy ion transportation beamline, and is configured to accelerate ions generated by an ion source 10, transports the ions along the beamline to a wafer (a substrate) 200 as an ion beam, and implants the ions into a wafer 200.

As illustrated in FIG. 1, the high-energy ion implanter 100 includes an ion beam generation unit 12 that generates ions and separates the ions by mass, a high-energy multi-stage linear acceleration unit 14 that accelerates an ion beam so as to become a high-energy ion beam, a beam deflection unit 16 that performs an energy analysis, a center orbit correction, and an energy dispersion control on the high-energy ion beam, a beam transportation line unit 18 that transports the analyzed high-energy ion beam to a wafer, and a substrate processing/supplying unit 20 that uniformly implant the transported high-energy ion beam into the semiconductor wafer.

The ion beam generation unit 12 includes the ion source 10, an extraction electrode 40, and a mass spectrometer 22. In the ion beam generation unit 12, a beam is extracted from the ion source 10 through the extraction electrode and is accelerated, and the extracted and accelerated beam is subjected to a mass analysis by the mass spectrometer 22. The mass spectrometer 22 includes a mass analysis magnet 22a and a mass analysis slit 22b. There is a case in which the mass analysis slit 22b is disposed directly behind the mass analysis magnet 22a. However, in the embodiment, the mass analysis slit is disposed inside the entrance of the high-energy multi-stage linear acceleration unit 14 as the next configuration.

Only the ions necessary for the implantation are selected as a result of the mass analysis using the mass spectrometer 22, and the ion beam of the selected ions is led to the next high-energy multi-stage linear acceleration unit 14. The direction of the ion beam that is further accelerated by the high-energy multi-stage linear acceleration unit 14 is changed by the beam deflection unit 16.

The beam deflection unit 16 includes an energy analysis electromagnet 24, a lateral convergence quadrupole lens 26 that suppresses an energy dispersion, an energy width confining slit 27 (see FIGS. 5A and 5B below), an energy analysis slit 28, and a deflection electromagnet 30 having a steering function. Furthermore, the energy analysis electromagnet 24 may be called an energy filter electromagnet (EFM). The direction of the high-energy ion beam is changed by the deflection unit so as to be directed toward the substrate wafer.

The beam transportation line unit 18 is used to transport the ion beam emitted from the beam deflection unit 16, and includes a beam shaper 32 formed by a convergence/divergence lens group, a beam scanner 34, a beam collimator 36, and a final energy filter 38 (with a final energy separation slit). The length of the beam transportation line unit 18 is designed so as to match the lengths of the ion beam generation unit 12 and the high-energy multi-stage linear acceleration unit 14, and the beam transportation line unit 18 is connected to the beam deflection unit 16 so as to form a U-shaped layout as a whole.

The substrate processing/supplying unit 20 is provided at the termination end of the downstream side of the beam transportation line unit 18, and the implantation process chamber accommodates a beam monitor that measures the beam current, the position, the implantation angle, the convergence and divergence angle, the vertical and horizontal ion distribution, and the like of the ion beam, a charge prevention device that prevents the charge of the substrate by the ion beam, a wafer transportation mechanism that carries the wafer (the substrate) 200 and installs the wafer at an appropriate position and an appropriate angle, an ESC (Electro Static Chuck) that holds the wafer during the ion implantation, and a wafer scan mechanism that operates the wafer in a direction perpendicular to the beam scan direction at the velocity in response to a change in the implantation beam current.

In this way, the high-energy ion implanter 100 that is formed by arranging the units in a U-shape ensures satisfactory workability while suppressing an increase in footprint. Further, in the high-energy ion implanter 100, the units or the devices are formed as a module, and hence may be attached, detached, and assembled in accordance with the beamline reference position.

Next, the units and the devices constituting the high-energy ion implanter 100 will be described further in detail.

(Ion Beam Generation Unit)

Figure 2A:
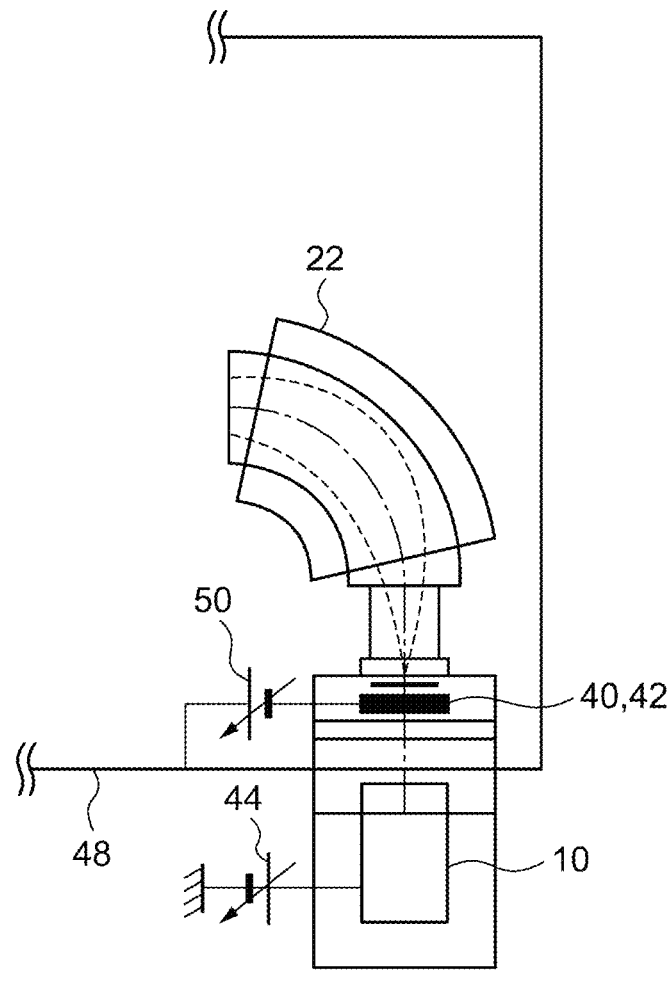
FIG. 2A is a top view illustrating a schematic configuration of an ion beam generation unit.
Figure 2B:
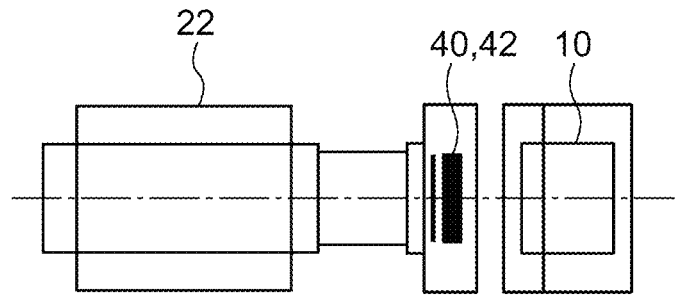
FIG. 2B is a side view illustrating the schematic configuration of the ion beam generation unit.

FIG. 2A is a top view illustrating a schematic configuration of the ion beam generation unit, and FIG. 2B is a side view illustrating a schematic configuration of the ion beam generation unit.

As illustrated in FIGS. 2A and 2B, the extraction electrode 40 that extracts an ion beam from plasma generated inside an ion chamber (an arc chamber) is provided at the exit of the ion source 10 disposed at the most upstream side of the beamline. An extraction suppression electrode 42 that suppresses electrons included in the ion beam extracted from the extraction electrode 40 from reversely flowing toward the extraction electrode 40 is provided near the downstream side of the extraction electrode 40.

The ion source 10 is connected to an ion source high-voltage power supply 44. An extraction power supply 50 is connected between the extraction electrode 40 and a terminal 48. The downstream side of the extraction electrode 40 is provided with the mass spectrometer 22 that separates predetermined ions from the incident ion beam and extracts the separated ion beam.

Figure 5A:
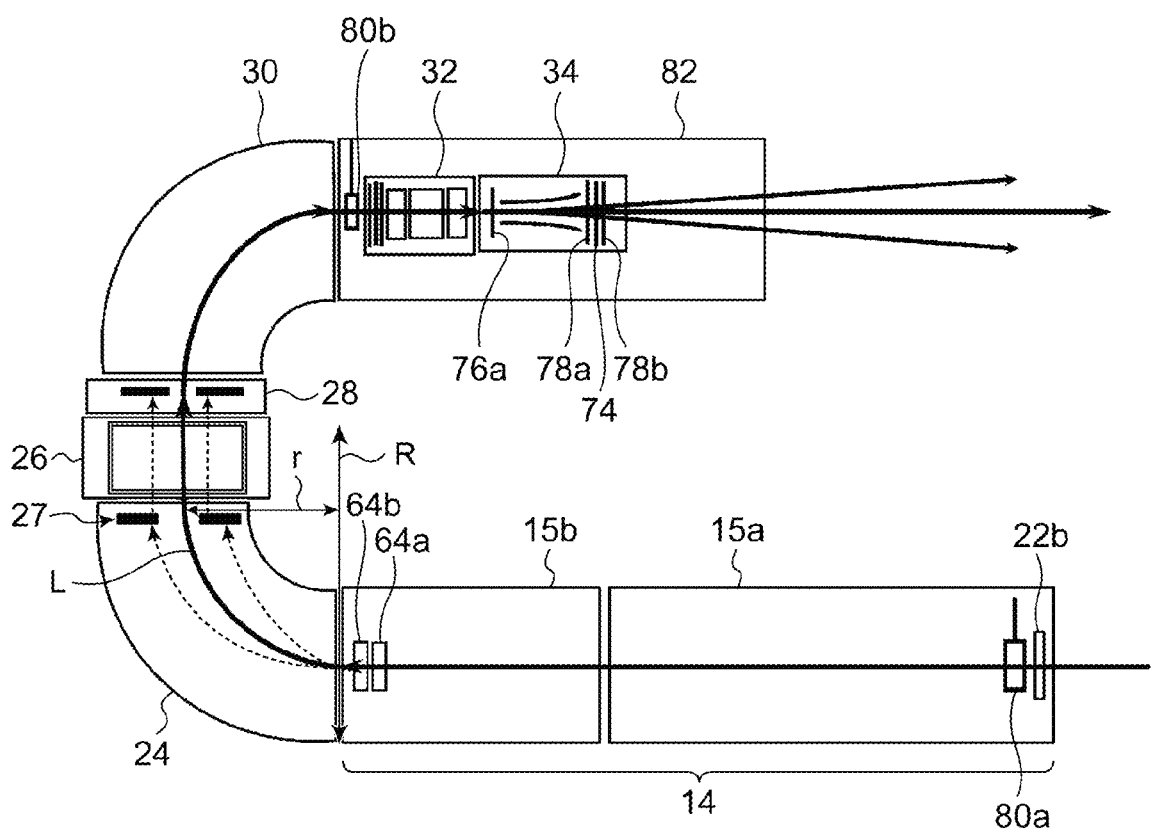
FIGS. 5A and 5B are top views illustrating a schematic configuration of an EFM (an energy analyzing deflection electromagnet), an energy width confining slit, an energy analysis slit, a BM (a lateral center orbit correcting deflection electromagnet), a beam shaper, and a beam scanner (a scanner)
Figure 5B:
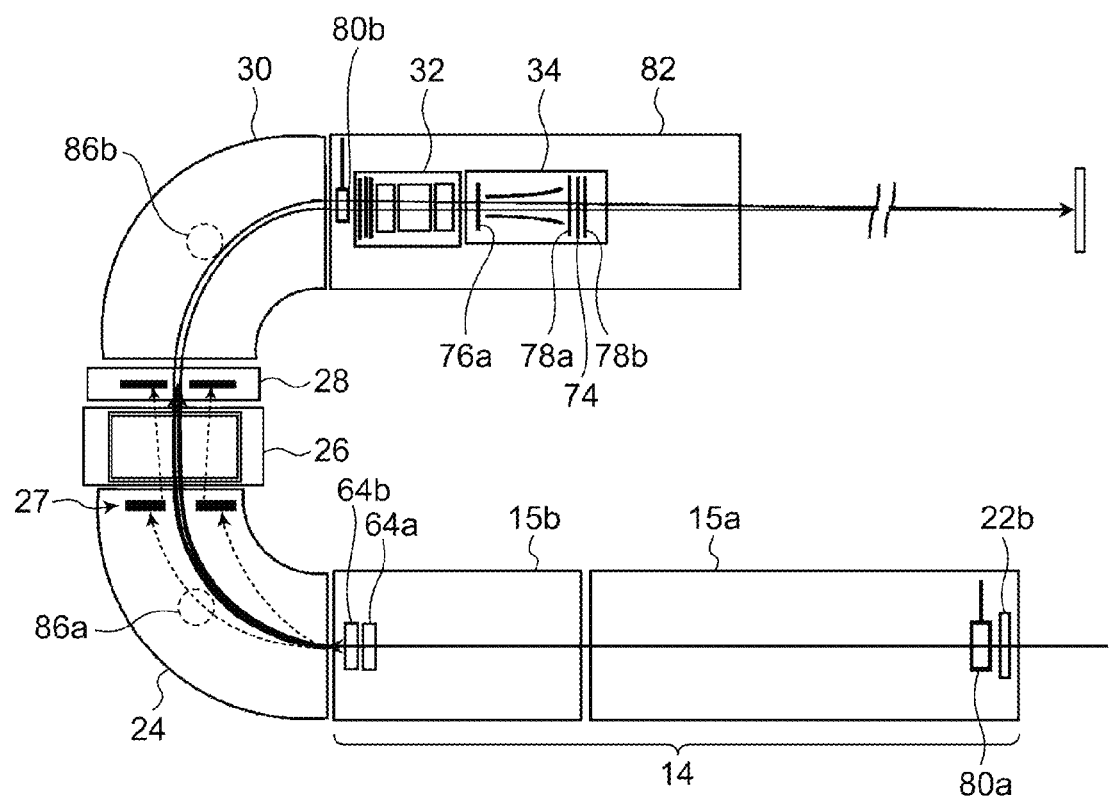

As illustrated in FIGS. 5A and 5B to be described below, a faraday cup (for an injector) 80a that measures the total beam current of the ion beam is disposed at the foremost portion inside the linear acceleration portion housing of the high-energy multi-stage linear acceleration unit 14.

Figure 14A:
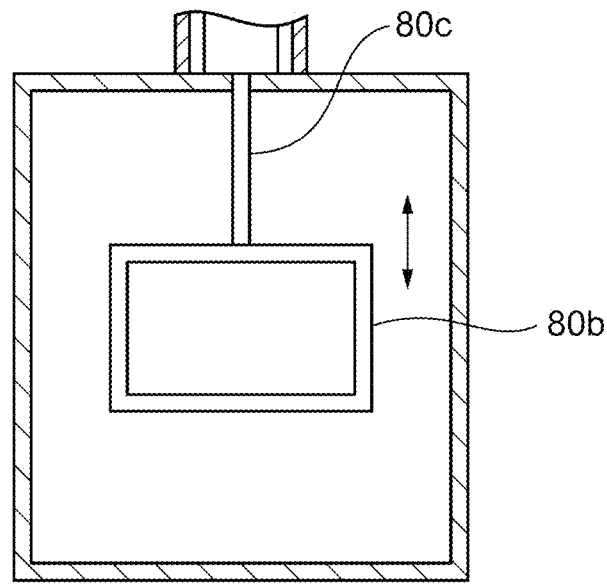
FIG. 14A is a schematic front view illustrating a resolver-faraday cup having substantially the same configuration as that of an injector faraday cup.
Figure 14B:
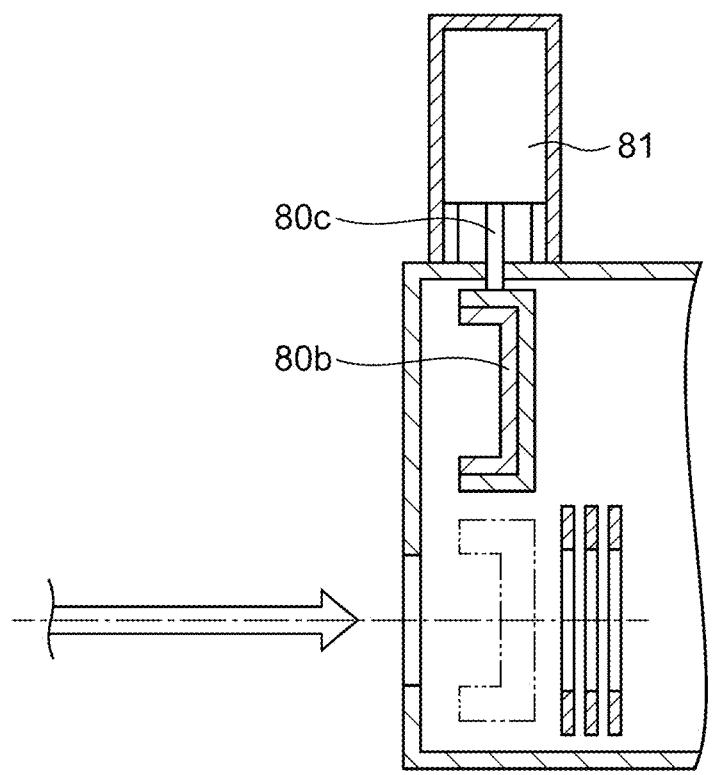
FIG. 14B is a schematic view illustrating an operation of the resolver-faraday cup.

FIG. 14A is a schematic front view illustrating a resolver-faraday cup 80b having substantially the same configuration as that of the injector faraday cup 80a, and FIG. 14B is a schematic view illustrating an operation of the resolver-faraday cup 80b.

The injector faraday cup 80a may be extracted from the vertical direction on the beamline by a driving mechanism, and is formed so that an opening portion faces the upstream side of the beamline while having a rectangular square shape in the horizontal direction. Accordingly, the injector faraday cup is used to completely interrupt the ion beam reaching the downstream side of the beamline on the beamline if necessary other than the function of measuring the total beam current of the ion beam during the adjustment of the ion source or the mass analysis electromagnet. Further, as described above, the mass analysis slit 22b is disposed inside the entrance of the high-energy multi-stage linear acceleration unit 14 directly before the injector faraday cup 80a. Further, in accordance with the single mass analysis slit or the degree of the mass, a plurality of slits having different widths may be selected or the mass slit width may be changed continuously or stepwisely.

(High-Energy Multi-Stage Linear Acceleration Unit)

Figure 3:
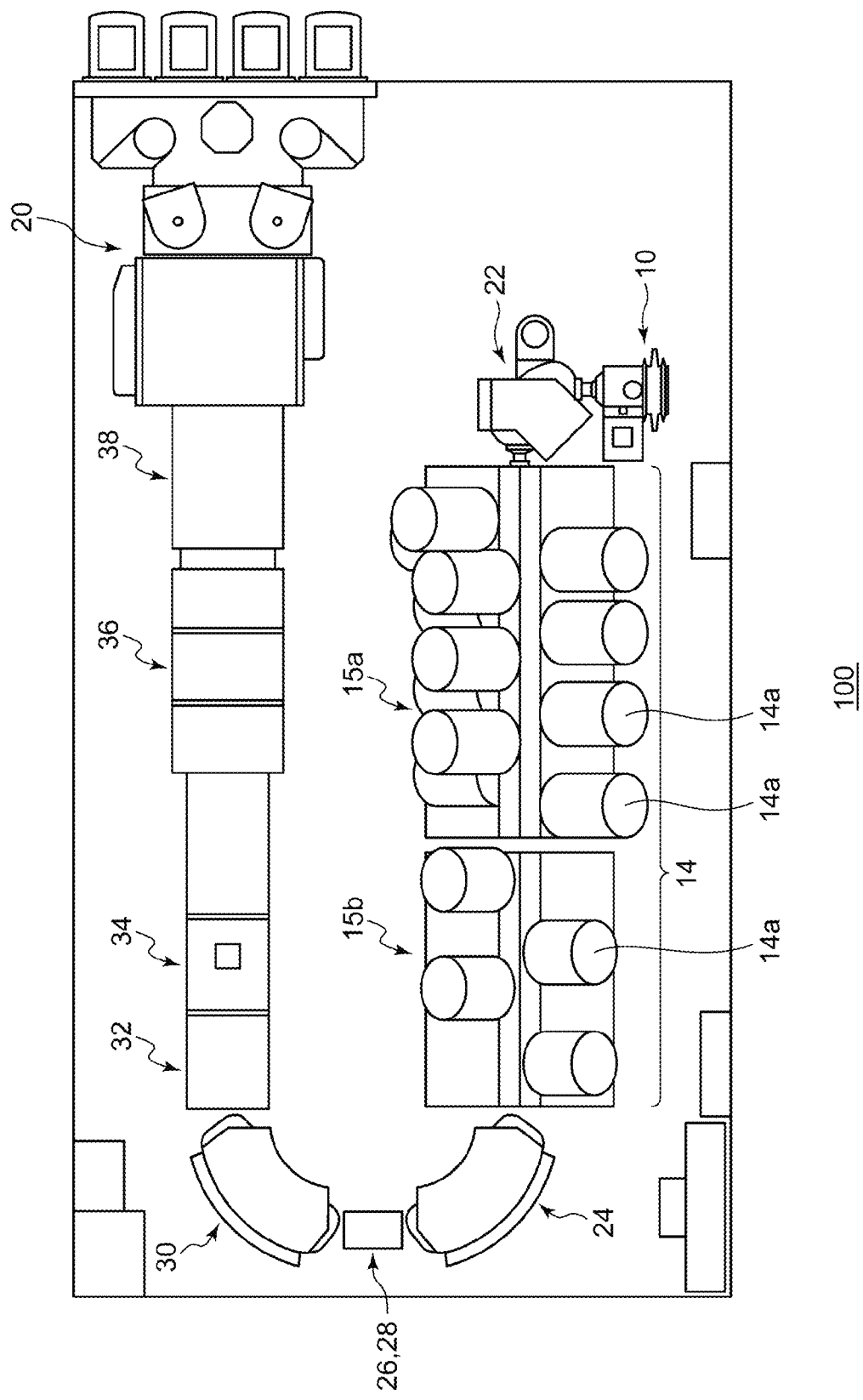
FIG. 3 is a top view illustrating an entire layout including a schematic configuration of a high-energy multi-stage linear acceleration unit.

FIG. 3 is a top view illustrating the entire layout including the schematic configuration of the high-energy multi-stage linear acceleration unit 14. The high-energy multi-stage linear acceleration unit 14 includes a plurality of linear accelerators for accelerating the ion beam, that is, an acceleration gap that interposes one or more radio frequency resonators 14a. The high-energy multi-stage linear acceleration unit 14 may accelerate the ions by the action of the radio frequency (RF) electric field. In FIG. 3, the high-energy multi-stage linear acceleration unit 14 includes a first linear accelerator 15a that includes a basic multi-stage radio frequency resonator 14a for a high-energy ion implantation and a second linear accelerator 15b that includes an additional multi-stage radio frequency resonator 14a for a super-high-energy ion implantation.

Meanwhile, in the ion implanter that uses the acceleration of the radio frequency (RF), the amplitude V [kV] and the frequency f [Hz] of the voltage need to be considered as the parameter of the radio frequency. Further, in a case where a multi-stage radio frequency acceleration is performed, the phase φ [deg] of the radio frequency is added as the parameter. In addition, a magnetic field lens (for example, a quadrupole electromagnet) or an electric field lens (for example, an electric field quadrupole electrode) is needed so as to control the expansion of the ion beam in the vertical and horizontal directions during or after the acceleration by the convergence and divergence effect. Then, the optimal values of these operation parameters are changed by the ion energy passing therethrough, and the strength of the acceleration electric field influences the convergence and divergence action. For this reason, these values are determined after the parameter of the radio frequency is determined.

Figure 4:
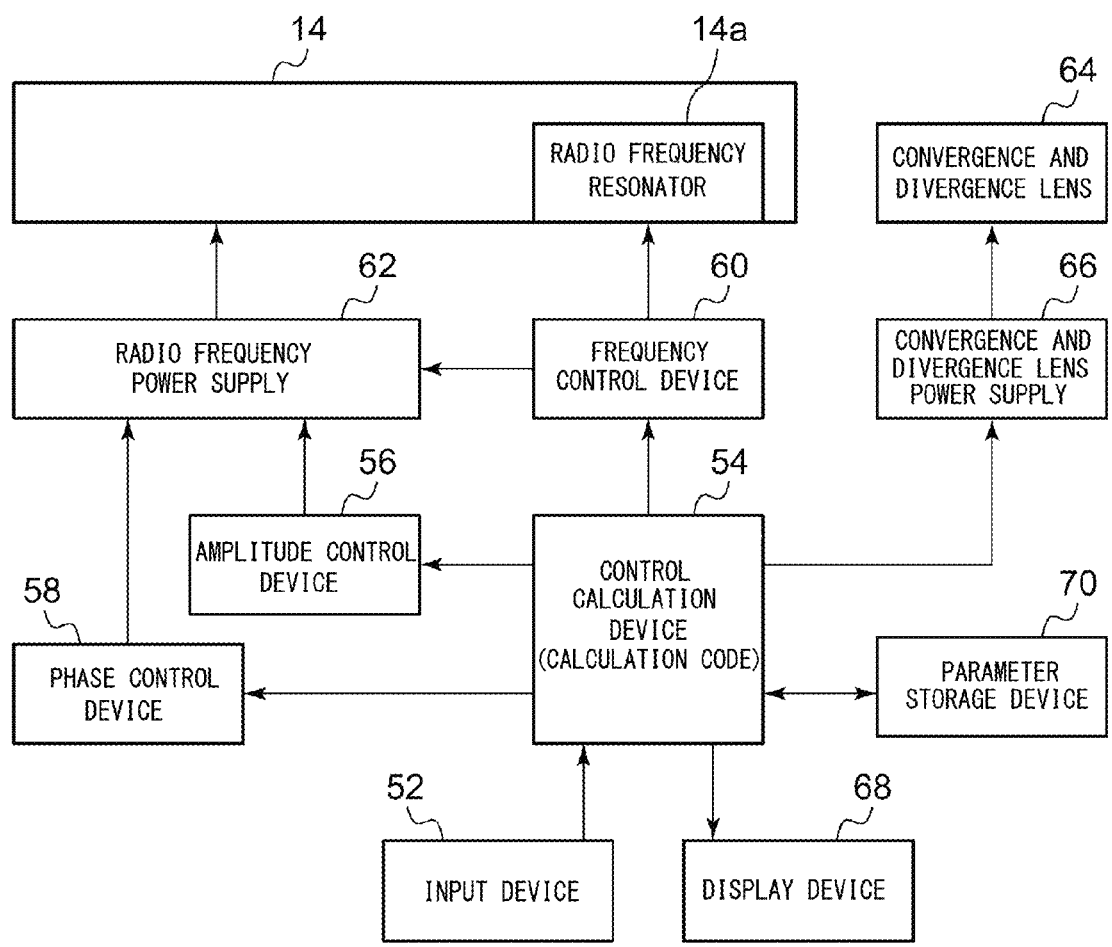
FIG. 4 is a block diagram illustrating a configuration of a control system of a convergence and divergence lens and the high-energy multi-stage linear acceleration unit obtained by linearly arranging acceleration electric fields (gaps) of front ends of a plurality of radio frequency resonators.

FIG. 4 is a block diagram illustrating a configuration of a control system of the convergence and divergence lens and the high-energy multi-stage linear acceleration unit obtained by linearly arranging the acceleration electric fields (the gaps) at the front ends of the plurality of radio frequency resonators.

The high-energy multi-stage linear acceleration unit 14 includes one or more radio frequency resonators 14a. As the components necessary for the control of the high-energy multi-stage linear acceleration unit 14, an input device 52 for allowing an operator to input a necessary condition, a control calculation device 54 that numerically calculates various parameters from the input condition and controls the components, an amplitude control device 56 that adjusts the voltage amplitude of the radio frequency, a phase control device 58 that adjusts the phase of the radio frequency, a frequency control device 60 that controls the frequency of the radio frequency, a radio frequency power supply 62, a convergence and divergence lens power supply 66 for a convergence and divergence lens 64, a display device 68 that displays an operation parameter thereon, and a storage device 70 that stores the determined parameter are needed. Further, the control calculation device 54 stores therein a numerical calculation code (a program) for numerically calculating various parameter in advance.

In the control calculation device 54 of the radio frequency linear accelerator, radio frequency parameters (an amplitude, a frequency, and a phase of a voltage) are calculated so as to obtain the optimal transportation efficiency by simulating the acceleration, the convergence, and the divergence of the ion beam based on the input condition and the numerical calculation code stored therein. Also, the parameter (a Q coil current or a Q electrode voltage) of the convergence and divergence lens 64 that is used to efficiently transport the ion beam is also calculated. The calculated various parameters are displayed on the display device 68. The display device 68 displays a non-answerable mark for the acceleration condition that exceeds the ability of the high-energy multi-stage linear acceleration unit 14.

The voltage amplitude parameter is transmitted from the control calculation device 54 to the amplitude control device 56, and the amplitude control device 56 adjusts the amplitude of the radio frequency power supply 62. The phase parameter is transmitted to the phase control device 58, and the phase control device 58 adjusts the phase of the radio frequency power supply 62. The frequency parameter is transmitted to the frequency control device 60. The frequency control device 60 controls the output frequency of the radio frequency power supply 62, and controls the resonance frequency of the radio frequency resonator 14a of the high-energy multi-stage linear acceleration unit 14. Further, the control calculation device 54 controls the convergence and divergence lens power supply 66 by the calculated convergence and divergence lens parameter.

The convergence and divergence lens 64 that is used to efficiently transport the ion beam is disposed as many as needed at a position inside the radio frequency linear accelerator or a position before and behind the radio frequency linear accelerator. That is, the divergence lens and the convergence lens are alternately provided at the position before and behind the acceleration gap of the front end of the multi-stage radio frequency resonator 14a. At one side thereof, an additional longitudinal convergence lens 64b (see FIGS. 5A and 5B) is disposed behind the lateral convergence lens 64a (see FIGS. 5A and 5B) at the termination end of the second linear accelerator 15b, adjusts the convergence and the divergence of the high-energy acceleration ion beam passing through the high-energy multi-stage linear acceleration unit 14, and causes the ion beam having an optimal two-dimensional beam profile to be incident to the beam deflection unit 16 of the rear stage.

In the direction of the electric field generated in the acceleration gap of the radio frequency linear accelerator, the ion acceleration direction and the ion deceleration direction change at every several tens of nano seconds. In order to accelerate the ion beam to the high energy, the electric field needs to be directed in the acceleration direction when the ions enter all acceleration gaps which exist at several tens of places. The ions that are accelerated by a certain acceleration gap need to pass through a space (a drift space) in which the electric field between two acceleration gaps is shielded until the electric field of the next acceleration gap is directed in the acceleration direction. Since the ions are decelerated even at the early timing or the late timing, the ions may not reach the high energy. Further, since it is a very strict condition that the ions are carried along the acceleration phase in all acceleration gaps, the ion beam that reaches the predetermined energy is a resultant obtained from a difficult selection for the mass, the energy, and the charge (factors for determining the velocity) by the radio frequency linear accelerator. In this meaning, the radio frequency linear accelerator is also a good velocity filter.

(Beam Deflection Unit)

As illustrated in FIG. 1, the beam deflection unit 16 includes the energy analysis electromagnet 24 as the energy filter deflection electromagnet (EFM), the energy width confining slit 27 (see FIGS. 5A and 5B), the energy analysis slit 28, the lateral convergence quadrupole lens 26 that controls the deflected energy dispersion, and the deflection electromagnet 30 that has an implantation angle correction function.

FIGS. 5A and 5B are top views illustrating a schematic configuration of the EFM (the energy analyzing deflection electromagnet), the energy width confining slit, the energy analysis slit, the BM (the lateral center orbit correcting deflection electromagnet), the beam shaper, and the beam scanner (the scanner). Furthermore, the sign L illustrated in FIG. 5A indicates the center orbit of the ion beam.

The ion beam that passes through the high-energy multi-stage linear acceleration unit 14 enables the energy distribution by a synchrotron vibration. Further, there is a case in which the beam having a center value slightly deviated from the predetermined energy may be emitted from the high-energy multi-stage linear acceleration unit 14 when the acceleration phase adjustment amount is large. Therefore, the magnetic field of the energy filter deflection magnet (EFM) is set so that only the ions having desired energy may pass by the beam deflection unit 16 to be described later, and a part of the beam selectively passes by the energy width confining slit 27 and the energy analysis slit 28, so that the ion energy is adjusted to the setting value. The energy width of the passing ion beam may be set in advance by the horizontal opening widths of the energy width confining slit and the analysis slit. Only the ions passing through the energy analysis slit are led to the beamline of the rear stage, and are implanted into the wafer.

When the ion beam having the energy distribution is incident to the energy filter electromagnet (EFM) of which the magnetic field is controlled to a uniform value by the above-described feedback loop control system, the entire incident ion beam causes the energy dispersion while being deflected along the designed orbit, and the ions within a desired energy width range pass through the energy width confining slit 27 provided near the exit of the EFM. At the position, the energy dispersion increases to the maximum value, and the beam size $\sigma_1$ (the beam size in a case where the energy width does not exist) due to the emittance decreases to the minimum value. However, the beam width caused by the energy dispersion becomes larger than the beam width caused by the emittance. In a case where the ion beam in such a state is cut by the slit, the spatial distribution is cut sharply, but the energy distribution has a cut shape rounded by the energy width corresponding to $2\sigma_1$. In other words, for example, even when the slit width is set to the dimension corresponding to 3% of the energy width, a part of the ions having an energy difference with respect to the predetermined implantation energy smaller than 3% collide with the wall of the slit so as to disappear, but a part of the ions having an energy difference larger than 3% pass through the slit.

The energy analysis slit is installed at a position where the value of $\sigma_1$ becomes minimal. Since the value of $\sigma_1$ decreases to an ignorable value by the slit width at the position, the energy distribution is also cut sharply like the space distribution. For example, even in a case where the opening width of the energy analysis slit is also set to the dimension (0.03 η) corresponding to 3% of the energy width, all ions having an energy difference exceeding 3% and passing through the energy width confining slit are interrupted at the position. As a result, when the beam having a rectangular energy distribution at first passes through two slits, a dome-shaped distribution is formed in which the energy becomes a peak value at 0%, the height decreases by a half at ±3%, and the energy abruptly decreases to zero. Since the number of the ions having a small energy difference relatively increases, the energy width substantially decreases compared to the case where only one energy analysis slit is provided and the ion beam passes through the slit while having a substantially rectangular energy distribution.

In the double slit system, when the energy of the beam accelerated by the linac is slightly deviated from the predetermined implantation energy by the effect of cutting the end of the energy distribution, there is an effect that the energy deviation of the passed beam decrease. For example, in a case where the energy deviation is 3% when the energy width is ±3%, the plus side of the energy having the dome-shaped distribution in the energy distribution of the ion beam passing through the double slit becomes a half, and hence the energy center as the center of the distribution substantially becomes $\Delta E/E=1\%$. Meanwhile, when the ion beam is cut by the single energy analysis slit, the gravity center becomes $\Delta E/E=1.5\%$. The effect of rounding the distribution is essentially exhibited in a direction in which the deviation of the energy center is suppressed.

In this way, in order to improve the energy precision by decreasing both the energy width and the deviation of the energy center using the acceleration system having both the energy width and the energy deviation, the limitation of the energy using the double slit is effective.

Since the energy analysis electromagnet needs high magnetic field precision, highly precise measurement devices 86a and 86b for precisely measuring the magnetic field are provided (see FIG. 5B). The measurement devices 86a and 86b use the MRP to calibrate the hall probe and uses the hall probe to control the uniform magnetic field feedback control by the appropriate combination of the NMR (nuclear magnetic resonance) probe called the MRP (magnetic resonance probe) and the hall probe. Further, the energy analysis electromagnet is produced by strict precision so that the non-uniformity of the magnetic field becomes smaller than 0.01%. Further, each electromagnet is connected with a power supply having current setting precision and current stability of $1\times10^{-4}$ or more and a control device thereof.

Further, the quadrupole lens 26 as the lateral convergence lens is disposed between the energy analysis slit 28 and the energy analysis electromagnet 24 at the upstream side of the energy analysis slit 28 (the upstream side of the ion beamline). The quadrupole lens 26 may be formed in an electric field type or a magnetic field type. Accordingly, since the energy dispersion is suppressed after the ion beam is deflected in a U-shape and the beam size decreases, the beam may be transported with high efficiency. Further, since the conductance decreases at the magnetic pole portion of the deflection electromagnet, it is effective to dispose an outgas discharging vacuum pump in the vicinity of, for example, the energy analysis slit 28. In a case where a magnetically-elevated turbo molecular pump is used, the pump needs to be provided at a position where the pump is not influenced by the leakage magnetic field of the electromagnet of the energy analysis electromagnet 24 or the deflection electromagnet 30. By the vacuum pump, the beam current degradation due to the scattering of the remaining gas at the deflection unit is prevented.

When there is a large installation error in the quadrupole lens, the dispersion adjusting quadrupole lens 26, or the beam shaper 32 in the high-energy multi-stage linear acceleration unit 14, the center orbit of the beam illustrated in FIG. 5B is distorted, and the beam may easily disappear while contacting the slit. As a result, the final implantation angle and the final implantation position are also wrong. Here, the center orbit of the beam essentially passes through the center of the beam scanner 34 on the horizontal plane due to the magnetic field correction value of the deflection electromagnet 30 having an implantation angle correction function. Accordingly, the deviation of the implantation angle is corrected. Further, when an appropriate offset voltage is applied to the beam scanner 34, the distortion of the center orbit from the scanner to the wafer disappears, and hence the horizontal deviation of the implantation position is solved.

The ions that pass through the deflection electromagnets of the beam deflection unit 16 are subjected to a centrifugal force and a Lorentz force, and hence draws a circular-arc orbit by balance of these forces. When this balance is represented by a relation, a relation of mv=qBr is established. Here, m indicates the mass of the ion, v indicates the velocity of the ion, q indicates the charge state of the ion, B indicates the magnetic flux density of the deflection electromagnet, and r indicates the curvature radius of the orbit. Only the ions in which the curvature radius r of the orbit matches the curvature radius of the magnetic center of the deflection electromagnet may pass through the deflection electromagnet. In other words, in a case where the ions have the same charge state, the ions that may pass through the deflection electromagnet applied with the uniform magnetic field B are only the ions having the specific momentum my. The EFM is called the energy analysis electromagnet, but is actually a device that is used to analyze the momentum of the ion. The BM or the mass analysis electromagnet of the ion generation unit is the momentum filter.

Further, the beam deflection unit 16 may deflect the ion beam by 180° just by using a plurality of magnets. Accordingly, the high-energy ion implanter 100 in which the beamline has a U-shape may be realized by a simple configuration.

As illustrated in FIG. 5A, the beam deflection unit 16 deflects the ion beam emitted from the high-energy multi-stage linear acceleration unit 14 by 90° using the energy analysis electromagnet 24. Then, the beam path is further deflected by 90° using the deflection electromagnet 30 that is also used to correct the orbit, and is incident to the beam shaper 32 of the beam transportation line unit 18 to be described later. The beam shaper 32 shapes the incident beam and supplies the beam to the beam scanner 34. Further, the divergence of the beam due to the energy dispersion is prevented by the lens effect of the quadrupole lens 26 illustrated in FIG. 5B or an extreme decrease in the size of the beam is prevented by using the beam expansion effect based on the energy dispersion.

Figure 11A:
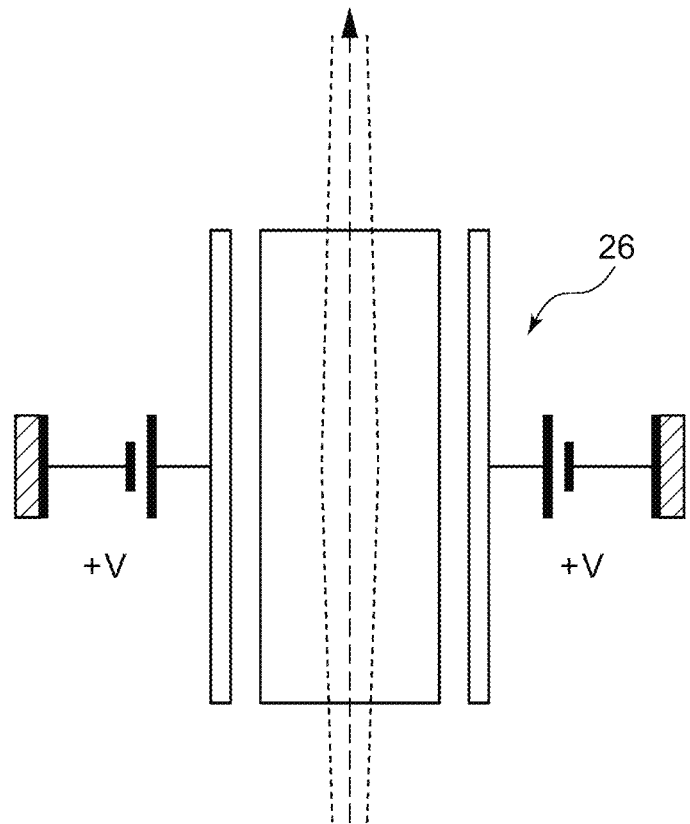
FIG. 11A is a schematic top view illustrating a quadrupole lens as a lateral convergence lens.
Figure 11B:
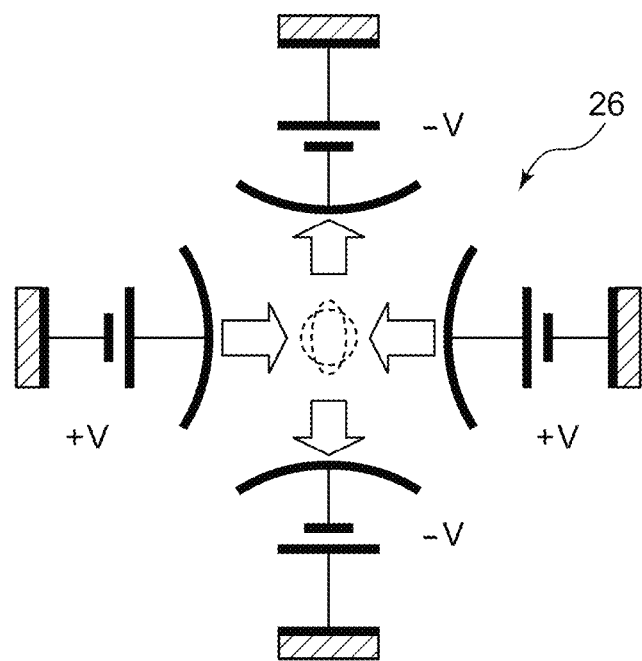
FIG. 11B is a schematic front view illustrating the quadrupole lens.

FIG. 11A is a schematic top view illustrating a quadrupole lens as a lateral convergence lens, and FIG. 11B is a schematic front view illustrating the quadrupole lens. The top view of FIG. 11A illustrates the electrode length in the beamline traveling direction of the quadrupole lens 26 and the effect in which the beam that diverges laterally with respect to the beam of the energy selected by the energy analysis electromagnet (the EFM deflection magnet) 24 converges laterally by the quadrupole lens 26. The front view of FIG. 11B illustrates the lateral convergence effect of the beam based on the convergence and divergence action of the electrode of the quadrupole lens 26.

As described above, the beam deflection unit 16 performs the deflection of the ion beam by 180° by a plurality of electromagnets between the high-energy multi-stage linear acceleration unit 14 and the beam transportation line unit 18 in the ion implanter that accelerates the ions generated from the ion source and transports the ions to the wafer so as to implant the ions thereto. That is, the energy analysis electromagnet 24 and the orbit correction deflection electromagnet 30 are respectively formed so as to have deflection angles of 90°. As a result, the total deflection angle becomes 180°. Furthermore, the amount of the deflection performed by one magnet is not limited to 90°, and may be the following combination.

(1) One magnet having deflection amount of 90°+two magnets having deflection amounts of 45°
(2) Three magnets having deflection amounts of 60°
(3) Four magnets having deflection amounts of 45°
(4) Six magnets having deflection amounts of 30°
(5) One magnet having deflection amount of 60°+one magnet having deflection amount of 120°
(6) One magnet having deflection amount of 30°+one magnet having deflection amount of 150°

The beam deflection unit 16 as the energy analysis unit is a folding path in the U-shaped beamline, and the curvature radius r of the deflection electromagnet forming the unit is an important parameter that limits the maximum energy of the beam to be transported and determines the entire width of the apparatus or the width of the center maintenance area (see FIGS. 5A and 5B). When the value is optimized, an increase in the entire width of the apparatus is suppressed without decreasing the maximum energy. Then, the gap between the high-energy multi-stage linear acceleration unit 14 and the beam transportation line unit 18 is widened, so that a sufficient work space R1 is ensured (see FIG. 1).

Figure 12A:
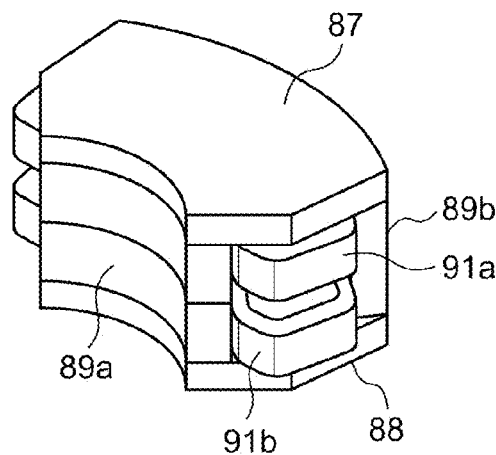
FIGS. 12A and 12B are perspective views illustrating an example of a configuration of an electromagnet.
Figure 12B:
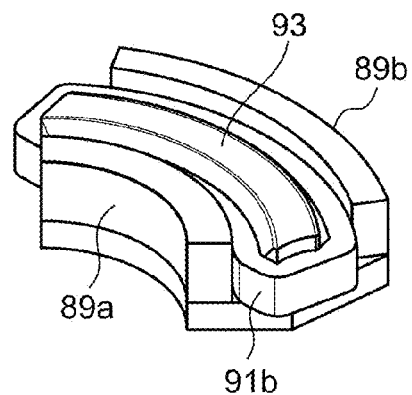
Figure 13:
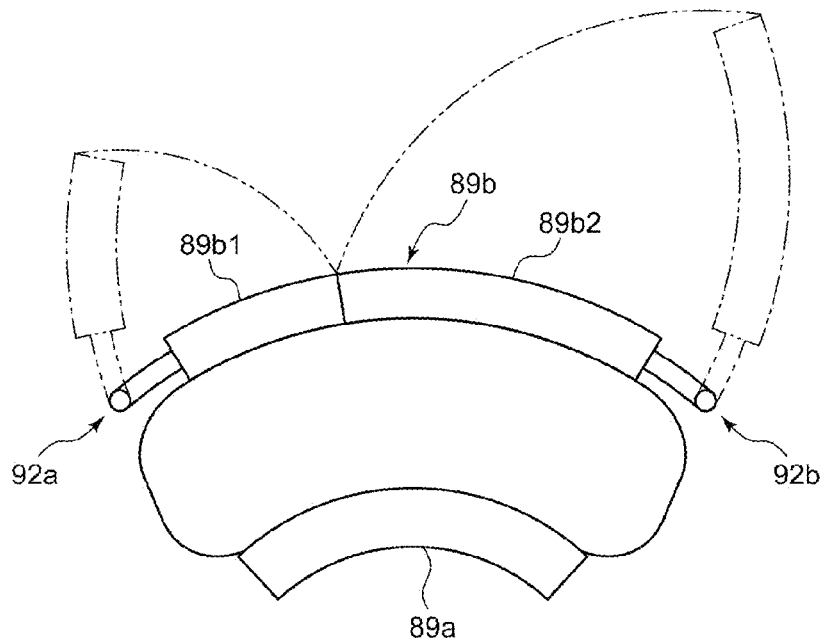
FIG. 13 is a schematic view illustrating an opening and closing portion included in the electromagnet.

FIGS. 12A and 12B are perspective views illustrating an example of a configuration of the electromagnet. FIG. 13 is a schematic view illustrating an opening and closing portion provided in the electromagnet. For example, as illustrated in FIGS. 12A and 12B, the electromagnet forming the energy analysis electromagnet 24 or the deflection electromagnet 30 includes an upper yoke 87, a lower yoke 88, inner and outer yokes 89a and 89b, an upper pole (not illustrated), a lower pole 93, an upper coil 91a, and a lower coil 91b. Further, as illustrated in FIG. 13, the outer yoke 89b is divided into two members 89b1 and 89b2, and the two members may be opened outward as folding double doors by opening and closing portions 92a and 92b. Then, a beam guide container (not illustrated) forming the beamline may be removably attached thereto.

Further, the vacuum container of the center portion of the beam deflection unit 16, for example, the container accommodating the energy width confining slit 27, the quadrupole lens 26, the energy analysis slit 28, and the like may be easily attached to and detached from the beamline. Accordingly, it is possible to simply enter and exit the work area of the center of the U-shaped beamline during the maintenance work.

The high-energy multi-stage linear acceleration unit 14 includes a plurality of linear accelerators that accelerate the ions. Each of the plurality of linear accelerators includes a common connection portion, and the connection portion may be removably attached to the energy analysis electromagnet 24 located at the upstream side in relation to the energy analysis slit 28 in the plurality of electromagnets. Similarly, the beam transportation line unit 18 may be removably attached to the deflection electromagnet 30.

Further, the energy analysis electromagnet 24 that is installed at the upstream side of the energy analysis slit 28 and includes the electromagnet may be formed so as to attached and detached or connected to the upstream high-energy multi-stage linear acceleration unit 14. Further, in a case where the beam transportation line unit 18 to be described later is configured as a module type beamline unit, the deflection electromagnet 30 that is installed at the downstream side of the energy analysis slit 28 may be attached and detached or connected to the downstream beam transportation line unit 18.

The linac and the beam deflection unit are respectively disposed on plane trestles, and are formed so that the ion beam orbit passing through the units are substantially included in one horizontal plane (the orbit after the deflection of the final energy filter is excluded).

(Beam Transportation Line Unit)
FIG. 6A is a top view illustrating a schematic configuration from the beam scanner to the substrate processing/supplying unit along the beamline after the beam collimator, and FIG. 6B is a side view illustrating a schematic configuration from the beam scanner to the substrate processing/supplying unit along the beamline after the beam collimator.

Only the necessary ion species are separated by the beam deflection unit 16, and the beam that is formed only by the ions having a necessary energy value is shaped in a desired cross-sectional shape by the beam shaper 32. As illustrated in FIGS. 5A to 6B, the beam shaper 32 is configured as (an electric field type or a magnetic field type) convergence/divergence lens group such as a Q (quadrupole) lens. The beam having a shaped cross-sectional shape is scanned in a direction parallel to the surface of FIG. 1A by the beam scanner 34. For example, the beam shaper is configured as a triplet Q lens group including a lateral convergence (longitudinal divergence) lens QF/a lateral divergence (a longitudinal convergence) lens QD/a lateral convergence (a longitudinal divergence) lens QF. If necessary, the beam shaper 32 may be configured by each of the lateral convergence lens QF and the lateral divergence lens QD or the combination thereof.

As illustrated in FIGS. 5A and 5B, the faraday cup 80*b* (called a resolver-faraday cup) for measuring the total beam current of the ion beam is disposed at a position directly before the beam shaper 32 of the foremost portion inside the scanner housing.

FIG. 14A is a schematic front view illustrating the resolver-faraday cup 80*b*, and FIG. 14B is a schematic view illustrating an operation of the resolver-faraday cup 80*b*.

The resolver-faraday cup 80*b* is formed so as to be extracted in the vertical direction on the beamline by a driving mechanism, and is formed so that the opening portion faces the upstream side of the beamline while having a rectangular square shape in the horizontal direction. The resolver-faraday cup is used to completely interrupt the ion beam that reaches the downstream side of the beamline if necessary other than the purpose of measuring the total beam current of the ion beam during the adjustment of the linac and the beam deflection portion. Further, the resolver-faraday cup 80*b*, the beam scanner 34, a suppression electrode 74, and ground electrodes 76*a*, 78*a*, and 78*b* are accommodated in a scanner housing 82.

The beam scanner 34 is a deflection scan device (called a beam scanner) that causes the ion beam to periodically scan the horizontal direction perpendicular to the ion beam traveling direction in a reciprocating manner by the periodically changing electric field.

The beam scanner 34 includes a pair of (two) counter scan electrodes (bipolar deflection scan electrodes) that are disposed so as to face each other with the ion beam passage region interposed therebetween in the beam traveling direction. Then, a scan voltage that changes to positive and negative values at a predetermined frequency in the range of 0.5 Hz to 4000 Hz and is approximated to the triangular wave is applied to two counter electrodes in the form of plus and minus values. The scan voltage generates a changing electric field that deflects the beam passing through the gap between two counter electrodes positive and negative inversely. Then, the beam that passes through the gap is scanned in the horizontal direction by the periodic change of the scan voltage.

The amount of the crystal damage generated inside the silicon wafer during the high-energy ion implantation is inverse proportional to the scan frequency. Then, there is a case in which the amount of the crystal damage influences the quality of the produced semiconductor device. In such a case, the quality of the produced semiconductor device may be improved by freely setting the scan frequency.

Further, an offset voltage (a fixed voltage) is superimposed on the scan voltage in order to correct the amount of the beam positional deviation measured directly near the wafer in a state where the scan voltage is not applied thereto. Accordingly, the scan range is not deviated in the horizontal direction due to the offset voltage, and hence the bilaterally symmetrical ion implantation may be performed.

The suppression electrode 74 that includes an opening in the ion beam passage region is disposed between two ground electrodes 78*a* and 78*b* at the downstream side of the beam scanner 34. The ground electrode 76*a* is disposed before the scan electrode at the upstream side thereof, but if necessary, the suppression electrode having the same configuration as that of the downstream side may be disposed. The suppression electrode suppresses the intrusion of electrons to the positive electrode.

Further, a ground shielding plate 89 is disposed at each of the upper and lower sides of deflection electrodes 87*a* and 87*b*. The ground shielding plate prevents the secondary electrons accompanied by the beam from flowing to the positive electrode of the beam scanner 34 from the outside. The power supply of the scanner is protected by the suppression electrode and the ground shielding plate, and hence the orbit of the ion beam is stabilized.

A beam parking function is provided at the rear side of the beam scanner 34. The beam parking function is formed so that the ion beam passing through the beam scanner is largely deflected in the horizontal direction if necessary so as to be led to beam dumps 95*a* and 95*b*.

The beam parking function is a system that instantly stops the transportation of the beam within 10 µs in a case where an implantation error such as a dose uniformity error occurs when an unexpected problem such as a discharge of an electrode occurs during the ion implantation and an implantation operation is continued. In fact, at the moment in which the noticeable degradation in the beam current is detected, the output voltage of the beam scanner power supply is increased to 1.5 times the voltage corresponding to the maximum scan width, and the beam is led to the beam dumps 95*a* and 95*b* near the parallel lens. The beam irradiation position on the wafer at the moment in which the problem occurs is stored, and the beam is returned to the original orbit at the moment in which the wafer moves for the scanning operation in the vertical direction moves to the position after the problem is solved, thereby continuing the ion implantation as if no problem occurs.

A beam scan space portion is provided in a long section at the downstream side of the beam scanner 34 inside the scan housing, and hence a sufficient scan width may be obtained even when the beam scan angle is narrow. At the rear side of the scan housing located at the downstream side of the beam scan space portion, the deflected ion beam is adjusted to be directed to the direction of the ion beam before the beam is deflected. That is, the beam collimator 36 is installed which curves the beam so as to be parallel to the beamline.

Since the aberration (a difference in focal distance between the center portion of the beam collimator and left and right ends) generated in the beam collimator 36 is proportional to the square of the deflection angle of the beam scanner 34, the aberration of the beam collimator may be largely suppressed when the beam scan space portion is increased in length and the deflection angle is decreased. If the aberration is large, the center portion and the left and right ends have different beam sizes and beam divergence angles when the ion beam is implanted into the semiconductor wafer, and hence the quality of the product becomes non-uniform.

Further, when the length of the beam scan space portion is adjusted, the length of the beam transportation line unit may match the length of the high-energy multi-stage linear acceleration unit 14.

Figure 7:
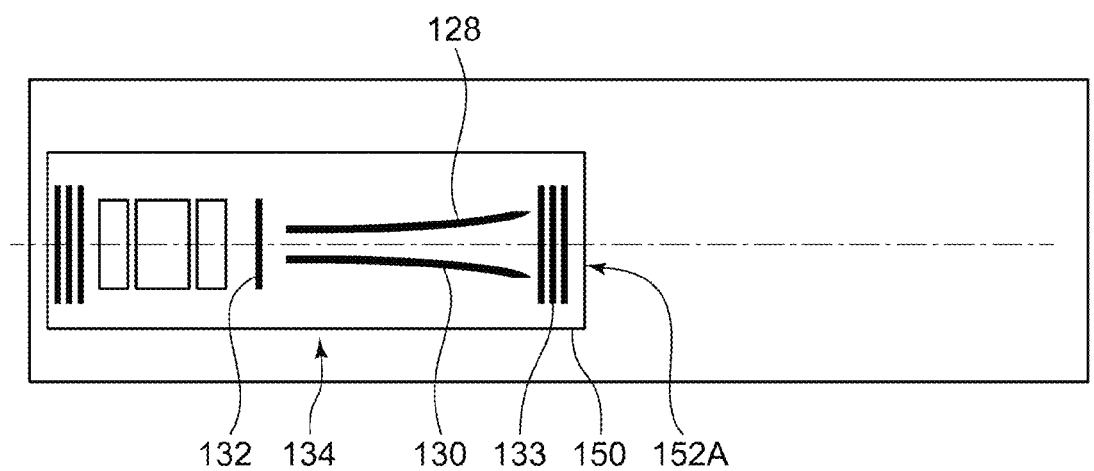
FIG. 7 is a schematic top view illustrating a main part of an example of the beam scanner.
Figure 8:
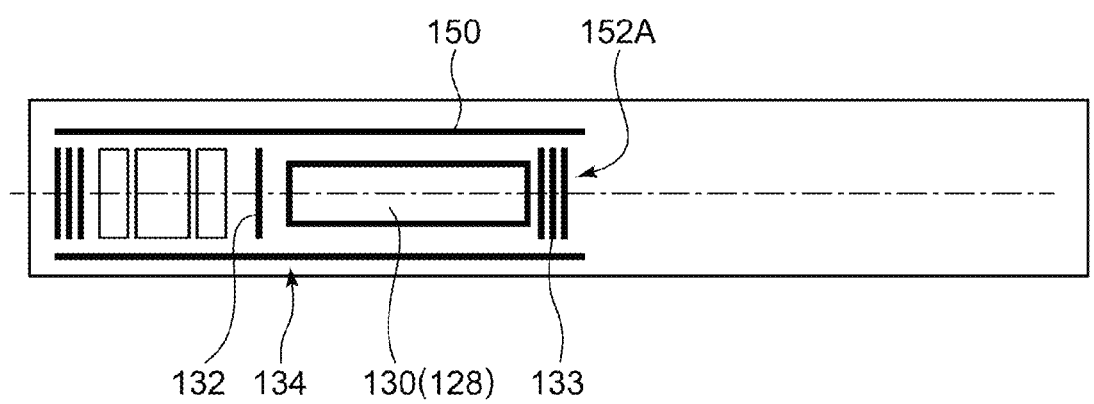
FIG. 8 is a schematic side view illustrating a main part of an example of the beam scanner.
Figure 9:
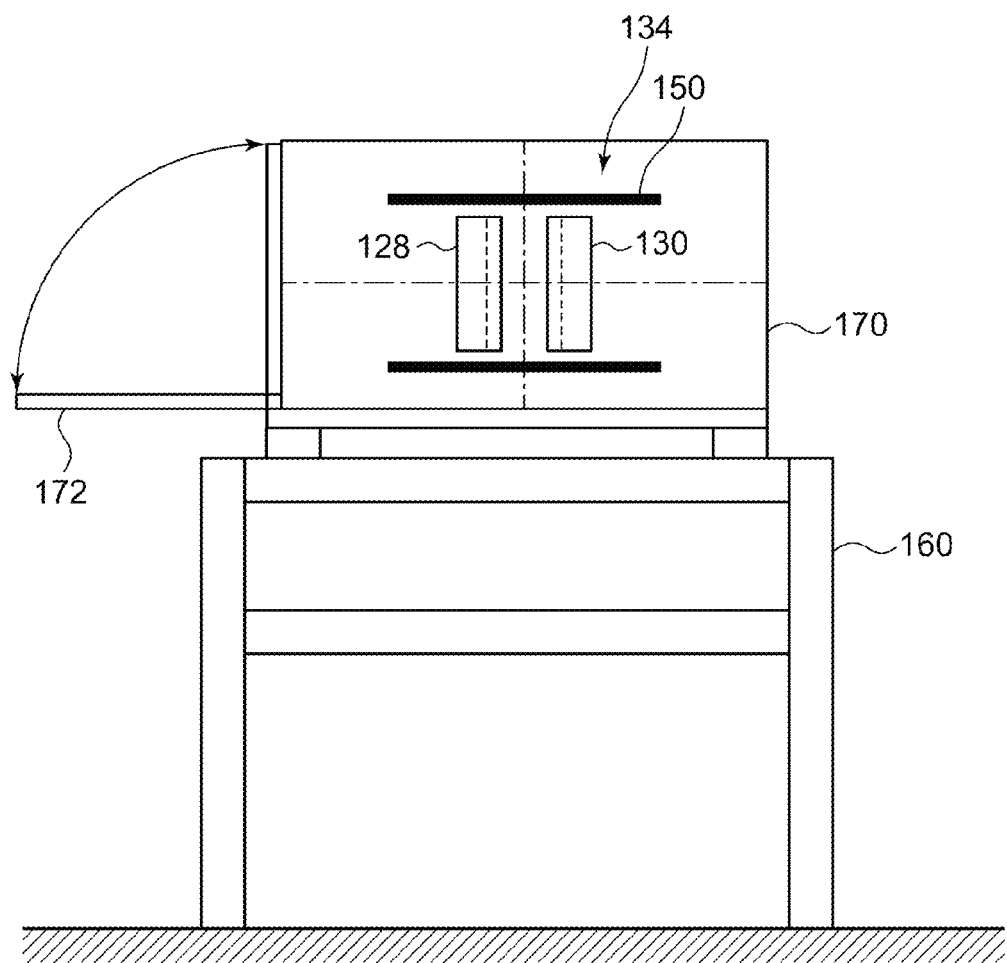
FIG. 9 is a schematic front view illustrating a structure in which an example of the beam scanner is removably attached to a halfway position of an ion beamline path when viewed from the downstream side.

FIG. 7 is a schematic top view illustrating a main part of an example of the beam scanner. FIG. 8 is a schematic side view illustrating a main part of an example of the beam scanner. FIG. 9 is a schematic front view illustrating a structure in which an example of the beam scanner is removably attached to the halfway position of the ion beamline when viewed from the downstream side.

As illustrated in FIGS. 7 and 8, in a beam scanner 134, a pair of deflection electrodes 128 and 130 and ground electrodes 132 and 133 assembled near the upstream and downstream sides thereof are accommodated and installed inside a box 150. An upstream opening portion (not illustrated) and an opening portion 152A larger than the opening portion of the ground electrode 133 are respectively provided at the positions corresponding to the opening portions of the ground electrodes 132 and 133 at the upstream side surface and the downstream side surface of the box 150.

The connection between the deflection electrode and the power supply is realized in the feed through structure. Meanwhile, the upper surface of the box 150 is provided with a terminal and a ground terminal used to connect the deflection electrodes 128 and 130 to the power supply. Further, a handle which is suitable for the attachment or the transportation is provided at each of side surfaces of the box 150 parallel to the beam axis. Furthermore, the box 150 is provided with a vacuum exhaust opening portion that decreases the pressure inside the beam scanner 134, and the vacuum exhaust opening portion is connected to a vacuum pump (not illustrated).

As illustrated in FIG. 9, the box 150 is slidably provided in a beam guide box 170 fixed onto a trestle 160. The beam guide box 170 is sufficiently larger than the box 150, and the bottom portion thereof is provided with two guide rails for sliding the box 150. The guide rail extends in a direction perpendicular to the beam axis, and the side surface of the beam guide box 170 of one end side thereof may be opened and closed by a door 172. Accordingly, the box 150 may be simply extracted from the beam guide box 170 during the repair and the check of the beam scanner 134. Furthermore, in order to lock the box 150 press-inserted into the beam guide box 170, the other end of the guide rail is provided with a locking mechanism (not illustrated).

The scanner peripheral unit members are work targets during the maintenance of the beamline, and the maintenance work may be easily performed from the work space R1. Similarly, the maintenance work of the high-energy multi-stage linear acceleration unit 14 may be easily performed from the work space R1.

The beam collimator 36 is provided with an electric field collimating lens 84. As illustrated in FIGS. 6A and 6B, the electric field collimating lens 84 includes a plurality of acceleration electrode sets and a plurality of deceleration electrode sets substantially having a hyperbolic shape. Each of the pair of electrodes faces each other with an acceleration-deceleration gap interposed therebetween and having a width not causing a discharge, and the acceleration-deceleration gap forms an electric field that is strengthened in proportional to a distance between the reference axis and the axial element causing the acceleration or deceleration velocity of the ion beam and having an element of influencing the lateral convergence of the ion beam.

The downstream electrode in the pair of electrodes with the acceleration gap interposed therebetween and the upstream electrode of the deceleration gap are formed as an integrated structure and the downstream electrode of the deceleration gap and the upstream electrode of the next acceleration gap are formed as an integrated structure so as to have the same potential. As illustrated in FIG. 6B, each of the structures includes an upper unit and a lower unit, and a space portion through which the ion beam passes is formed between the upper unit and the lower unit.

From the upstream side of the electric field collimating lens 84, the first electrode (the incident electrode) and the final electrode (the emission electrode) are maintained at the ground potential. Accordingly, the energy of the beam at the positions before and behind the collimating lens 84 does not change.

In the intermediate electrode structure, the exit electrode of the acceleration gap and the entrance electrode of the deceleration gap are connected with a negative power supply 90 having a variable constant voltage, and the exit electrode of the deceleration gap and the entrance electrode of the acceleration gap are connected with a positive power supply having a variable constant voltage (at the n-stage, negative, positive, negative, positive, negative, and the like). Accordingly, the ion beam is gradually directed toward the direction parallel to the center orbit of the beamline while being accelerated and decelerated repeatedly. Finally, the ion beam reaches the orbit parallel to the ion beam traveling direction (the beamline orbit direction) before the deflection scanning operation.

In this way, the beam that is scanned by the beam scanner 34 becomes parallel to the axis (the reference axis) of the deflection angle 0° parallel to the ion beam traveling direction (the beamline orbit direction) before the scan operation by the beam collimator 36 including the electric field collimating lens and the like. At this time, the scan region is formed so as to be bilaterally symmetrical to each other with respect to the reference axis.

The ion beam that is emitted from the electric field collimating lens 84 is sent to the electric field final energy filter 38 (AEF (94): Angular Energy Filter). In the final energy filter 94, a final analysis is performed on the energy of the ion beam to be directly implanted into the wafer, only the ion species having a necessary energy value are selected, and the neutralized particles or the ions having a different ion charge state are removed. The final energy filter 94 of the electric field deflection is configured as a plate-shaped deflection electrode including a pair of plane or curved surfaces facing each other in the vertical direction of the beamline orbit direction, is curved downward by the deflection action of the final energy filter 94 in the vertical direction of the beamline orbit direction, and is curved so as to match the ion beam orbit.

As illustrated in FIGS. 6A and 6B, the electric field deflection electrode is configured as a pair of AEF electrodes 104, and is disposed so that the ion beam is interposed from the vertical direction. In the pair of AEF electrodes 104, a positive voltage is applied to the upper AEF electrode 104, and a negative voltage is applied to the lower AEF electrode 104. During the deflection by the electric field, the ion beam is deflected downward by about 10 to 20° by the action of the electric field generated between the pair of AEF electrodes 104, and hence only the ion beam having target energy is selected. As illustrated in FIG. 6B, only the ion beam having a charge state selected in the final energy filter 94 is deflected downward at the set orbit angle. The beam that is formed by only the ions selected in this way is uniformly irradiated to the wafer 200 as the irradiation target at an accurate angle.

Figure 10:
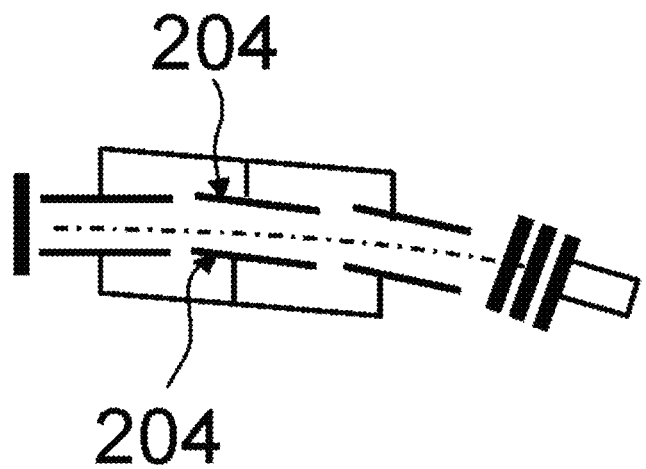
FIG. 10 is a schematic view illustrating another aspect of a deflection electrode of an angle energy filter.

In a case where the high-energy beam is actually deflected, a pair of plate-shaped deflection electrodes 204 facing each other in the vertical direction is divided into n number of segments in the longitudinal direction in accordance with the deflection angle and the curvature radius when the deflection electrodes are curved so as to match the ion beam orbit as illustrated in FIG. 10. Thus, the production precision or the economic efficiency is excellent in the plate-shaped electrode of which the upper electrode and the lower electrode are maintained at the same potential. Further, the plate-shaped deflection electrode that is divided into n number of segments in the longitudinal direction may be formed as n number of upper and lower plate-shaped electrodes set to different potentials other than the configuration in which the upper electrode and the lower electrode are maintained at the same potential.

With such a structure, the electric field type energy filter may be mounted on the high-energy scan beam transportation line. Since the beam is deflected in a direction perpendicular to the beam scan surface by the electric field, the energy analysis may be performed without influencing the implantation ion density distribution (the uniformity) in the beam scan direction.

Further, in addition to the mounted final energy filter, the beamline is equipped with three kinds of beam filters, that is, the radio frequency linear accelerator of the high-energy multi-stage linear acceleration unit 14, the magnetic field type EFM (the energy analysis electromagnet 24) and the BM (the deflection electromagnet 30) of the U-shaped deflection portion, and the final energy filter. As described above, the radio frequency linear accelerator is the velocity (v) filter, the EFM and the BM are the momentum (mv) filters, and the final energy filter is the energy ($mv^2/2$) filter as its name. In this way, when the different triple filters are used, a very pure ion beam that has high energy purity compared to the related art and has a small amount of particles or metal contamination may be supplied to the wafer.

Furthermore, in function, the EFM removes the energy contamination sneaking through the radio frequency linear accelerator or limits the energy width with high resolution, and the AEF mainly removes the ions subjected to a change in charge state by the resist outgas by the beam transportation line unit after the energy analysis using the EFM with comparatively low resolution.

The final energy filter 94 includes a ground electrode 108 that is provided at the upstream side of the final energy filter 94 and an electrode set provided with an AEF suppression electrode 110 provided between two ground electrodes at the downstream side. The AEF suppression electrode 110 suppresses the intrusion of the electrons to the positive electrode.

Dose cups 122 that are disposed at the left and right ends of the most downstream ground electrode of the final energy filter 94 measure the amount of the beam current to be implanted based on the dose amount.

(Substrate Processing/Supplying Unit)

In FIG. 6A, the arrow near the wafer 200 indicates the beam scanned in the arrow direction. Then, in FIG. 6B, the arrow near the wafer 200 indicates the reciprocation movement, that is, the mechanical scanning operation of the wafer 200 in the arrow direction. That is, when the beam is scanned in a reciprocating manner in, for example, one axial direction, the wafer 200 is driven by a driving mechanism (not illustrated) so that the wafer moves in a reciprocating manner in a direction perpendicular to the one axial direction.

The substrate processing/supplying unit 20 that supplies the wafer 200 to a predetermined position and performs an ion implantation thereon is accommodated in a process chamber (an implantation process chamber) 116. The process chamber 116 communicates with an AEF chamber 102. An energy defining slit (EDS) 118 is disposed inside the process chamber 116. The energy defining slit 118 is formed as a slit that is laterally long in the scan direction in order to separate only the ion beam having a meaningful energy value and a meaningful charge state and passing through the AEF by limiting the passage of the ion beam having a non-meaningful energy value and a non-meaningful charge state. Further, the energy defining slit 118 forms a slit body by a movable member in the vertical direction so as to adjust the separation gap of the slit, and may be used for various measurement purposes such as an energy analysis or an implantation angle measurement. Further, the movable upper and lower change slit members include a plurality of slit surfaces, and the slit width may be changed to a desired slit width in a manner such that the slit surfaces are changed and the axes of the upper and lower slits are adjusted or rotated in the vertical direction. A configuration may be also employed which decreases the cross contamination by sequentially changing the plurality of slit surfaces in response to the ion type.

A plasma shower 120 supplies low-energy electrons to the entire surface of the wafer 200 and the ion beam on the orbit in response to the beam current amount of the ion beam, and suppresses the charge-up of the positive charge generated in the ion implantation. Furthermore, a dose cup (not illustrated) that measures the dose amount may be disposed at each of left and right ends of the plasma shower 120 instead of the dose cups 122 disposed at the left and right ends of the most downstream ground electrode of the final energy filter 94.

A beam profiler 124 includes a beam profiler cup (not illustrated) that measures the beam current at the ion implantation position. The beam profiler 124 measures the ion beam density at the ion implantation position in the beam scan range while moving in the horizontal direction before the ion implantation. In a case where the predicted non-uniformity (PNU) of the ion beam does not satisfy the request of the process as a result of the beam profile measurement, the PNU is automatically adjusted to satisfy the process condition by correcting the control function of the application voltage of the beam scanner 34. Further, a configuration may be also employed in which a vertical profile cup (not illustrated) is provided in parallel to the beam profiler 124, the beam shape and the beam X-Y position are measured, the beam shape at the implantation position is checked, and the implantation angle or the beam divergence angle is checked by the combination of the beam width, the beam center position, and the divergence mask.

Figure 15:
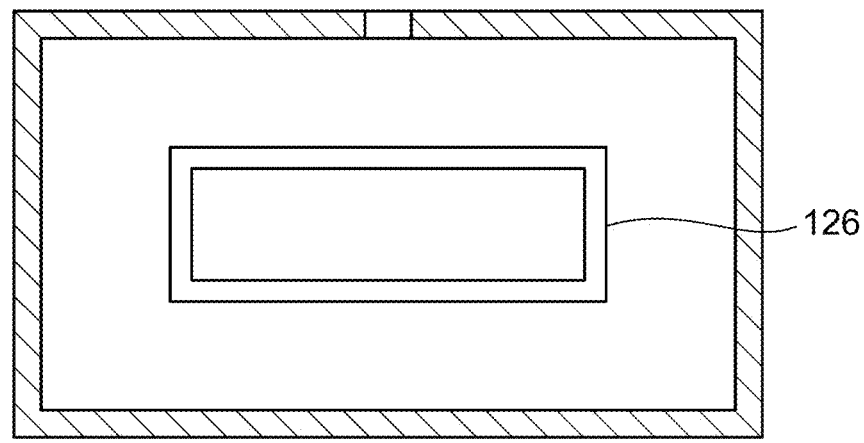
FIG. 15 is a schematic front view illustrating a lateral elongated faraday cup.

A lateral elongated faraday cup 126 with a beam current measurement function capable of measuring the ion beam in the scan range in the wafer region is disposed at the most downstream side of the beamline, and is configured to measure the final setup beam. FIG. 15 is a schematic front view illustrating the lateral elongated faraday cup. Furthermore, in order to reduce the cross contamination, the lateral elongated faraday cup 126 may include a changeable bottom surface of a faraday cup of a tripe surface structure capable of changing three surfaces of a triangular prism in response to the ion type. Further, a configuration may be also employed in which a vertical profile cup (not illustrated) is provided in parallel to the lateral elongated faraday cup 126, the beam shape or the vertical beam position is measured, and the implantation angle or the beam divergence angle in the vertical direction at the implantation position is monitored.

As described above, the high-energy ion implanter 100 is formed so that the units are disposed in a U-shape so as to surround the work space R1 as illustrated in FIG. 1. For this reason, a worker in the work space R1 may perform the replacement, the maintenance, and the adjustment of the parts of many units.

(Consideration of Entire Layout, Maintenance Workability, Manufacturability, and Global Environment)

The high-energy ion implanter 100 according to the embodiment accelerates the ion beam generated in the ion beam generation unit 12 by the high-energy multi-stage linear acceleration unit 14, changes the direction of the ion beam by the beam deflection unit 16, and irradiates the ion beam to the substrate existing in the substrate processing/supplying unit 20 provided at the termination end of the beam transportation line unit 18.

Further, the high-energy ion implanter 100 includes the high-energy multi-stage linear acceleration unit 14 and the beam transportation line unit 18 as the plurality of units. Then, the high-energy multi-stage linear acceleration unit 14 and the beam transportation line unit 18 are disposed so as to face each other with the work space R1 illustrated in FIG. 1 interposed therebetween. Accordingly, since the high-energy multi-stage linear acceleration unit 14 and the beam transportation line unit 18 disposed substantially linearly in the apparatus of the related art are disposed in a folded state, an increase in the entire length of the high-energy ion implanter 100 may be suppressed. Further, the curvature radiuses of the plurality of deflection electromagnets forming the beam deflection unit 16 are optimized so as to minimize the width of the apparatus. With such a configuration, the installation area of the apparatus is minimized, and the maintenance or the like of the high-energy multi-stage linear acceleration unit 14 or the beam transportation line unit 18 may be performed in the work space R1 interposed between the high-energy multi-stage linear acceleration unit 14 and the beam transportation line unit 18.

Further, the plurality of units constituting the high-energy ion implanter 100 includes the ion beam generation unit 12 that is provided at the upstream side of the beamline and generates the ion beam, the substrate processing/supplying unit 20 that is provided at the downstream side of the beamline and supplies the substrate so as to perform a process in which ions are implanted into the substrate, and the beam deflection unit 16 that is provided at the halfway position of the beamline from the ion beam generation unit 12 toward the substrate processing/supplying unit 20 and deflects the orbit of the ion beam. Then, the ion beam generation unit 12 and the substrate processing/supplying unit 20 are disposed at one side of the entire beamline, and the beam deflection unit 16 is disposed at the other side of the entire beamline. Accordingly, since the ion source 10 that needs to be subjected to the maintenance within a comparatively short time and the substrate processing/supplying unit 20 that needs to supply and acquire the substrate are disposed so as to be adjacent to each other, the movement area of the worker may be small.

Further, the high-energy multi-stage linear acceleration unit 14 includes a plurality of linear accelerators that accelerate the ions, and each of the plurality of linear accelerators may include a common connection portion. Accordingly, the number or the type of the linear accelerator may be easily changed in response to the energy necessary for the ions implanted into the substrate.

Further, the beam scanner 34 as the scanner device and the beam collimator 36 as the collimating lens device may include a standard-shaped connection portion with respect to the adjacent units. Accordingly, the number or the type of the linear accelerator may be easily changed. Then, the beam scanner 34 or the beam collimator 36 may be selected in response to the configuration and the number of the linear accelerator included in the high-energy multi-stage linear acceleration unit 14.

Further, in the high-energy ion implanter 100, the alignment (the positional adjustment) of the beam may be performed by integrating the vacuum chamber and the frame of each device and performing the assembly in accordance with the reference position of the vacuum chamber or the frame of the device. Accordingly, the troublesome alignment operation may be minimized, and the device set-up time may be shortened. Accordingly, the deviation of the axis caused by the mistake in work may be suppressed. Further, the alignment of the vacuum chambers may be performed by the unit of the module. Accordingly, the work load may be reduced. Further, the size of the modulated device may be decreased to be equal to or smaller than the size in which the device may easily move. Accordingly, the relocation load of the module or the high-energy ion implanter 100 may be reduced.

Further, the high-energy ion implanter 100 may be formed so that the high-energy multi-stage linear acceleration unit 14, the beam transportation line unit 18, the exhaust device, and the like are assembled to a single trestle. Further, the high-energy ion implanter 100 is formed so that the high-energy multi-stage linear acceleration unit 14, the beam deflection unit 16, and the beam transportation line unit 18 are included in one plane on the plane base. Accordingly, since each block of the high-energy ion implanter 100 may be directly transported while the blocks are fixed onto one plane base, a deviation in adjustment hardly occurs, and hence an effort for re-adjusting the blocks on site may be reduced. For this reason, it is possible to prevent an uneconomical problem in which many experts are sent to the installation site for a long period of time.

Further, when the plane base is formed in the middle portion of the trestle instead of the floor thereof, only the devices directly involved with the ion beam orbit may be mounted onto the plane base. Then, when a component such as a radio frequency cubic circuit as an auxiliary device may be assembled in the space formed below the plane base, the space utilization efficiency may be improved, and hence the ion implanter having a compacter size may be realized.

Thus, the high-energy ion implanter 100 may be also installed in a site where a sufficient installation place is not ensured, and may be used in a manner such that the high-energy ion implanter is transported to a demanded place in a state where the apparatus is assembled and adjusted inside a production factory, is fixed at the installation site, and is used by the final adjustment. Further, the high-energy ion implanter 100 may realize the high-energy ion implantation while satisfying the standard level of the semiconductor production line of the semiconductor production factory.

In this way, the high-energy ion implanter 100 may be decreased in size compared to the related art by examining the layout of the units or the devices, and hence may have an installation length that is about a half of the size of the related art. Further, the ion implanter according to the embodiment may be operated in a manner such that the components are assembled to the bases inside the production factory, are loaded in a transportation vehicle to be transported to the installation site while the ion beam orbit is established through the positional adjustment on the bases, are fixed to the trestles, and then the deviation in adjustment is finely adjusted to be removed. For this reason, the ion implanter may be remarkably easily and reliably adjusted on site by a person who is not an expert, and hence the set-up time may be shortened.

Further, when the layout like the elongated U-shaped folded beamline is employed, the ion implanter capable of highly precisely implanting the high-energy ions of 5 to 8 MeV in maximum may be realized. Further, the ion implanter includes a small installation area and a sufficient maintenance area by the layout having a center passage (a center region). Further, the power consumption may be decreased by the low-power consumption operation using the electric field parallel lens, the electric field type scanner, the electric field AEF, and the like during the operation of the ion implanter. In other words, the ion implanter according to the embodiment may perform the low-power consumption operation by employing the scan beam parallelization mechanism using the electric field deflection type collimating lens device.

While the invention has been described by referring to the above-described embodiment, the invention is not limited to the above-described embodiment, and the appropriate combination of the configurations of the embodiment or the substitution thereof is also included in the invention. Further, the combination of the embodiments or the process sequence thereof may be appropriately set or various modifications in design may be added to the embodiments based on the knowledge of the person skilled in the art. An embodiment having such modifications may be also included in the scope of the invention.

Hereinafter, another aspect of the invention will be described according to embodiments.

As illustrated in FIG. 1, the high-energy ion implanter 100 according to the embodiment is a high-energy ion implanter that accelerates an ion beam extracted from the ion source 10, transports the ion beam to the wafer along the beamline, and implants the ion beam into the wafer. The high-energy ion implanter 100 includes the ion beam generation unit 12 that includes the ion source 10 and the mass spectrometer 22, the high-energy multi-stage linear acceleration unit 14 that accelerates the ion beam so as to generate the high-energy ion beam, the high-energy beam deflection unit 16 that deflects the high-energy ion beam so as to analyze the energy and to change the direction of the ion beam toward the wafer, the beam transportation line unit 18 that transports the deflected high-energy ion beam to the wafer, and the substrate processing/supplying unit 20 that uniformly implants the transported high-energy ion beam into the semiconductor wafer. The beam transportation line unit 18 includes the beam shaper 32, the high-energy beam scanner 34, the high-energy beam collimator 36, and the high-energy final energy filter 38.

The high-energy ion implanter 100 scans the high-energy ion beam emitted from the beam deflection unit 16 at both sides of the reference trajectory of the beamline by the beam scanner 34, collimates the high-energy ion beam by the beam collimator 36, removes mixed ions which are different in any one of the mass, the ion charge state, and the energy by the high-energy final energy filter 38, and implants the resultant ions into the wafer. Further, the high-energy beam collimator 36 is an electric field type beam collimator that collimates the scan beam while performing (repeating) the acceleration and the deceleration of the high-energy beam by the electric field.

Further, as illustrated in FIGS. 6A and 6B, the beam collimator 36 includes at least a pair of acceleration electrodes 135 (135b and 135c) which has a beam entrance opening portion 135a corresponding to the beamline L1 and faces each other with a gap G1 so as to generate an electric field for accelerating the ions in the beam traveling direction and at least a pair of deceleration electrodes 136 (136b and 136c) which has a beam exit opening portion 136a corresponding to the beamline L1 and faces each other with a gap G2 so as to generate an electric field for decelerating the ions in the beam traveling direction.

The pair of acceleration electrodes 135 accelerates the ion beam and deflects the ion beam toward the reference trajectory. Further, the pair of deceleration electrodes 136 decelerates the ion beam and deflects the ion beam toward the reference trajectory.

Each of the pair of acceleration electrodes 135 and the pair of deceleration electrodes 136 includes two electrodes that face each other with a gap therebetween so as to generate an electric field serving as an element for accelerating or decelerating the high-energy ion beam and an element for deflecting the high-energy ion beam. Then, the acceleration gap exit side electrode 135c and the deceleration gap entrance side electrode 136b have the same potential and the deceleration gap exit side electrode 136c and the acceleration gap entrance side electrode 135b have the same potential. Further, these electrodes are integrally formed.

According to this aspect, the scanned high-energy ion beam may be collimated in a bilaterally symmetric state, and hence the highly precise ion implantation may be performed.

Further, in the beam collimator 36 illustrated in FIGS. 6A and 6B, the potential of the upstream electrode 135b of the beamline in the pair of acceleration electrodes 135 is set to a ground potential, the downstream electrode 135c of the beamline in the pair of acceleration electrodes 135 and the upstream electrode 136b of the beamline in the pair of deceleration electrodes 136 are electrically connected (integrated) so as to have a potential of −50 kV by the parallelization power supply 90, and the potential of the downstream electrode 136c of the beamline of the pair of deceleration electrodes 136 is set to a ground potential.

In a case where the ion beam is collimated by the electric field generated by the beam collimator 36 with such a configuration, the ion beam is accelerated or decelerated between the electrodes so that the ion energy also changes. However, since the potentials of the entrance and the exit of the beam collimator 36 are equal to each other, a change in energy does not occur as a whole. That is, the beam collimator 36 is formed so that the energy of the ion beam scanned by the beam scanner 34 is equal to the energy of the ion beam collimated by the acceleration electrode 135 and the deceleration electrode 136.

Figure 16:
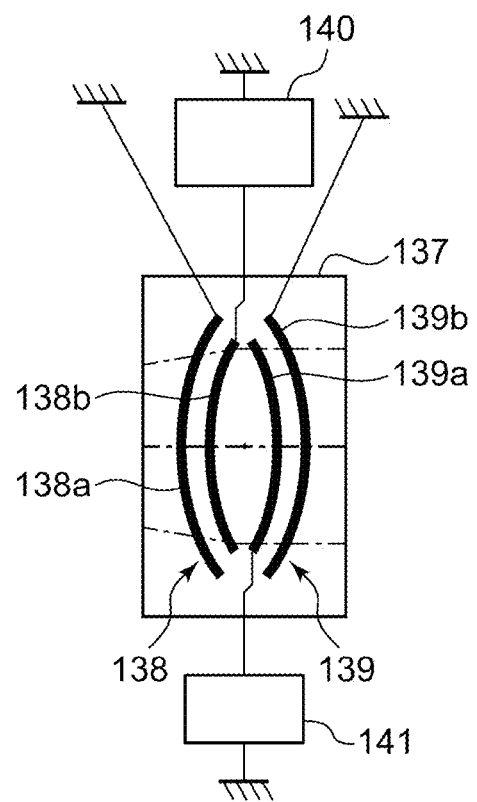
FIG. 16 is a top view illustrating a schematic configuration of a beam collimator as an aspect of the embodiment.

FIG. 16 is a top view illustrating a schematic configuration of the beam collimator according to the aspect of the embodiment. Furthermore, the same reference numerals will be given to the same components as those of the beam collimator 36 illustrated in FIGS. 6A and 6B, and the description thereof will not be appropriately repeated.

In the beam collimator 137 illustrated in FIG. 16, the potential of the upstream electrode 138a of the beamline in the pair of acceleration electrodes 138 is set to a ground potential, the first potential of the downstream electrode 138b of the beamline in the pair of acceleration electrodes 138 is set to V1 [V] (V1>0), the second potential of the upstream electrode 139a of the beamline in the pair of deceleration electrodes 139 is set to −V2 [V] (V2>0), and the potential of the downstream electrode 139b of the beamline in the pair of deceleration electrodes 139 is set to a ground potential. The electrode 138a is connected with a parallelization power supply 140 that applies a positive voltage, and the electrode 139a is connected with a parallelization power supply 141 that applies a negative voltage.

Furthermore, a configuration may be employed in which a negative voltage is applied to the parallelization power supply 140 and a positive voltage is applied to the parallelization power supply 141. Further, the first potential and the second potential may be formed so as to satisfy the relation of |V1|=|V2|. Accordingly, the ion beam may be collimated while being accelerated and decelerated with a balance. Further, the parallelization power supply 140 and the parallelization power supply 141 may be configured as the power supplies having the same configuration.

FIG. 17A is a top view illustrating a schematic configuration of the beam collimator according to the aspect of the embodiment, and FIG. 17B is a side view illustrating a schematic configuration of the beam collimator according to the aspect of the embodiment. Furthermore, the same reference numerals will be given to the same components as those of the beam collimator 36 illustrated in FIGS. 6A and 6B, and the description thereof will not be appropriately repeated.

The beam collimator 142 illustrated in FIGS. 17A and 17B is configured as an acceleration-deceleration electrode lens group that includes multiple pairs of acceleration electrodes 143 and 144 and multiple pairs of deceleration electrodes 145 and 146, and is configured to gradually collimate the scanned ion beam. Accordingly, since the voltage applied to one acceleration electrode or one deceleration electrode may be decreased, the power supply may be simplified and decreased in size. Further, the occurrence of the discharge may be also suppressed.

Further, a downstream electrode 143b of the acceleration electrode 143 and an upstream electrode 145a of the deceleration electrode 145 are electrically connected to each other so as to have the same potential, and are connected to a first parallelization power supply 147. Further, a downstream electrode 145b of the deceleration electrode 145 and an upstream electrode 144a of the acceleration electrode 144 are electrically connected to each other so as to have the same potential, and are connected to a second parallelization power supply 148. Further, the downstream electrode 144b of the acceleration electrode 144 and an upstream electrode 146a of the deceleration electrode 146 are electrically connected to each other so as to have the same potential, and are connected to the first parallelization power supply 147. Furthermore, an upstream electrode 143a of the acceleration electrode 143 and a downstream electrode 146b of the deceleration electrode 146 are set to a ground potential. In this way, when the voltages applied to a part of the electrodes are set to the same voltage, the number of the power supplies in use may be decreased.

Furthermore, among the multiple pairs of acceleration electrodes 143 and 144 and the multiple pairs of deceleration electrodes 145 and 146, the electrode 143a as the entrance ground electrode disposed at the most upstream side of the beamline and the electrode 143b adjacent to the electrode 143a may form a first suppression electrode that suppresses the inflow of electrons, and the electrode 146b as the exit ground electrode disposed at the most downstream side of the beamline and the electrode 146a adjacent to the electrode 146b may form a second suppression electrode that suppresses the inflow of electrons. Accordingly, there is no need to separately provide the suppression electrode.

Further, when the voltage applied to the downstream electrode 143b of the acceleration electrode 143 by the first parallelization power supply 147 is indicated by −V1[V] (V1>0), the voltage applied to the downstream electrode 145b of the deceleration electrode 145 by the second parallelization power supply 148 is indicated by V2[V] (V2>0), the gap between two electrodes 143a and 143b of the acceleration electrode 143 is indicated by G1, and the gap between two electrodes 145a and 145b of the deceleration electrode 145 is indicated by G2, the following relation may be satisfied.

$$|V1|/G1=|V1+V2|/G2$$

In this way, when the electric field strength between the electrodes in the acceleration electrode and the deceleration electrode becomes uniform, the ion beam may be collimated while being accelerated and decelerated with a balance.

Further, the beam collimator 142 is formed so that the energy of the ion beam to be directly incident to the beam collimator is equal to the energy of the ion beam directly emitted from the beam collimator. More specifically, in the beam collimator 142, the incident electrode (143a) and the emission electrode (146b) of the beam collimator 142 are both grounded so that the energy of the ion beam scanned by the beam scanner is equal to the energy of the ion beam collimated by the pair of acceleration electrodes (143 and 144) and the pair of deceleration electrodes (145 and 146), the exit side electrode (143b and 144b) of the acceleration gap and the entrance side electrode (145a and 146a) of the deceleration gap are set to the same positive or negative potential, and the deceleration gap exit side electrode 145b and the acceleration gap entrance side electrode 144a are set to the same positive or negative potential.

Further, in the beam collimator 142, the electrode potentials are set so that the ion beam scanned at both sides of the reference trajectory by the beam scanner on the beamline toward the reference trajectory by the electric field generated by the pair of electrodes on the scan plane are deflected so as to match the orbit parallel to the reference trajectory.

Figure 18:
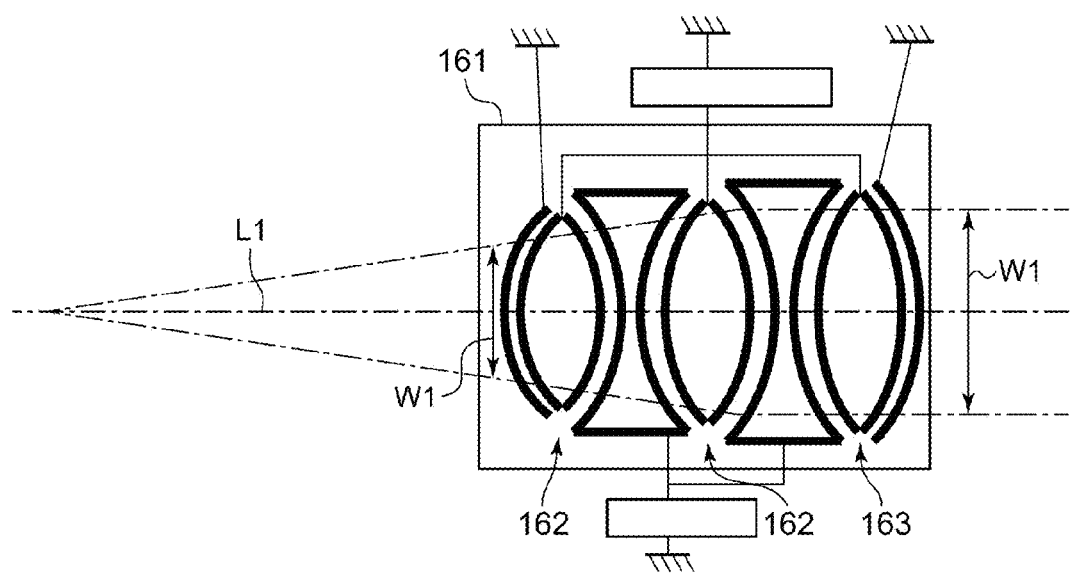
FIG. 18 is a top view illustrating a schematic configuration of a beam collimator according to a modified example of the embodiment.

FIG. 18 is a top view illustrating a schematic configuration of a beam collimator according to a modified example of the embodiment. A beam collimator 161 illustrated in FIG. 18 is provided with three collimating lenses 162, 163, and 164 formed by an acceleration electrode and a deceleration electrode. The ion beam that is deflected and scanned by the beam scanner is widened toward the downstream side of the beamline L1. Therefore, each of three collimating lenses 162, 163, and 164 is formed so that the width thereof gradually increases from the upstream side toward the downstream side of the beamline L1. Accordingly, the upstream collimating lens may be decreased in size.

Furthermore, the beam collimator 161 may be formed so that the width W1 of the collimated ion beam in the scan direction is two times or more the width W2 when the ion beam scanned by the beam scanner is incident to the beam collimator 161. Accordingly, the distance from the beam scanner to the beam collimator may be decreased.

The beam collimator according to the embodiment is formed by a pair of bow-shaped gap electrodes like the acceleration electrode or the deceleration electrode illustrated in FIGS. 6A and 6B and FIGS. 16 to 18. Further, the downstream electrode in the beamline of the pair of acceleration electrodes and the upstream electrode in the beamline of the pair of deceleration electrodes are configured as an electrode unit which is continuously integrated while both ends thereof are connected. Further, in the above-described beam collimator, the incident electrode and the emission electrode have a ground potential. However, when one of the incident electrode and the emission electrode is set to a ground potential and the other thereof is set to a specific potential or both electrodes are set to different specific potentials, it is possible to change the energy of the ion beam emitted after the beam incident to the beam collimator is collimated.

In this way, the high-energy ion implanter according to the embodiment may be operated at a low voltage while keeping the uniformity of the beam current density of the high-energy ion beam, and may obtain an electric field that does not change the beam energy before and after the beam passes through the beam collimator.

Further, the high-energy ion implanter according to the embodiment is configured to collimate the beam by causing the high-energy ion beam to pass through the elongated electric field. Then, the high-energy ion implanter is configured so that the beam is collimated by a plurality of electrode lens groups capable of accelerating and decelerating the ion beam and the acceleration-deceleration electrode lens group is configured as a pair of bow-shaped gap electrodes lenses, thereby preventing a change in beam energy before and after the ion beam passes therethrough.

Accordingly, the control of the parallelization power supply and the adjustment of the parallelization electric field may be easily performed, and the precision of the parallelization and the angle precision of the collimated beam in the beam traveling direction may be made satisfactory. Further, since a difference in beam path in the horizontal (scan) direction is symmetric, the beamline may be uniform in the horizontal direction, and hence the convergence and divergence uniformity of the beam may be maintained in the high-energy ion beam. As a result, the precision of the parallelization and the angle precision of the collimated beam in the beam traveling direction may be made high. In addition, the density distribution (profile) of the high-energy ion beam and the beam size in the beam scan range may not be substantially changed, and hence the uniformity of the beam current density may be maintained.

Further, in the beam collimator according to the embodiment disposed at the downstream side of the beam scanner having a small beam scan deflection angle and a beam scan width set as small as possible, the incident beam having a narrow beam scan width may be also gently collimated with high precision to the width in which the wafer may be scanned. As a result, a change in the quality of the beam decreases, and hence the uniformity of the beam current density may be maintained.

Furthermore, in a case where the acceleration-deceleration electrode lens group includes n pairs of acceleration electrodes and n pairs of deceleration electrodes and a first pair of acceleration electrodes, a first pair of deceleration electrodes, a second pair of acceleration electrodes, a second pair of deceleration electrodes, . . . , n-th (n is a natural number) pair of acceleration electrodes, and n-th pair of deceleration electrodes are disposed in this order along the beamline, the potentials may be set as below. Specifically, in the acceleration-deceleration electrode lens group, the first potential of the entrance electrode of the first pair of acceleration electrodes is set to a ground potential, the second potentials of the exit electrode of the first pair of acceleration electrodes and the entrance electrode of the first pair of deceleration electrodes are set to $-V1[V]$ ($V1>0$), the third potentials of the exit electrode of the first pair of deceleration electrodes and the entrance electrode of the second pair of acceleration electrodes are set to $V2[V]$ ($V2>0$), the fourth potentials of the exit electrode of the second pair of acceleration electrodes and the entrance electrode of the second pair of deceleration electrodes are set to $-V1[V]$ ($V1>0$), the fifth potentials of the exit electrode of the second pair of deceleration electrodes and the entrance electrode of the third pair of acceleration electrodes are set to $V2[V]$ ($V2>0$), and the $(2n+1)$-th potential of the exit electrode of the n-th pair of acceleration electrodes is set to the ground potential. Here, the second potential and the third potential may be set so as to satisfy the relation of $V1=V2$ or the relation of $V1 \neq V2$.

As illustrated in FIGS. 6A and 6B, the electric field type beam scanner 34 may be formed so that a beam can be temporarily dumped by leading an ion beam to any one of the left and right beam dumps 95a and 95b provided at a front portion of the electric field type beam collimator 36 by further deflecting the ion beam outside a normal scan range.

Figure 19:
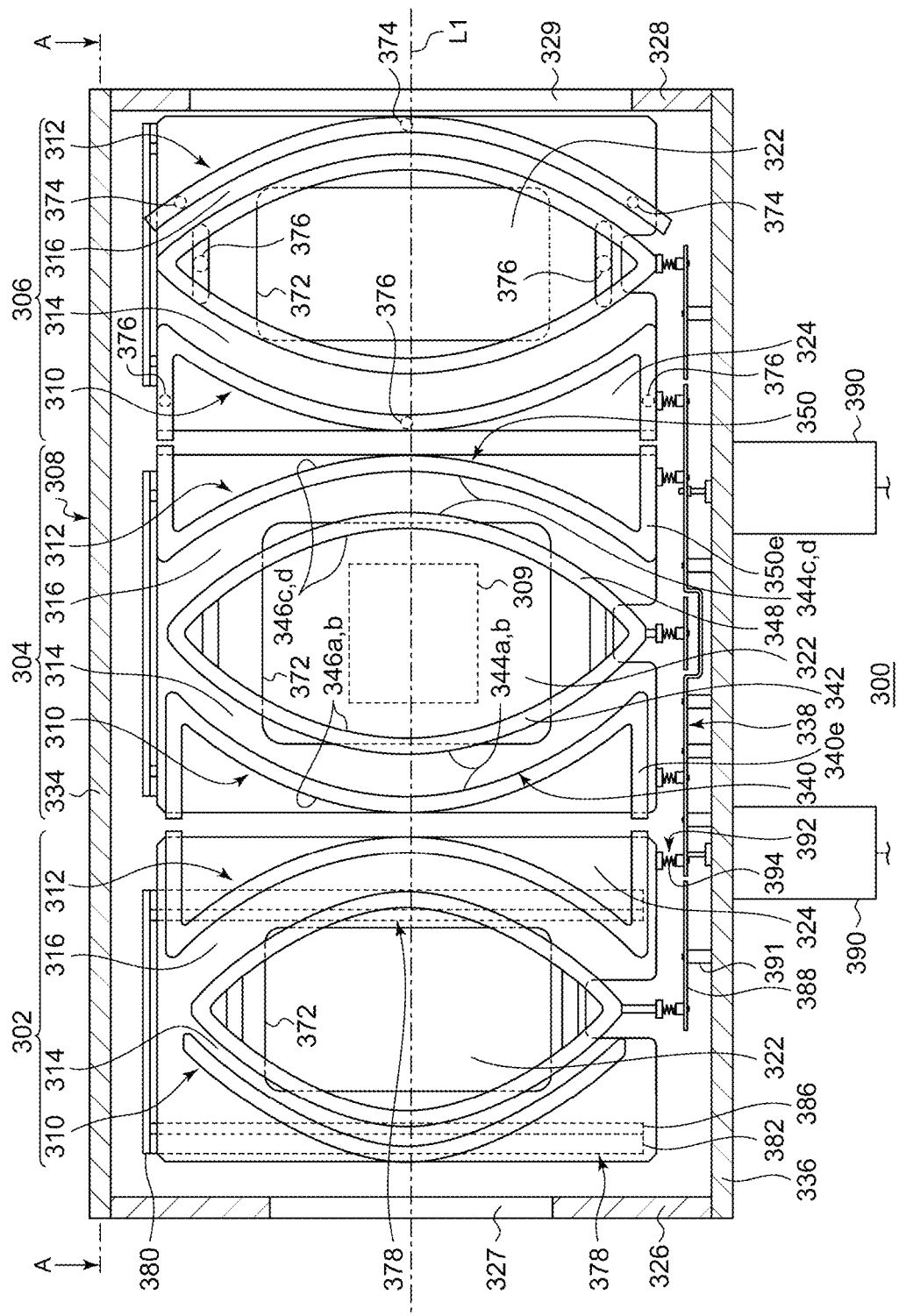
FIG. 19 is a schematic view illustrating a configuration of a beam collimator according to an embodiment of the present invention.
Figures 1, 20:
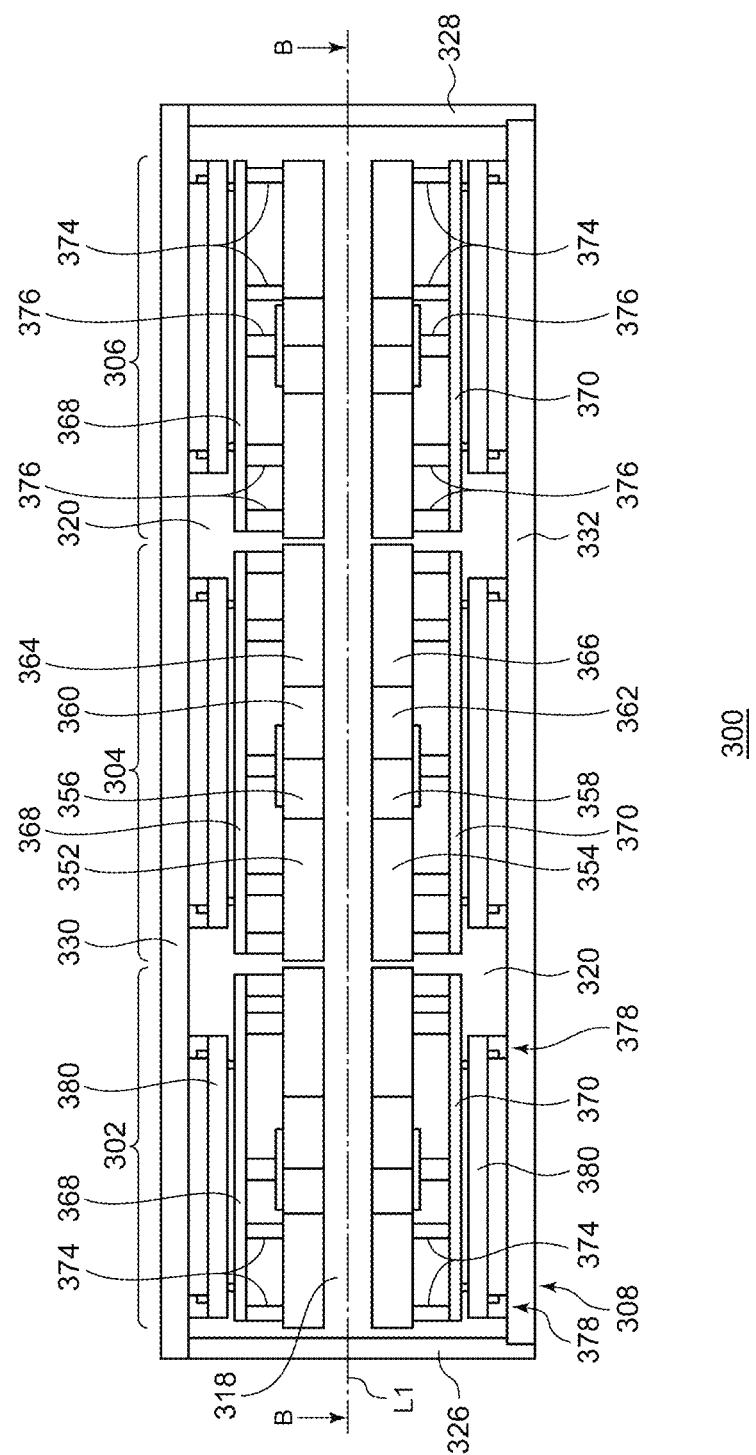
Figure 21:
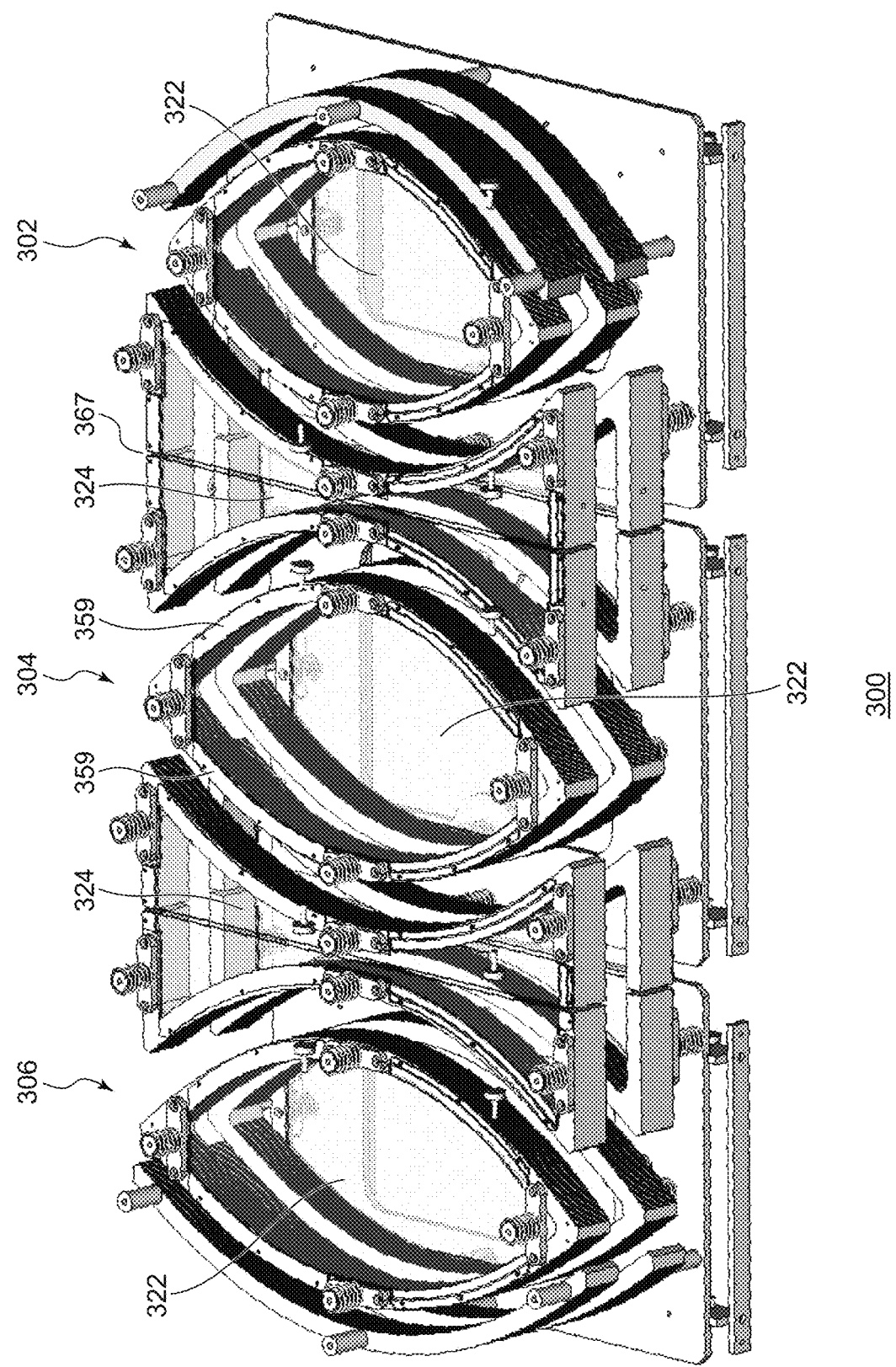
FIG. 21 is a schematic view illustrating a configuration of a beam collimator according to an embodiment of the present invention.

FIGS. 19 to 21 are schematic views illustrating a configuration of a beam collimator 300 according to an embodiment of the present invention. The beam collimator 300 is provided with three collimating lenses as in the case of the beam collimator 161 illustrated in FIG. 18. The beam collimator 300 is provided with a first collimating lens 302, a second collimating lens 304, and a third collimating lens 306 corresponding to the collimating lenses 162, 163, and 164 illustrated in FIG. 18, respectively. These three collimating lenses 302, 304, and 306 is formed so that the width gradually increases from the upstream side toward the downstream side of the beamline. The beam collimator 300 is provided with a vacuum container 308 surrounding the collimating lenses 302, 304, and 306.

Figures 2, 20:
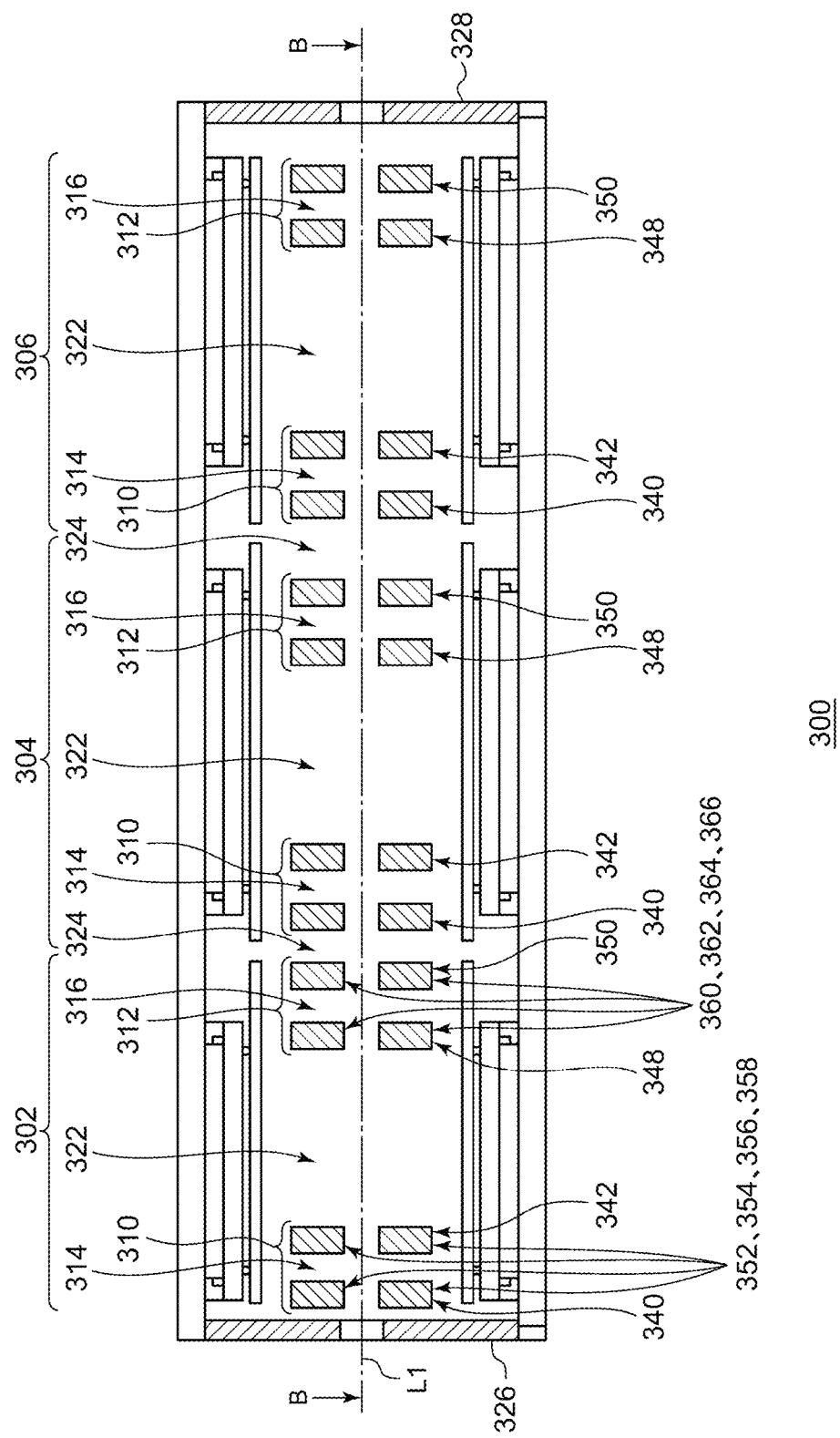
Figures 3, 20:
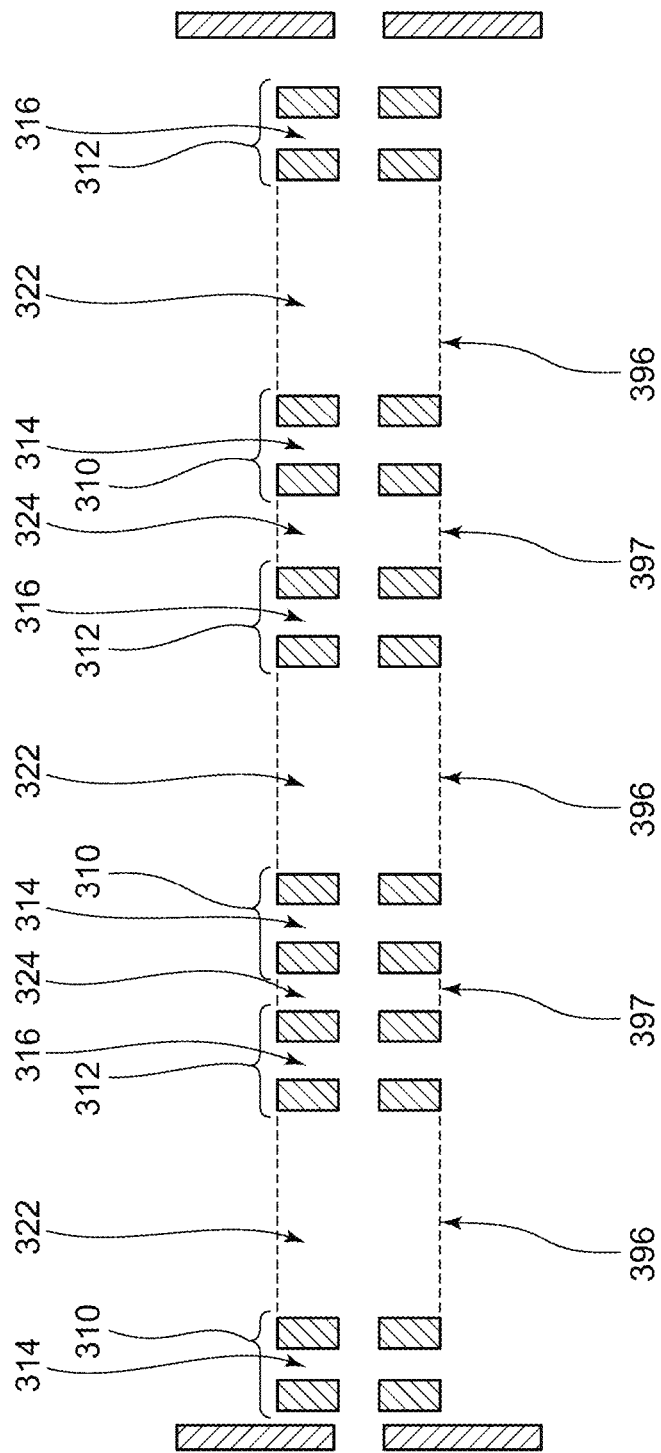

FIG. 19 is a B-B arrow cross-sectional view of FIG. 20-1 and illustrates a cross section by a scan plane of an ion beam. In FIG. 19, as in the case of FIG. 18, an ion beam scanned by a beam scanner (for example, the beam scanner 34 shown in FIG. 1) is incident to the beam collimator 300 from the left side of the figure. The ion beam collimated by the beam collimator 300 is emitted from the right side of the figure and is incident to a beamline component of the rear stage (for example, the final energy filter 38 shown in FIG. 1). FIG. 20-1 is an A-A arrow view of FIG. 19. Note that FIG. 20-1 illustrates the beam collimator 300 in a state where one of the walls of the vacuum container 308 is removed from the vacuum container 308. FIG. 20-2 is a partial cross sectional view that shows the configuration of an acceleration or deceleration lens unit according to a plane that is perpendicular to a paper surface of FIG. 19. FIG. 20-3 is a partial cross sectional view of a first cover unit 396 and a second cover unit 397 provided on the acceleration or deceleration lens unit according to FIG. 20-2. FIG. 21 illustrates a perspective view of a main part of the beam collimator 300. Note that in order for the figure to be easily recognized, the vacuum container 308 and an upper base plate 368 are omitted in FIG. 21.

In FIG. 19 and FIG. 20-1, each of the collimating lenses 302, 304, and 306 is provided with an acceleration lens unit 310 and a deceleration lens unit 312. Acceleration lens units 310 and deceleration lens units 312 are alternately arranged. In each of the collimating lenses 302, 304, and 306, an acceleration lens unit 310 and a deceleration lens unit 312 are arranged on the upstream side and the downstream side, respectively.

As described, the beam collimator 300 is provided with three collimating lenses constituted with six acceleration and/or deceleration lens units. These plurality of acceleration and/or deceleration lens units are arranged along a reference trajectory in the ion implanter so that a beam collimated to the reference trajectory comes out from the exit of the beam collimator 300 in regard to an ion beam that is incident along the reference trajectory. The reference trajectory corresponds to, for example, a beamline L1 illustrated in FIGS. 6A, 6B, 17, 18, or the like. The reference trajectory or the beamline L1 represents the center orbit of the ion beam occurring when the beam scanning is not operated.

Each of the acceleration lens units 310 is provided with an acceleration gap 314, which is curved in a bow shape, as a bow-shaped curved gap. The acceleration lens units 310 are formed such that the acceleration lens units 310 accelerate the ion beam and deflect the ion beam toward the reference trajectory or the beamline L1 by an electric field generated in respective acceleration gaps 314. Each of the deceleration lens units 312 is provided with a deceleration gap 316, which is curved in a bow shape, as a bow-shaped curved gap. The deceleration lens units 312 are formed such that the deceleration lens units 312 decelerate the ion beam and deflect the ion beam toward the reference trajectory or the beamline L1 by an electric field generated in respective deceleration gaps 316.

As will be described later in detail, a vacant space 322, a vacant space 324, or an opening is provided between a certain acceleration or deceleration lens unit and a deceleration or acceleration lens unit that is adjacent thereto. The vacant spaces 322 and 324 are directed in a direction that perpendicularly intersects a beam collimation plane on the reference trajectory or the beamline L1. In other words, the vacant spaces 322 and 324 are directed in a transverse direction in an ion-beam cross section by a plane that is perpendicular to the beamline L1. The transverse direction in this case means a direction that is perpendicular to a longitudinal direction (i.e., a beam scanning direction) in the beam cross section. Via the vacant spaces 322 and 324, an inner field containing the beamline L1 or the reference trajectory (or a vicinity region of the beamline L1) communicates with an outer field 320 of the acceleration lens unit 310 or the deceleration lens unit 312. The same applies to a bow-shaped curved gap, and an inner field containing the beamline L1 or the reference trajectory (or a vicinity region of the beamline L1) communicates with an outer field 320 of the acceleration lens unit 310 or the deceleration lens unit 312 via the bow-shaped curved gap.

The inner field of the beamline L1 or the reference trajectory in this case means a beam transport space 318 extending from the entrance to the exit of the beam collimator 300 along the arrangement of the collimating lenses 302, 304, and 306. In the present embodiment, each of the acceleration and/or deceleration lens units is divided into an upper structure system and a lower structure system as described later, and the beam transport space 318 is formed between the upper structure system and the lower structure system. The outer field 320 of the acceleration lens unit 310 or the deceleration lens unit 312 means a space between the vacuum container 308 and the acceleration lens unit 310 or the deceleration lens unit 312.

In the following, a vacant space or space zone provided on the downstream side of each of the acceleration lens units 310 is referred to as a first vacant space 322, and a vacant space or space zone provided on the downstream side of each of the deceleration lens units 312 is referred to as a second vacant space 324. In other words, there is an acceleration lens unit 310 on the upstream side of a first vacant space 322, and there is a deceleration lens unit 312 on the downstream side of the first vacant space 322. The first vacant space 322 is sandwiched between the acceleration lens unit 310 and the deceleration lens unit 312. Also, there is a deceleration lens unit 312 on the upstream side of a second vacant space 324, and there is an acceleration lens unit 310 on the downstream side of the second vacant space 324. The second vacant space 324 is sandwiched between the deceleration lens unit 312 and the acceleration lens unit 310.

In the present embodiment, a first vacant space 322 and a second vacant space 324 are each a single space zone. However, in an embodiment, a first vacant space 322 and/or a second vacant space 324 may be sectioned into a plurality of spaces.

The vacuum container 308 is provided with an incidence portion 326, an emission portion 328, a container upper wall 330, a container lower wall 332, a first container sidewall 334, and a second container sidewall 336. The vacuum container 308 has a roughly cuboidal shape, and each surface of the cuboidal shape corresponds to each of the incidence portion 326, the emission portion 328, the container upper wall 330, the container lower wall 332, the first container sidewall 334, and the second container sidewall 336.

The incidence portion 326 is a wall of the vacuum container 308 having an incidence opening 327. An ion beam is incident to the beam collimator 300 via the incidence opening 327. The emission portion 328 is a wall of the vacuum container 308 having an emission opening 329. An ion beam is emitted from the beam collimator 300 via the emission opening 329. The emission portion 328 faces the incidence portion 326.

The container upper wall 330 is provided on one side in a direction that perpendicularly intersects the beam collimation plane on the reference trajectory or the beamline L1. The container lower wall 332 is provided on the other side in the direction that perpendicularly intersects the beam collimation plane on the reference trajectory or the beamline L1, and the container upper wall 330 and the container lower wall 332 face each other. An upper outer field 320 is formed between the container upper wall 330 and the lens units 310 and 312, and a lower outer field 320 is formed between the container lower wall 332 and the lens units 310 and 312.

Also, the first container sidewall 334 is provided on one side in a direction of a straight line on which the beam collimation plane intersects the plane that perpendicularly intersects the reference trajectory or the beamline L1. The second container sidewall 336 is provided on the other side in the direction of the straight line on which the beam collimation plane intersects the plane that perpendicularly intersects the reference trajectory or the beamline L1, and the first container sidewall 334 and the second container sidewall 336 face each other. The container upper wall 330 and the container lower wall 332 are fixed by the first container sidewall 334 and the second container sidewall 336. The first container sidewall 334 is provided as an openable and closable inner wall of the vacuum container 308. FIG. 20-1 illustrates a state where the first container sidewall 334 is removed from the vacuum container 308. In the second container sidewall 336, a power supplying unit 338 formed to supply electric power to the lens units 310 and 312 is provided (see FIG. 19).

As illustrated in FIG. 19, a vacuum evacuation unit 309 for performing vacuum evacuation of the internal space of the vacuum container 308 including the beam transport space 318 and the respective outer fields 320 of the lens units 310 and 312 is provided in the vacuum container 308. The vacuum evacuation unit 309 is provided with, for example, a high-vacuum pump such as a cryopump or a turbo-molecular pump. The vacuum evacuation unit 309 may be attached, for example, to an evacuation outlet of the vacuum container 308 formed on the container lower wall 332.

Each acceleration lens unit 310 is provided with a pair of acceleration electrode sections 340 and 342 or a pair of acceleration electrode members. The pair of acceleration electrode sections 340 and 342 is constituted with an entrance acceleration electrode section 340 and an exit acceleration electrode section 342. Each of the entrance acceleration electrode section 340 and the exit acceleration electrode section 342 is provided with a curved surface 344, which sets an acceleration gap 314. A curved surface 344 of the entrance acceleration electrode section 340 is a surface on the exit side of the electrode, and a curved surface 344 of the exit acceleration electrode section 342 is a surface on the entrance side of the electrode. These two surfaces face each other. The curved surfaces 344 extend from the central parts of the respective electrodes to both sides toward the respective outer edges of the beam transport space 318 while crossing the beam transport space 318. The central part of an electrode in this case means a part of the electrode section that is the closest to the beamline L1. The curved surfaces 344 are formed in a hyperbolic shape or a circular-arc shape, as described above. The entrance side means the upstream side of the beamline L1, and the exit side means the downstream side of the beamline L1.

Each of the entrance acceleration electrode section 340 and the exit acceleration electrode section 342 is provided with a curved surface 344 and a back surface 346 on the opposite side thereof. A back surface 346 of the entrance acceleration electrode section 340 is a surface on the entrance side of the electrode, and a back surface 346 of the exit acceleration electrode section 342 is a surface on the exit side of the electrode. The back surfaces 346 extend from the central parts of the respective electrodes to both sides toward the respective outer edges of the beam transport space 318 while crossing the beam transport space 318. The back surfaces 346 curve along the respective curved surfaces 344. In an embodiment, the back surfaces 346 may extend in a linear manner.

Each deceleration lens unit 312 is provided with a pair of deceleration electrode sections 348 and 350 or a pair of deceleration electrode members. The pair of deceleration electrode sections 348 and 350 is constituted with an entrance deceleration electrode section 348 and an exit deceleration electrode section 350. Each of the entrance deceleration electrode section 348 and the exit deceleration electrode section 350 is provided with a curved surface 344, which sets a deceleration gap 316. A curved surface 344 of the entrance deceleration electrode section 348 is a surface on the exit side of the electrode, and a curved surface 344 of the exit deceleration electrode section 350 is a surface on the entrance side of the electrode. These two surfaces face each other. Each of the entrance deceleration electrode section 348 and the exit deceleration electrode section 350 is provided with a curved surface 344 and a back surface 346 on the opposite side thereof. A back surface 346 of the entrance deceleration electrode section 348 is a surface on the entrance side of the electrode, and a back surface 346 of the exit deceleration electrode section 350 is a surface on the exit side of the electrode.

In order to prevent complication of the figure in FIG. 19, an entrance acceleration electrode section 340, an exit acceleration electrode section 342, a curved surface 344, a back surface 346, an entrance deceleration electrode section 348, and an exit deceleration electrode section 350 are indicated in relation to the second collimating lens 304 in the center. However, as it can be understood from the figure, the first collimating lens 302 and the third collimating lens 306, as in the case of the second collimating lens 304, are each provided with a pair of acceleration electrode sections 340 and 342 and a pair of deceleration electrode sections 348 and 350, and each of these electrode sections is provided with a curved surface 344 and a back surface 346.

In general, since the bow-shaped curved surfaces 344 of the acceleration lens unit 310 or the bow-shaped curved surfaces 344 of the deceleration lens unit 312 define a bow-shaped curved gap to form an acceleration gap or a deceleration gap, the acceleration gap and the deceleration gap are designed to have a different curved shape from each other so that a collimated beam comes out from the emission opening 329 of the beam collimator 300 in the end. A curved surface 344a and a curved surface 344b of the acceleration lens unit 310 or a curved surface 344c and a curved surface 344d of the deceleration lens unit 312 form an acceleration gap or a deceleration gap, and the bow-shaped curved shape of respective electrodes is independently determined according to the designing of the acceleration gap or the deceleration gap. There is a case where the curved surfaces 344a and 344b of the acceleration lens unit 310 and the curved surfaces 344c and 344d of the deceleration lens unit 312 have substantially identical curved shapes, a case where the curved surfaces 344a and 344b of the acceleration lens unit 310 and the curved surfaces 344c and 344d of the deceleration lens unit 312 have different curved shapes, or a case where the curved surfaces 344a and 344b and the curved surfaces 344c and 344d have similar curved shapes.

Vacant spaces 322 and 324 are formed between a back surface 346d or 346b of an electrode section on the exit side of one lens unit of two adjacent lens units and a back surface 346a or 346c of an electrode section on the entrance side of the other lens unit. Thus, a first vacant space 322 is a region surrounded by the back surface 346b of the exit acceleration electrode section 342 and the back surface 346c of the entrance deceleration electrode section 348 that is adjacent thereto on the downstream side thereof. A second vacant space 324 is a region surrounded by the back surface 346d of the exit deceleration electrode section 350 and the back surface 346a of the entrance acceleration electrode section 340 that is adjacent thereto on the downstream side thereof.

As illustrated in FIG. 20-1, each pair of acceleration electrode sections 340 and 342 is provided with a set of acceleration electrodes 352, 354, 356, and 358 or a set of acceleration electrode pieces arranged while being spaced apart vertically across the beamline L1. An entrance acceleration electrode section 340 is divided into an upper entrance acceleration electrode 352 and a lower entrance acceleration electrode 354. The upper entrance acceleration electrode 352 and the lower entrance acceleration electrode 354 face each other across the beamline L1. An exit acceleration electrode section 342 is divided into an upper exit acceleration electrode 356 and a lower exit acceleration electrode 358. The upper exit acceleration electrode 356 and the lower exit acceleration electrode 358 face each other across the beamline L1. The upper entrance acceleration electrode 352 and the upper exit acceleration electrode 356 are supported by the container upper wall 330, and the lower entrance acceleration electrode 354 and the lower exit acceleration electrode 358 are supported by the container lower wall 332. A detailed explanation thereof will be described later.

Each pair of deceleration electrode sections 348 and 350 is provided with a set of deceleration electrodes 360, 362, 364, and 366 or a set of deceleration pieces arranged while being spaced apart vertically across the beamline L1. An entrance deceleration electrode section 348 is divided into an upper entrance deceleration electrode 360 and a lower entrance deceleration electrode 362. The upper entrance deceleration electrode 360 and the lower entrance deceleration electrode 362 face each other across the beamline L1. An exit deceleration electrode section 350 is divided into an upper exit deceleration electrode 364 and a lower exit deceleration electrode 366. The upper exit deceleration electrode 364 and the lower exit deceleration electrode 366 face each other across the beamline L1. The upper entrance deceleration electrode 360 and the upper exit deceleration electrode 364 are supported by the container upper wall 330, and the lower entrance deceleration electrode 362 and the lower exit deceleration electrode 366 are supported by the container lower wall 332. A detailed explanation thereof will be described later.

In this way, an acceleration lens unit 310 is constituted with four acceleration electrodes 352, 354, 356, and 358. Each set of acceleration electrodes 352, 354, 356, and 358 that forms an acceleration lens unit 310 is formed into a curved rod-shaped body 359 having a hyperbolic shape or a circular-arc shape (see FIG. 21). Similarly, a deceleration lens unit 312 is constituted with four deceleration electrodes 360, 362, 364, and 366. Each set of deceleration electrodes 360, 362, 364, and 366 that forms a deceleration lens unit 312 is formed into a curved rod-shaped body 359 having a hyperbolic shape or a circular-arc shape. A cross section of the curved rod-shaped body has, for example, a rectangular shape, but not limited thereto. A cross-sectional shape of an electrode may be different in the front/back direction as long as upper and lower electrodes are symmetrical in the vertical direction. For example, either one of a curved surface and a back surface of each electrode may be recessed in a beam transportation direction. In this way, the respective inner sides of upper and lower electrodes may be formed to have a cutout. Each electrode may be formed into a thick plate-like body or a plate-like body.

Respective both end units of each entrance acceleration electrode section 340 and each exit deceleration electrode section 350 (excluding an entrance acceleration electrode section 340 and an exit deceleration electrode section 350 that are near the incidence opening 327 or the emission opening 329) are formed so that the end units have an extension electrode unit 340e or an extension electrode unit 350e (formed into a rod-shaped body, a plate-like body, or a net-like body) so as to form an acceleration or deceleration electrical field area with identical potential.

An upper exit acceleration electrode 356 is fixed, at the both ends thereof, to the both ends of an upper entrance deceleration electrode 360 adjacent to the upper exit acceleration electrode 356. These two electrodes 356 and 360 may be fixed directly to each other or may be fixed indirectly by interposing a connection member between the two electrodes 356 and 360. Alternatively, an integral structure of these two electrodes 356 and 360 may be formed integrally by cutting out from one base material. Similarly, a lower exit acceleration electrode 358 is fixed, at the both ends thereof, to the both ends of a lower entrance deceleration electrode 362 adjacent to the lower exit acceleration electrode 358.

On the other hand, an upper exit deceleration electrode 364 is not fixed to an upper entrance acceleration electrode 352 adjacent thereto. There is a clearance 367 between an upper exit deceleration electrode 364 and an adjacent upper entrance acceleration electrode 352 (see FIG. 21). Electrodes 364 and 352 may be formed by cutting out each of the electrodes 364 and 352 from a base material. However, these two electrodes 364 and 352 may be fixed to each other. The same applies to a lower exit deceleration electrode 366 and a lower entrance acceleration electrode 354.

In order to prevent complication of the figure in FIG. 20-1, acceleration electrodes 352, 354, 356, and 358 and deceleration electrodes 360, 362, 364, and 366 are indicated in relation to the second collimating lens 304. However, as it can be understood from the figure, the first collimating lens 302 and the third collimating lens 306, as in the case of the second collimating lens 304, are also divided into an upper portion and a lower portion with respect to the beamline L1.

As illustrated in FIG. 20-1, the first collimating lens 302 is provided with a set of base plates 368 and 370, more specifically, an upper base plate 368 and a lower base plate 370 in order to support the electrode sections (or the electrodes, and the same applies hereinafter) described above. An upper base plate 368 is provided between each of the collimating lenses 302, 304, and 306 and the container upper wall 330, in other words, in an upper outer field 320 of the lenses. The upper base plate 368 supports the upper half of the first collimating lens 302 (i.e., the combination of the acceleration lens unit 310 and the deceleration lens unit 312). A lower base plate 370 is provided between each of the collimating lenses 302, 304, and 306 and the container lower wall 332, in other words, in a lower outer field 320 of the lenses. The lower base plate 370 supports the lower half of the first collimating lens 302.

Similarly, each of the second collimating lens 304 and the third collimating lens 306 is provided with an upper base plate 368 and a lower base plate 370.

Each of the base plates 368 and 370 is formed such that vacuum evacuation of the beam transport space 318 through the vacant spaces 322 and 324 is allowed. Therefore, each of the base plates 368 and 370 has a base plate opening 372 (see FIG. 19). A base plate opening 372 is a through hole or an open region formed on the base plates 368 and 370 and is provided on the upper or lower part of the respective vacant spaces 322 and 324. The vacant spaces 322 and 324 are connected to the outer field 320 through respective base plate openings 372.

The above-stated electrode sections are attached to the corresponding base plates 368 and 370 via respective conductive mounting members 374 or insulating mounting members 376. The conductive mounting members 374 are, for example, small conductor pieces having a tubular shape and are, for example, cylindrical members made of metal. The insulating mounting members 376 are, for example, small pieces of an insulator. The conductive mounting members 374 and the insulating mounting members 376 have a width that is almost the same as the thickness of the electrode sections in the beam transportation direction. Since the conductive mounting members 374 are small as described, one electrode section is attached to respective base plates 368 and 370 via several conductive mounting members 374.

An electrode section at the most upstream side and an electrode section at the most downstream side in the beam collimator 300 are attached to respective base plates 368 and 370 via conductive mounting members 374. Therefore, the same potential (typically ground potential) as that of the base plates 368 and 370 is applied to these electrode sections during the operation of the beam collimator 300.

More specifically, the upper entrance acceleration electrode 352 of the first collimating lens 302 is attached to an upper base plate 368 via conductive mounting members 374, and the lower entrance acceleration electrode 354 of the first collimating lens 302 is attached to a lower base plate 370 via conductive mounting members 374. The upper exit deceleration electrode 364 of the third collimating lens 306 is attached to an upper base plate 368 via conductive mounting members 374, and the lower exit deceleration electrode 366 of the third collimating lens 306 is attached to a lower base plate 370 via conductive mounting members 374.

Electrode sections arranged between the electrode section at the most upstream side and the electrode section at the most downstream side are attached to respective base plates 368 and 370 via insulating mounting members 376. Therefore, potential that is different from that of the base plates 368 and 370 can be applied by the power supplying unit 338 to these electrode sections during the operation of the beam collimator 300. Since the insulating mounting members 376 are small as described, one electrode section is attached to respective base plates 368 and 370 via several insulating mounting members 376.

In order to prevent complication of the figure in FIGS. 19 and 20-1, conductive mounting members 374 and insulating mounting members 376 are indicated mainly in relation to the third collimating lens 306. However, as it can be understood from the figure, in the first collimating lens 302 and the second collimating lens 304, as in the case of the third collimating lens 306, the electrode sections are also attached to respective base plates 368 and 370 via conductive mounting members 374 or insulating mounting members 376.

The base plates 368 and 370 are formed movably with respect to the vacuum container 308. Therefore, between each of the base plates 368 and 370 and the vacuum container 308, a guide member 378 or guide portion for guiding the base plate 368 or 370 is provided. Guide members 378 are formed such that the respective base plates 368 and 370 are drawable to the outside of the vacuum container 308 through an openable and closable inner wall (for example, the first container sidewall 334).

Figure 22:
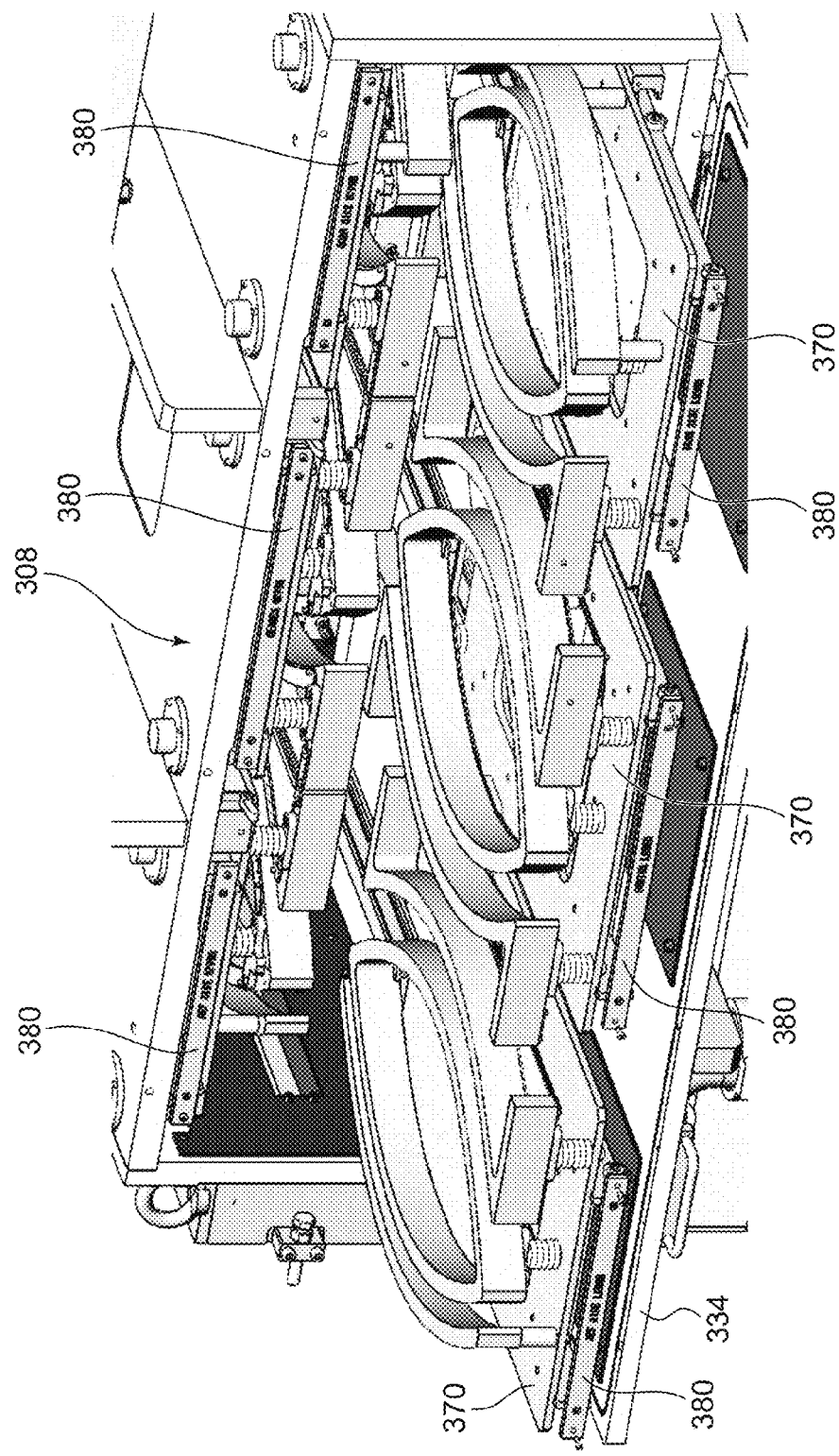
FIG. 22 is a schematic view illustrating a configuration of a beam collimator according to an embodiment of the present invention.

FIG. 22 illustrates a state where lower base plates 370 are drawn to the outside of the vacuum container 308 along with electrodes mounted on the lower base plates 370. A handle 380 is provided to the base plates 368 and 370. The upper portion (or the lower portion) of each of the collimating lenses 302, 304, and 306 can be drawn to the outside of the vacuum container 308 by pulling of this handle 380 by a person. Since the collimating lenses 302, 304, and 306 can be easily taken out of the vacuum container 308, device assembly and maintenance work can be easily performed. Also, the upper portion (or the lower portion) of each of the collimating lenses 302, 304, and 306 can be stored at a fixed position inside the vacuum container 308 by pushing the handle 380. FIGS. 19 to 21 illustrate a state where the upper portion (or the lower portion) of each of the collimating lenses 302, 304, and 306 is stored. The beam collimator 300 operates when the collimating lenses 302, 304, and 306 are at this fixed position (i.e., ion implantation is performed).

Figure 23:
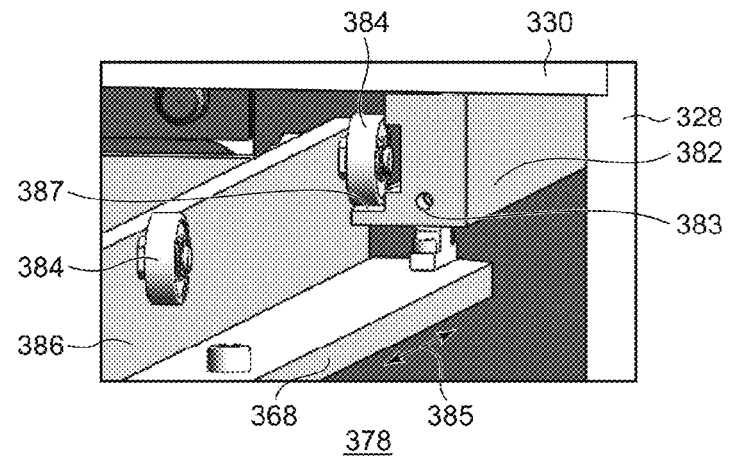
FIG. 23 is a schematic view illustrating a configuration of a guide member of a beam collimator according to an embodiment of the present invention.

FIG. 23 is a diagram in which a part of a guide member 378 is enlarged. Illustrated in FIG. 23 is an upper guide member 378 on the exit side of the third collimating lens 306. Therefore, this guide member 378 is provided near the emission portion 328 between the container upper wall 330 and an upper base plate 368.

The guide member 378 is provided with a guide rail 382 and a plurality of wheels 384. The guide rail 382 is fixed to the container upper wall 330 and extends along a direction 385 in which the vacuum container 308 is crossed from the first container sidewall 334 to the second container sidewall 336. The wheels 384 are attached to a wheel mounting rib 386 fixed to the upper base plate 368. The wheel mounting rib 386 extends along the guide rail 382, and a wheel receiving portion 387 is formed on the guide rail 382 along the wheel mounting rib 386. The wheels 384 are movable along the wheel receiving portion 387 of the guide rail 382, allowing the upper base plate 368 to be moved in the crossing direction 385 with respect to the container upper wall 330.

Further, a fastening screw hole 383 is provided on the guide rail 382. The fastening screw hole 383 is formed on a surface facing the handle 380 of the guide rail 382, and a hole corresponding to the fastening screw hole 383 is also formed at an end of the handle 380. When the upper portion (or the lower portion) of each of the collimating lenses 302, 304, and 306 is stored at the fixed position inside the vacuum container 308, the handle 380 comes into contact with the guide rail 382. By fixing the handle 380 to the guide rail 382 using the fastening screw hole 383 and a screw corresponding to this hole, the upper portion (or the lower portion) of each of the collimating lenses 302, 304, and 306 can be securely held at a fixed position inside the vacuum container 308.

A guide member 378 provided between the container lower wall 332 and the lower base plate 370 is also formed in the same way as in the guide member 378 described above. Therefore, it should be understood in an explanation of the guide member 378 that the container upper wall 330 and the upper base plate 368 may be replaced with the container lower wall 332 and the lower base plate 370, respectively.

As illustrated in FIG. 19 and FIG. 20-1, two guide members 378 are provided on one base plate 368 (or one base plate 370). A guide rail 382, wheels 384, and a wheel mounting rib 386 are provided on each guide member 378.

Note that the direction of movement of a collimating lens by a guide member is not limited to the above-described direction 385. In an embodiment, a guide member may be formed such that a collimating lens is movable in, for example, a beam transportation direction.

During the operation of the beam collimator 300, a first high voltage that is commonly applied to an exit acceleration electrode section 342 and an entrance deceleration electrode section 348 adjacent thereto from the power supplying unit 338, as described above. A second high voltage that is commonly applied to an exit deceleration electrode section 350 and an entrance acceleration electrode section 340 adjacent thereto from the power supplying unit 338. To the entrance acceleration electrode section 340 at the most upstream side and the exit deceleration electrode section 350 at the most downstream side of the beam collimator 300, an intermediate voltage between the first and second high voltages is applied.

For example, the first high voltage (for example, −50 kV) and the second high voltage (for example, +50 kV) may be voltages that are opposite from each other while being equal in size, and the intermediate voltage may be ground potential. In this way, the beam collimator 300 may be formed such that the energy of an ion beam is equal at the incidence opening 327 and at the emission opening 329.

As illustrated in FIG. 19, the power supplying unit 338 is provided collectively on one side of the vacuum container 308. The power supplying unit 338 is provided with a power supplying plate 388 arranged between the collimating lenses 302, 304, and 306 and the vacuum container 308. The power supplying unit 338 is provided with vacuum feed-through wirings 390 for supplying power to the power supplying plate 388 from the outside of the vacuum container 308. The power supplying plate 388 is a conductor plate that extends along the second container sidewall 336, and the vacuum feed-through wirings 390 supply power to the power supplying plate 388 through the second container sidewall 336. The power supplying plate 388 is supported by the second container sidewall 336 through insulating members 391. The power supplying plate 388 is provided with a first plate for applying the first high voltage to an electrode section and a second plate for applying the second high voltage to an electrode section (not shown).

The power supplying plate 388 may be arranged between the collimating lenses 302, 304, and 306 and another inner wall of the vacuum container 308. In this case, the vacuum feed-through wirings 390 may be formed such that the vacuum feed-through wirings 390 supply power to the power supplying plate 388 through the inner wall.

Terminal devices 392 or terminals for supplying power to individual electrode sections from the power supplying plate 388 are provided on the power supplying plate 388. The power supplying plate 388 can be also considered as a common power supply for a plurality of terminal devices 392. Each of the terminal devices 392 is provided with an elastic conductor 394 compressed, when a corresponding electrode section is at a fixed position for ion implantation, between the power supplying plate 388 and the electrode section. Elastic conductors 394 are, for example, springs made of metal. The elastic conductors 394 allow for conduction with the power supplying plate 388 easily and reliably only by pushing the collimating lenses 302, 304, and 306 to the fixed position.

Figure 24:
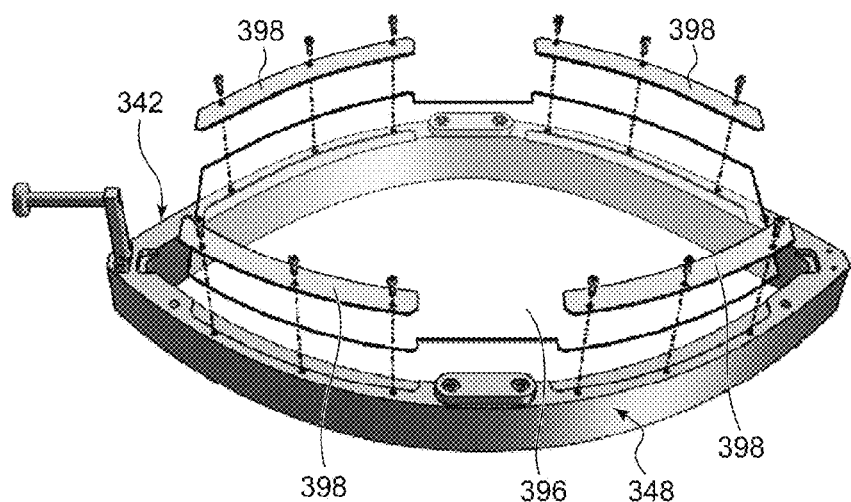
FIG. 24 is a schematic view illustrating a configuration of an electrode section of a beam collimator according to an embodiment of the present invention.
Figure 25:
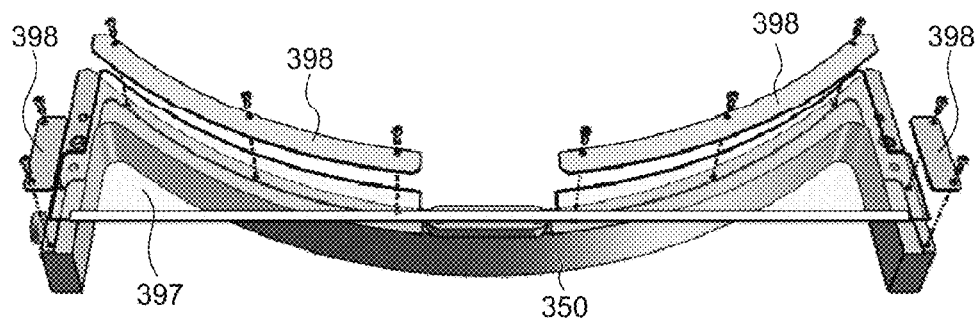
FIG. 25 is a schematic view illustrating a configuration of an electrode section of a beam collimator according to an embodiment of the present invention.

As illustrated in FIG. 24 and FIG. 25, respective cover units or cover portions that cover vacant spaces 322 and 324 are provided on the side away from the beamline L1 (i.e., on the side close to the vacuum container 308). Therefore, with regard to an electrode arranged above (below) the beamline L1, a cover unit is provided above (below) the electrode. Cover units connect, for example, electrode sections of one lens unit of two adjacent lens units with electrode sections of the other lens unit facing thereto in such a manner that the cover units cover respective vacant spaces 322 and 324 on the side away from the beamline L1.

FIG. 24 illustrates a first cover unit 396 connecting an exit acceleration electrode section 342 with an entrance deceleration electrode section 348 that is adjacent thereto in such a manner the first cover unit covers a first vacant space 322. A first cover unit 396 is, for example, an expand metal, that is, a metallic mesh-like member. Therefore, a first cover unit 396 is formed such that vacuum evacuation through a first vacant space 322 is allowed.

In order to attach the first cover unit 396 to the exit acceleration electrode section 342 and the entrance deceleration electrode section 348, several mounting plates 398 are provided. The mounting plates 398 are formed to fit the curved shapes of the electrode sections 342 and 348. The first cover unit 396 is attached to the electrode sections 342 and 348 in such a manner that an outer periphery portion of the first cover unit 396 is inserted between the mounting plates 398 and the electrode sections 342 and 348.

Further, a cover unit may be provided on the side of a back surface 346 of one electrode section of two adjacent electrode sections in such a manner that the cover unit covers respective vacant spaces 322 and 324 on the side away from the beamline L1. As illustrated in FIG. 25, a second cover unit 397 may be provided on the side of a back surface 346 of an exit deceleration electrode section 350 in such a manner that the second cover unit 397 covers the half of a second vacant space 324. Another second cover unit 397 may be provided on a back surface 346 of an entrance acceleration electrode section 340 that is adjacent to the exit deceleration electrode section 350, and the other half of the second vacant space 324 may be covered by the second cover unit 397. The second cover unit 397 is attached between mounting plates 398 and the exit deceleration electrode section 350 as in the case of a first cover unit 396.

The above-described cover units may be plate-like members having an opening instead of metallic mesh-like members such as an expand metal. Alternatively, the cover units may be plate-like members without an opening. Forming these cover units using a conductor and attaching the cover units so as to have potential that is the same as that of respective electrode sections are helpful in ensuring the uniformity of the electric field around the lens.

In a typical electrode configuration of a beam collimator, an elongated slit that surrounds a beam transport space is formed in an individual electrode. However, in comparison to this typical configuration, at least one of advantages listed in the following can be achieved according to the embodiment explained in reference to FIGS. 19 to 25.

1. Simple structure and low cost.
2. Reduction in the amount of materials, and reduction of weight of the materials.
3. Ensuring of high degree of vacuum due to improvement of vacuum conductance.
4. Simple high voltage insulating structure and high voltage electric discharge countermeasure structure.
5. Prevention of contamination and pollution caused due to a small ion beam irradiation area of an electrode surface.
6. Improvement of workability in assembly and disassembly of lens electrodes and electrode cover bodies.
7. Facilitation of adjustment of relative positions among electrodes.
8. Prevention of leakage electric field and electric field distortion from lens electrodes by electrode cover bodies.

For example, according to the present embodiment, vacant spaces 322 and 324 are provided between two adjacent lens units 310 and 312. As described, in a collimating lens arrangement with a plurality of lens units, vacant spaces 322 and 324 are provided in the middle thereof. Since vacuum evacuation of the beam transport space 318 can be performed through the vacant spaces 322 and 324, vacuum conductance in a relatively long collimating lens arrangement can be improved. Therefore, the beam transport space 318 can be easily maintained to have a high vacuum degree that is desired. Further, according to the present embodiment, the vacant spaces 322 and 324 are wide open across the beam transport space 318. This allows the vacuum conductance to be further improved.

Further, according to the present embodiment, the vacant spaces 322 and 324 are directed in a direction that perpendicularly intersects a beam collimation plane on the reference trajectory or the beamline L1. In this case, a large spatial volume can be secured in a direction of a straight line on which the beam collimation plane intersects a plane that perpendicularly intersects the reference trajectory or the beamline L1. This is also helpful in the improvement of the vacuum conductance.

According to the present embodiment, the electrode sections that surround the vacant spaces 322 and 324 become thinner with an increase in the vacant spaces 322 and 324. Ions that drop out of the original beam orbit may collide against the electrode sections. The electrode sections become polluted if the ions are attached to the electrode sections. Also, if an electrode material is released into the beam transport space 318 due to the impact, the ion beam may be polluted. However, since the electrode sections are thin in the present embodiment, an area of possible ion collision is small. Thereby, the pollution of the electrode surfaces and the ion beam is reduced.

According to the present embodiment, each of the collimating lenses 302, 304, and 306 is formed being divided to be above and below the beamline L1 so that the respective relative position can be adjusted. Since an upper electrode position can be independently adjusted with respect to a lower electrode position, a gap between electrodes in the vertical direction with respect to the beamline L1 can be set with high accuracy.

According to the present embodiment, each electrode section or each electrode is formed into a rod-shaped body that is curved in a bow shape, and each rod-shaped body has a curved surface and a back surface on the opposite side thereof, which provide a collimating lens function. A lens unit is formed by a gap defined between respective curved surfaces of two rod-shaped bodies, and a space is open between respective back surfaces. In this way, a collimating lens can be created using minimal materials, the present embodiment is advantageous in terms of cost. Also, since the weight of a collimating lens can be reduced, the present embodiment is also useful in the improvement of workability such as assembly and disassembly.

According to the present embodiment, as illustrated in FIG. 20-3, FIG. 24, and FIG. 25, mesh-like (or sheet-like with a number of small holes) cover bodies 396 and 397 forming a part of electrode sections are attached to vacant spaces 322 and 324 (end surfaces of respective electrodes on the side of the vacuum container). This allows for minimization of influence on the electric fields of the vacant spaces 322 and 324 given by the potential of the vacuum container 308 (for example, ground potential) without sacrificing the improvement in vacuum conductance by the vacant spaces 322 and 324.

Described above is an explanation of the present invention based on the embodiments. The invention is not limited to the above-mentioned embodiments, and various design modifications may be added. It will be obvious to those skilled in the art that such modifications are also within the scope of the present invention.

In the above-stated embodiment, a collimating lens is divided to be above and below a beamline, and upper and lower portions thereof are mutually movable or their relative positions are adjustable with respect to the reference trajectory or the beamline L1. In an embodiment, an upper structure system and a lower structure system of a collimating lens may be connected to each other. In this case, the upper structure system and the lower structure system may be formed to be relatively movable or may be fixed such that the upper structure system and the lower structure system are not relatively movable.

In the above-stated embodiment, the beam collimator 300 is provided in the high-energy ion implanter 100. However, the present invention is not limited to this. In an embodiment, the beam collimator 300 may be provided in an ion implanter that does not have a high-energy multi-stage linear acceleration unit 14.

In the above-stated embodiment, an ion implanter is provided with a beam scanner and a beam collimator. However, in another embodiment, an ion implanter may be provided with a ribbon beam generator instead of a beam scanner. The ribbon beam generator may be formed to generate a fan ribbon beam by causing an ion beam to diverge in a fan-like shape. The beam collimator may be formed such that the beam collimator collimates a fan ribbon beam.

Listed in the following are several embodiments of the present invention.

A beam collimator of an ion implanter, comprising:

a plurality of acceleration and/or deceleration lens units that are arranged along a reference trajectory so that a beam collimated to the reference trajectory comes out from an exit of the beam collimator; and a vacuum container that surrounds the plurality of lens units, wherein each of the plurality of lens units forms a bow-shaped curved gap defined by at least two electrode sections and is formed such that an angle of a beam traveling direction with respect to the reference trajectory is changed by an electric field generated in the bow-shaped curved gap, wherein an electrode section on one side of one lens unit of the plurality of lens units and an electrode section on the other side of a lens unit adjacent to the lens unit are formed to have the same potential, and wherein a vacant space is provided between one lens unit of the plurality of lens units and a lens unit adjacent to the lens unit, the vacant space being directed in a direction that perpendicularly intersects a beam collimation plane on the reference trajectory, and an inner field containing the reference trajectory communicates, through the vacant space, with an outer field formed between the vacuum container and the plurality of lens units.

2. The beam collimator according to the first embodiment, wherein the plurality of lens units are divided into an upper structure system and a lower structure system, and the inner field containing the reference trajectory is formed between the upper structure system and the lower structure system.

3. The beam collimator according to the second embodiment, wherein the plurality of lens units are formed such that respective relative positions of the upper structure system and the lower structure system are adjustable with respect to the reference trajectory.

4. The beam collimator according to anyone of the first through third embodiments, wherein each of the plurality of lens units includes a pair of electrode sections each having a curved surface that sets the bow-shaped curved gap, and each of the electrode sections has, on the opposite side of a curved surface, aback surface that extends from a central part of the electrode section, the central part being close to the reference trajectory, to both sides toward respective outer edges of a beam transport space, and wherein the vacant space is formed between a back surface of an electrode section of the one lens unit close to the adjacent lens unit and aback surface of an electrode section of the adjacent lens unit close to the one lens unit.

5. The beam collimator according to the fourth embodiment, wherein the vacuum container includes container inner walls on one side and the other side of the reference trajectory, respectively, and wherein each of the pair of the electrode sections includes a set of electrodes arranged being spaced apart across the reference trajectory, one of the set of the electrodes being supported by the container inner wall on one side of the reference trajectory, and the other one of the set of the electrodes being supported by the container inner wall on the other side of the reference trajectory.

6. The beam collimator according to the fifth embodiment, wherein each of the electrodes is formed into a rod-shaped body that is curved in a bow shape.

7. The beam collimator according to any one of the fourth through sixth embodiments, wherein the back surface of each of the electrode sections is curved along the curved surface.

8. The beam collimator according to any one of the first through seventh embodiments, wherein at least one lens unit includes a cover unit that covers the vacant space on a side away from the reference trajectory.

9. The beam collimator according to the eighth embodiment, wherein the cover unit is formed such that vacuum evacuation of the inner field through the vacant space is allowed.

10. The beam collimator according to any one of the first through ninth embodiments, wherein a base plate that supports at least a part of the plurality of lens units is provided in the outer field of the plurality of lens units.

11. The beam collimator according to the tenth embodiment, wherein the base plate is formed such that vacuum evacuation of the inner field through the vacant space is allowed.

12. The beam collimator according to the tenth or eleventh embodiment, wherein at least one electrode section or electrode is attached to the base plate via an insulator or conductor.

13. The beam collimator according to any one of the tenth through twelfth embodiments, wherein the base plate is formed movably with respect to the vacuum container, and a guide member that guides the base plate is provided between the base plate and the vacuum container.

14. The beam collimator according to the thirteenth embodiment, wherein the vacuum container includes an openable and closable inner wall, and the guide member is formed such that the base plate is drawable to outside of the vacuum container through the inner wall.

15. The beam collimator according to any one of the first through fourteenth embodiments, further comprising:

a power supplying unit that is formed to supply power to the plurality of lens units, wherein the power supplying unit includes a power supplying plate to which power is supplied from outside of the vacuum container and that is arranged between the vacuum container and the plurality of lens units.

16. The beam collimator according to the fifteenth embodiment, wherein the power supplying unit includes a terminal device for supplying power to at least one electrode section or electrode of the plurality of lens units, and wherein the terminal device includes an elastic conductor that is compressed between the power supplying plate and the at least one electrode section or electrode when the plurality of lens units are at a fixed position for ion implantation.

17. The beam collimator according to the fifteenth or sixteenth embodiment, wherein the power supplying plate is arranged between the plurality of lens units and an inner wall that is on the side opposite from the openable and closable inner wall of the vacuum container.

18. The beam collimator according to any one of the first through seventeenth embodiments, wherein a beam dump that shields a beam is provided upstream of an entrance of the beam collimator.

19. The beam collimator according to any one of the first through eighteenth embodiments, wherein the plurality of lens units include a plurality of acceleration lens units and a plurality of deceleration lens units, the acceleration lens units and the deceleration lens units being alternately arranged.

20. The beam collimator according to any one of the first through nineteenth embodiments, wherein both end units of each of an entrance acceleration electrode section and an exit deceleration electrode section are each formed to have an extension electrode unit so as to form an acceleration or deceleration electrical field area with identical potential.

21. The beam collimator according to any one of the first through twentieth embodiments, wherein the bow-shaped curved gap is directed in a transverse direction of the collimated beam in a cross section that is perpendicular to the reference trajectory, and the inner field containing the reference trajectory communicates with the outer field of the plurality of lens units through the bow-shaped curved gap.

22. A beam collimator of an ion implanter, comprising:

at least one lens unit that generates a beam collimated to a reference trajectory at an exit of the beam collimator;

wherein each of the at least one lens unit includes a pair of electrode sections that define a bow-shaped curved gap and is formed such that an angle of a beam traveling direction with respect to the reference trajectory is changed by an electric field generated in the bow-shaped curved gap, and wherein each of the pair of electrode sections has a plurality of electrodes that are curved in a bow shape.

23. A beam collimator of an ion implanter, comprising:

at least one lens unit that generates a beam collimated to a reference trajectory at an exit of the beam collimator; and a vacuum container that surrounds the at least one lens unit and includes container inner walls on one side and the other side of the reference trajectory, respectively, wherein each of the at least one lens unit includes a pair of electrode sections that define a bow-shaped curved gap and is formed such that an angle of a beam traveling direction with respect to the reference trajectory is changed by an electric field generated in the bow-shaped curved gap, and wherein each of the pair of the electrode sections includes a set of electrodes arranged being spaced apart across the reference trajectory, a part of the set of the electrodes being supported by the container inner wall on one side of the reference trajectory, and another part of the set of the electrodes being supported by the container inner wall on the other side of the reference trajectory.

24. A high-energy ion implanter comprising:

a beam transportation line unit that includes the beam collimator according to any one of the first through twenty-third embodiments;

an ion beam generation unit that generates an ion beam;

a high-energy multi-stage linear acceleration unit that accelerates the ion beam; and a deflection unit that changes the direction of the ion beam accelerated to have high energy toward the beam transportation line unit.

25. The high-energy ion implanter according to the twenty-fourth embodiment, further comprising:

a beam scanner that scans a beam at both sides of a reference trajectory on a beamline, wherein each of the plurality of lens units is formed to adjust the orbit of the beam having passed the plurality of lens units to become parallel to the reference trajectory by deflecting the beam scanned at both sides of the reference trajectory toward the reference trajectory.

26. A beam collimation method comprising:

generating an electric field in each of a plurality of bow-shaped curved gaps so as to form a beam collimated to a reference trajectory; and performing vacuum evacuation of an inner field containing the reference trajectory through a space zone formed between one bow-shaped curved gap of the plurality of bow-shaped curved gaps and a bow-shaped curved gap that is adjacent to the bow-shaped curved gap, wherein the space zone is directed in a transverse direction of the collimated beam in a cross section that is perpendicular to the reference trajectory.

It should be understood that the invention is not limited to the above-described embodiment, but may be modified into various forms on the basis of the spirit of the invention. Additionally, the modifications are included in the scope of the invention.

What is claimed is:

1. A beam collimator of an ion implanter, comprising:
a plurality of acceleration and/or deceleration lens units that are arranged along a reference trajectory so that a beam collimated to the reference trajectory comes out from an exit of the beam collimator; and
a vacuum container that surrounds the plurality of lens units,
wherein each of the plurality of lens units forms a bow-shaped curved gap defined by at least two electrode sections and is formed such that an angle of a beam traveling direction with respect to the reference trajectory is changed by an electric field generated in the bow-shaped curved gap,
wherein an electrode section on one side of one lens unit of the plurality of lens units and an electrode section on the other side of a lens unit adjacent to the lens unit are formed to have the same potential, and
wherein a vacant space is provided between one lens unit of the plurality of lens units and a lens unit adjacent to the lens unit, the vacant space being directed in a direction that perpendicularly intersects a beam collimation plane on the reference trajectory, and an inner field containing the reference trajectory communicates, through the vacant space, with an outer field formed between the vacuum container and the plurality of lens units.

2. The beam collimator according to claim 1, wherein the plurality of lens units are divided into an upper structure system and a lower structure system, and the inner field containing the reference trajectory is formed between the upper structure system and the lower structure system.

3. The beam collimator according to claim 2, wherein the plurality of lens units are formed such that respective relative positions of the upper structure system and the lower structure system are adjustable with respect to the reference trajectory.

4. The beam collimator according to claim 1, wherein each of the plurality of lens units includes a pair of electrode sections each having a curved surface that sets the bow-shaped curved gap, and each of the electrode sections has, on the opposite side of the curved surface, a back surface that extends from a central part of the electrode section, the central part being close to the reference trajectory, to both sides toward respective outer edges of a beam transport space, and
wherein the vacant space is formed between a back surface of an electrode section of the one lens unit close to the adjacent lens unit and a back surface of an electrode section of the adjacent lens unit close to the one lens unit.

5. The beam collimator according to claim 4, wherein the vacuum container includes container inner walls on one side and the other side of the reference trajectory, respectively, and
wherein each of the pair of the electrode sections includes a set of electrodes arranged being spaced apart across the reference trajectory, one of the set of the electrodes being supported by the container inner wall on one side of the reference trajectory, and the other one of the set of the electrodes being supported by the container inner wall on the other side of the reference trajectory.

6. The beam collimator according to claim 5, wherein each of the electrodes is formed into a rod-shaped body that is curved in a bow shape.

7. The beam collimator according to claim 4, wherein the back surface of each of the electrode sections is curved along the curved surface.

8. The beam collimator according to claim 1, wherein at least one lens unit includes a cover unit that covers the vacant space on a side away from the reference trajectory.

9. The beam collimator according to claim 8, wherein the cover unit is formed such that vacuum evacuation of the inner field through the vacant space is allowed.

10. The beam collimator according to claim 1, wherein a base plate that supports at least a part of the plurality of lens units is provided in the outer field of the plurality of lens units.

11. The beam collimator according to claim 10, wherein the base plate is formed such that vacuum evacuation of the inner field through the vacant space is allowed.

12. The beam collimator according to claim 10, wherein at least one electrode section or electrode is attached to the base plate via an insulator or conductor.

13. The beam collimator according to claim 10, wherein the base plate is formed movably with respect to the vacuum container, and a guide member that guides the base plate is provided between the base plate and the vacuum container.

14. The beam collimator according to claim 13, wherein the vacuum container includes an openable and closable inner wall, and the guide member is formed such that the base plate is drawable to outside of the vacuum container through the inner wall.

15. The beam collimator according to claim 1, further comprising a power supplying unit that is formed to supply power to the plurality of lens units,
wherein the power supplying unit includes a power supplying plate to which power is supplied from outside of the vacuum container and that is arranged between the vacuum container and the plurality of lens units.

16. The beam collimator according to claim 15, wherein the power supplying unit includes a terminal device for supplying power to at least one electrode section or electrode of the plurality of lens units, and
wherein the terminal device includes an elastic conductor that is compressed between the power supplying plate and the at least one electrode section or electrode when the plurality of lens units are at a fixed position for ion implantation.

17. The beam collimator according to claim 15, wherein the power supplying plate is arranged between the plurality of lens units and an inner wall that is on the side opposite from the openable and closable inner wall of the vacuum container.

18. The beam collimator according to claim 1, wherein a beam dump that shields a beam is provided upstream of an entrance of the beam collimator.

19. The beam collimator according to claim 1, wherein the plurality of lens units include a plurality of acceleration lens units and a plurality of deceleration lens units, the acceleration lens units and the deceleration lens units being alternately arranged.

20. The beam collimator according to claim 1, wherein both end units of each of an entrance acceleration electrode section and an exit deceleration electrode section are each formed to have an extension electrode unit so as to form an acceleration or deceleration electrical field area with identical potential.

21. The beam collimator according to claim 1, wherein the bow-shaped curved gap is directed in a transverse direction of the collimated beam in a cross section that is perpendicular to the reference trajectory, and the inner field containing the reference trajectory communicates with the outer field of the plurality of lens units through the bow-shaped curved gap.

22. A beam collimator of an ion implanter, comprising:
at least one lens unit that generates a beam collimated to a reference trajectory at an exit of the beam collimator; and
a vacuum container that surrounds the at least one lens unit and includes container inner walls on one side and the other side of the reference trajectory, respectively,
wherein each of the at least one lens unit includes a pair of electrode sections that define a bow-shaped curved gap and is formed such that an angle of a beam traveling direction with respect to the reference trajectory is changed by an electric field generated in the bow-shaped curved gap, and
wherein each of the pair of the electrode sections includes a set of electrodes arranged being spaced apart across the reference trajectory, a part of the set of the electrodes being supported by the container inner wall on one side of the reference trajectory, and another part of the set of the electrodes being supported by the container inner wall on the other side of the reference trajectory.

23. A high-energy ion implanter comprising:
a beam transportation line unit that includes the beam collimator according to claim 1;
an ion beam generation unit that generates an ion beam;
a high-energy multi-stage linear acceleration unit that accelerates the ion beam; and
a deflection unit that changes the direction of the ion beam accelerated to have high energy toward the beam transportation line unit.

24. The high-energy ion implanter according to claim 23, further comprising:
a beam scanner that scans a beam at both sides of a reference trajectory on a beamline, wherein each of the plurality of lens units is formed to adjust the orbit of the beam having passed the plurality of lens units to become parallel to the reference trajectory by deflecting the beam scanned at both sides of the reference trajectory toward the reference trajectory.

25. A beam collimation method comprising:

generating an electric field in each of a plurality of bow-shaped curved gaps so as to form a beam collimated to a reference trajectory; and performing vacuum evacuation of an inner field containing the reference trajectory through a space zone formed between one bow-shaped curved gap of the plurality of bow-shaped curved gaps and a bow-shaped curved gap that is adjacent to the bow-shaped curved gap, wherein the space zone is directed in a transverse direction of the collimated beam in a cross section that is perpendicular to the reference trajectory.

* * * * *